United States Patent
Kato et al.

(10) Patent No.: US 10,591,827 B2
(45) Date of Patent: Mar. 17, 2020

(54) SUBSTRATE PROCESSING APPARATUS, PROCESSING APPARATUS, AND METHOD FOR MANUFACTURING DEVICE

(71) Applicant: NIKON CORPORATION, Tokyo (JP)

(72) Inventors: Masaki Kato, Yokohama (JP); Tohru Kiuchi, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 16/139,708

(22) Filed: Sep. 24, 2018

(65) Prior Publication Data

US 2019/0025713 A1 Jan. 24, 2019

Related U.S. Application Data

(60) Division of application No. 15/985,686, filed on May 21, 2018, now Pat. No. 10,156,795, which is a
(Continued)

(30) Foreign Application Priority Data

Nov. 21, 2012 (JP) .................................. 2012-255693

(51) Int. Cl.
*G03F 7/20* (2006.01)
*G03F 7/16* (2006.01)
(Continued)

(52) U.S. Cl.
CPC ............ *G03F 7/70366* (2013.01); *G03F 7/16* (2013.01); *G03F 7/20* (2013.01); *G03F 7/24* (2013.01);
(Continued)

(58) Field of Classification Search
CPC ............. G03F 7/70366; G03F 7/70791; G03F 7/70775; G03F 7/70758
(Continued)

(56) References Cited

U.S. PATENT DOCUMENTS

| 4,928,009 A | 5/1990 | Ikebe et al. |
| 5,788,802 A | 8/1998 | Raney |

(Continued)

FOREIGN PATENT DOCUMENTS

| EP | 0328686 A1 | 8/1989 |
| EP | 1 674 934 A1 | 6/2006 |

(Continued)

OTHER PUBLICATIONS

Renishaw Non-contact position encoder brochure, 32 pages (2007).
(Continued)

*Primary Examiner* — Hung Nguyen
(74) *Attorney, Agent, or Firm* — Finnegan, Henderson, Farabow, Garrett & Dunner, L.L.P.

(57) ABSTRACT

A pattern exposure apparatus comprising: a rotary drum that supports a flexible substrate, which is exposed with a mask pattern formed on an outer circumferential surface of a cylindrical mask that rotates about a first center axis; a rotary drum-side scale portion that is arranged for measuring a movement of the substrate which is fed in a circumferential direction by a rotation of the rotary drum, that includes a scale; a first projection optical system that projects an exposure light; a second projection optical system that projects an exposure light; a first reading device that is arranged to oppose with the rotary drum-side scale portion and that reads the scale; and a second reading device that is arranged to oppose with the rotary drum-side scale portion and that reads the scale.

6 Claims, 36 Drawing Sheets

Related U.S. Application Data division of application No. 15/438,579, filed on Feb. 21, 2017, now Pat. No. 10,007,190, which is a continuation of application No. 14/387,620, filed as application No. PCT/JP2013/056443 on Mar. 8, 2013, now Pat. No. 9,651,868.

(51) Int. Cl.
*G03F 7/24* (2006.01)
*G03F 9/00* (2006.01)
*G03F 7/42* (2006.01)

(52) U.S. Cl.
CPC ............ *G03F 7/70* (2013.01); *G03F 7/70641* (2013.01); *G03F 7/70758* (2013.01); *G03F 7/70775* (2013.01); *G03F 7/70791* (2013.01); *G03F 9/00* (2013.01); *G03F 7/42* (2013.01)

(58) Field of Classification Search
USPC .......................................................... 355/40
See application file for complete search history.

(56) References Cited

U.S. PATENT DOCUMENTS

| | | | |
|---|---|---|---|
| 5,970,304 | A | 10/1999 | Stemmle |
| 7,292,308 | B2 | 11/2007 | Galburt et al. |
| 8,102,410 | B2 | 1/2012 | Sandström |
| 2005/0099153 | A1 | 5/2005 | Komatsu et al. |
| 2005/0168187 | A1 | 8/2005 | Uchiyama et al. |
| 2005/0211991 | A1 | 9/2005 | Mori et al. |
| 2006/0139600 | A1 | 6/2006 | Jacobus Tinnemans et al. |
| 2007/0182808 | A1 | 8/2007 | Stiblert et al. |
| 2007/0188591 | A1 | 8/2007 | Sandström |
| 2009/0170014 | A1 | 7/2009 | Shibazaki |
| 2012/0121283 | A1 | 5/2012 | Mori et al. |
| 2013/0027684 | A1 | 1/2013 | Kiuchi et al. |
| 2013/0144553 | A1 | 6/2013 | Omata et al. |

FOREIGN PATENT DOCUMENTS

| | | |
|---|---|---|
| JP | 60-19037 | 2/1985 |
| JP | A-01-049915 | 2/1989 |
| JP | A-06-331343 | 12/1994 |
| JP | 7-153672 | 6/1995 |
| JP | A-07-140844 | 6/1995 |
| JP | 08-061979 | 3/1996 |
| JP | 8-213305 | 8/1996 |
| JP | 2005-92763 | 4/2005 |
| JP | 2005-168280 | 6/2005 |
| JP | 2006-098719 | 4/2006 |
| JP | 2007-299918 | 11/2007 |
| JP | A-2008-033359 | 2/2008 |
| JP | 2008-76650 | 4/2008 |
| JP | 4223036 | 11/2008 |
| JP | A-2009-042191 | 2/2009 |
| JP | A-2009-514011 | 4/2009 |
| JP | 2009-528561 | 8/2009 |
| JP | 2011-221537 | 11/2011 |
| JP | 2014-010296 | 1/2014 |
| KR | 10-2008-0106261 | 12/2008 |
| WO | WO 2007/050022 A2 | 5/2007 |
| WO | WO 2007/098935 A2 | 9/2007 |
| WO | WO 2008/029917 A1 | 3/2008 |
| WO | WO 2011/129369 A1 | 10/2011 |

OTHER PUBLICATIONS

International Search Report from the Japanese Patent Office for International Application No. PCT/JP2013/056443 dated May 14, 2013.
Written Opinion of the International Searching Authority for International Application No. PCT/JP2013/056443 dated Jun. 5, 2013.
Decision of Rejection issued by the Japanese Patent Office in Counterpart foreign Application No. 2012-069062 dated Aug. 16, 2016, and English translation thereof.
Office Action issued by the Japanese Patent Office in counterpart foreign Application No. 2012-255693 dated Jul. 5, 2016, and English translation thereof.
Office Action from the State Intellectual Property Office of People's Republic of China in counterpart Chinese Application No. 201380015932.7 dated May 24, 2016, and English translation thereof.
Chinese Office Action issued in Counterpart Chinese Application No. 201380015932.7, dated Aug. 5, 2015, 31 pages.
Notification of Reasons for Rejection with English-language Translation mailed by Japanese Patent Office dated Jan. 5, 2016, in counterpart Japanese Patent Application No. 2012-069092.
Notice of Preliminary Rejection issued by the Korean Intellectual property Office in counterpart Korean Patent Application No. 10-2017-7031689, dated Jan. 5, 2018 (12 pages).
Notice of Preliminary Rejection from the Korean Intellectual property Office in counterpart Korean Patent Application No. 10-2014-7026417, dated Jan. 13, 2017, and English translation thereof.
U.S. Office Action dated Aug. 1, 2016 issued in U.S. Appl. No. 14/387,620.
Office Action from the Taiwan Intellectual Property Office in counterpart Taiwanese Patent Application No. 102108160, dated Feb. 14, 2017 and English translation thereof.
Office Action issued by the Japanese Patent Office in counterpart Japanese Patent Application No. 2016-171276, dated Sep. 5, 2017 and English translation thereof.
Office Action issued by the State Intellectual Property Office of People's Republic of China in counterpart Chinese Patent Application No. 201610576185.X, dated Jul. 19, 2017, and English translation thereof.
Office Action from the Taiwan Intellectual Property Office in counterpart Taiwanese Patent Application No. 106116099, dated Dec. 6, 2017 and English translation thereof.
Notice of Allowance from the U.S. Patent and Trademark Office in corresponding U.S. Appl. No. 15/985,686, dated Aug. 15, 2018.
Office Action of the counterpart Taiwanese Patent Application No. 107129634 dated Jul. 24, 2019.

SUBSTRATE PROCESSING APPARATUS, PROCESSING APPARATUS, AND METHOD FOR MANUFACTURING DEVICE

CROSS-REFERENCE TO RELATED APPLICATIONS

This application is a divisional of U.S. application Ser. No. 15/985,686, filed May 21, 2018 (now U.S. Pat. No. 10,156,795), which is a divisional of U.S. application Ser. No. 15/438,579, filed Feb. 21, 2017, (now U.S. Pat. No. 10,007,190), which is a continuation of U.S. application Ser. No. 14/387,620, filed Jan. 23, 2015, (now U.S. Pat. No. 9,651,868), which is a 371 of PCT/JP2013/056443, filed Mar. 8, 2013, and claims the benefit of Japanese Patent Applications 2012-069092 and 2012-255693, filed Mar. 26, 2012 and Nov. 21, 2012, respectively of which the contents are hereby incorporated by reference.

TECHNICAL FIELD

The present invention relates to a substrate processing apparatus, a processing apparatus, and a device manufacturing method. Also, the invention relates to a processing apparatus that processes a target object located on a curved surface of a cylindrical member and a device manufacturing method.

Priority is claimed on Japanese Patent Application No. 2012-069092, filed Mar. 26, 2012, and Japanese Patent Application No. 2012-255693, filed Nov. 21, 2012, the contents of which are incorporated herein by reference.

BACKGROUND

As an exposure apparatus used in a photolithography process, exposure apparatuses are known which expose a substrate using a cylindrical or columnar mask as disclosed in the following patent documents (for example, see Patent document 1, Patent document 2, and Patent document 3).

An exposure apparatus for manufacturing a liquid crystal display device is also known in which a cylindrical photomask having a light source therein is arranged adjacent to a flexible object to be exposed (of a film tape shape) which is wound around a rotatable feed roller and the object to be exposed is continuously exposed by rotating the photomask and the feed roller (for example, see Patent document 4).

Even when a substrate is exposed using a cylindrical or columnar mask as well as a plate-like mask, it is necessary to accurately acquire position information of patterns of the mask so as to excellently expose the substrate with an image of the patterns of the mask. Accordingly, there is demand for a technique capable of accurately acquiring position information of the cylindrical or columnar mask and accurately adjusting the positional relationship of the mask and the substrate.

Patent document 3 and Patent document 5 disclose a configuration for acquiring position information of patterns in the circumferential direction of a pattern-formed surface by forming position-information acquiring marks (such as scales and grids) in a predetermined region of the pattern-formed surface of a cylindrical mask with a predetermined positional relationship with respect to the patterns and detecting the marks with an encoder system.

RELATED ART DOCUMENTS

Patent Documents

Patent document 1: Japanese Unexamined Patent Application, First Publication No. 117-153672

Patent document 2: Japanese Unexamined Patent Application. First Publication No. H8-213305

Patent document 3: PCT International Publication No. WO2008/029917

Patent document 4: Japanese Unexamined Utility Model Application, First Publication No. S60-019037

Patent document 5: Japanese Unexamined Patent Application, First Publication No. 2008-76650

SUMMARY OF INVENTION

Problems to be Solved by the Invention

However, in the above-mentioned related art, there are the following problems.

In general, in an encoder system for measuring a position in a rotating direction of a rotary member (such as a cylindrical mask), an optical reading head is disposed to face scales (grids) of a scale disk attached to be coaxial with a rotation axis of the rotary member. When the scales of the scale disk and the reading head are relatively displaced in a direction having no measurement sensitivity (detection sensitivity), for example, in a direction in which a gap between the scale disk and the reading head is changed, the cylindrical mask and a substrate cause a relative misalignment but the encoder system cannot measure the misalignment. Accordingly, an error may occur in exposed patterns.

This problem is not limited to a problem in pattern exposure, but may similarly occur in mark measurement for alignment or the like and may occur in the whole processing apparatus or inspection apparatus which includes an encoder system for rotation measurement so as to precisely transport a substrate.

An object of an aspect of the invention is to provide a substrate processing apparatus capable of performing a highly precise process (including inspection or the like) on a substrate by measuring a position of a mask or a substrate with high accuracy.

In Patent document 3, a substrate to which patterns of a cylindrical rotary mask are transferred is a high-rigidity substrate such as a semiconductor wafer, and the substrate is supported flat on a movable stage and is conveyed in a direction parallel to the surface of the substrate. When mask patterns are repeatedly and continuously transferred to a long flexible substrate, as described in Patent document 4, a substrate as an object to be processed is partially wound around the outer circumferential surface of a rotatable feed roller, that is, a cylindrical member and exposure is performed in a state where the surface of the substrate is stably supported along the curved surface of the cylindrical member, thereby enhancing mass productivity.

In such a processing apparatus that processes a flexible object to be processed which is supported along the outer circumferential surface of a cylindrical rotary member (a substrate feed roller), there is demand for improvement in processing accuracy such as pattern transfer position accuracy and overlapping accuracy by accurately detecting the position of the cylindrical member (a position in the circumferential direction of the outer circumferential surface and a position in a rotation axis direction) and performing the processing while suppressing a calculation load.

An object of another aspect of the invention is to provide a processing apparatus and a device manufacturing method capable of determining the position of a cylindrical member with high accuracy and processing an object located on a curved surface of the cylindrical member while suppressing a calculation load.

Means for Solving the Problem

According to a first aspect of the invention, a substrate processing apparatus includes: a rotary cylindrical member that includes a cylindrical supporting surface curved with a constant radius from a predetermined center line and that is configured to rotate about the center line while having a part of a long substrate wound around the supporting surface in order to feed the substrate in a length direction of the substrate; a processing mechanism configured to perform a predetermined process on the substrate at a specific position in a circumferential direction of the supporting surface among a part of the substrate wound around the supporting surface of the rotary cylindrical member; a scale member that is configured to rotate about the center line along with the rotary cylindrical member so as to measure a displacement in a circumferential direction of the supporting surface of the rotary cylindrical member or a displacement in a direction of the center line of the rotary cylindrical member and that includes a scale portion carved in a ring shape; and a reading mechanism that is arranged to face the scale portion, that is disposed in substantially a same direction as the specific position when viewed from the center line, and that is configured to read the scale portion.

According to a second aspect of the invention, a substrate processing apparatus includes: a mask supporting member configured to support a mask pattern along a cylindrical surface with a constant radius from a predetermined center line and configured to be rotatable about the center line; an illumination system configured to irradiate a part of the mask pattern with illumination light for exposure at a specific position in a circumferential direction of the cylindrical surface of the mask supporting member; an exposure mechanism that includes a substrate supporting member supporting a sensitive substrate and that is configured to project a light beam, which is generated from a part of the mask pattern by irradiation of the illumination light, onto an exposing surface of the substrate in a predetermined exposure method; a scale member that is configured to rotate about the center line along with the mask supporting member so as to measure a displacement in a circumferential direction of the cylindrical surface of the mask supporting member or a displacement in the direction of the center line of the mask supporting member and that includes a scale portion carved in a ring shape; and a reading mechanism that is arranged to face the scale portion, that is disposed in substantially a same direction as the specific position when viewed from the center line, and that is configured to read the scale portion.

According to a third aspect of the invention, a substrate processing apparatus includes: a rotary cylindrical member that includes a cylindrical supporting surface curved with a constant radius from a predetermined center line and that is configured to be rotatable about the center line; a substrate conveyance mechanism that is configured to support a long flexible substrate in a specific range in a circumferential direction among the supporting surface of the rotary cylindrical member and that is configured to convey the substrate in a length direction of the substrate; a pattern detecting device that includes a detection probe for detecting a specific pattern formed discretely or continuously in a length direction of the substrate on the substrate and that is disposed around the rotary cylindrical member so as to set a detection area of the detection probe in the specific range; a scale member configured to rotate about the center line along with the rotary cylindrical member so as to measure a displacement in a circumferential direction of the supporting surface of the rotary cylindrical member or a displacement in the direction of the center line of the rotary cylindrical member and that includes a scale portion carved in a ring shape; and a reading mechanism that is arranged to face the scale portion, that is disposed in substantially a same direction as the detection area when viewed from the center line, and that is configured to read the scale portion.

According to a fourth aspect of the invention, a processing apparatus includes: a cylindrical member that includes a curved surface curved with a constant radius from a predetermined axis and that is configured to rotate about the predetermined axis; a readable scale portion that is disposed in a ring shape along a circumferential direction in which the cylindrical member rotates and that is configured to rotate about the axis along with the cylindrical member; a processing part that is disposed around or inside of the cylindrical member when viewed from a direction of the axis and that is configured to process an object located on the curved surface at a specific position in the circumferential direction; a first reading device that is disposed around the scale portion when viewed from a direction of the axis, that is disposed at a position obtained by rotating the specific position by substantially 90 degrees about the axis, and that is configured to read the scale portion; and a second reading device that is disposed around the cylindrical member when viewed from a direction of the axis and that is configured to read the scale portion at the specific position.

According to a fifth aspect of the invention, a processing apparatus includes: a cylindrical member that includes a curved surface curved with a constant radius from a predetermined axis and that is configured to rotate about the predetermined axis; a readable scale portion that is disposed in a ring shape along a circumferential direction in which the cylindrical member rotates and that is configured to rotate about the axis along with the cylindrical member; a processing part that is disposed around or inside of the cylindrical member when viewed from a direction of the axis and that is configured to process an object located on the curved surface at the specific position in the circumferential direction; a first reading device that is disposed around the scale portion when viewed from a direction of the axis, that is disposed at a position obtained by rotating the specific position by substantially 90 degrees about the axis, and that is configured to read the scale portion; a second reading device that is disposed around the scale portion when viewed from a direction of the axis, that is disposed at a position different in the circumferential direction from the first reading device, and that is configured to read the scale portion; and a third reading device that is disposed around the scale portion when viewed from a direction of the axis, that is disposed at a position different in the circumferential direction from the first reading device and the second reading device, and that is configured to read the scale portion.

According to a sixth aspect of the invention, a device manufacturing method includes: exposing the substrate with a pattern or projecting an image of the mask pattern onto a substrate by exposure using the processing apparatus according to the fourth or fifth aspect of the invention.

According to a seventh aspect of the invention, a processing apparatus configured to transfer a device pattern onto a long flexible sheet substrate while feeding the sheet substrate in a length direction thereof, the processing apparatus includes: a rotary cylindrical body that includes a cylindrical outer circumferential surface with a constant radius from a predetermined axis line and that is configured to rotate about the axis line while supporting the sheet substrate at a part of the outer circumferential surface; a transfer processing part configured to transfer the pattern onto the sheet substrate at a specific position in a circumferential direction of the outer circumferential surface of the rotary cylindrical body supporting the sheet substrate; a scale portion that is configured to be rotatable about the axis line along with the rotary cylindrical body and that includes a readable scale arranged in a ring shape along a circumferential direction with a predetermined radius from the axis line; and a plurality of encoder head parts that are disposed at two or more positions around the scale portion so as to read the scale which moves in a circumferential direction with the rotation of the rotary cylindrical body, wherein each of two specific encoder head parts out of the plurality of encoder head parts is set so that a reading position of the scale viewed from a direction of the axis line is within an angle range of 90±5.8 degrees.

Advantage of the Invention

In the aspects of the invention, it is possible to process a substrate with high accuracy by detecting a target position with high accuracy.

According to another aspect of the invention, in the processing apparatus and the device manufacturing method, it is possible to detect a position of a cylindrical member with high accuracy while suppressing a calculation load and to process an object located on a curved surface of a cylindrical member.

DESCRIPTION OF EMBODIMENTS

First Embodiment

Hereinafter, a substrate processing apparatus according to a first embodiment of the invention will be described with reference to FIGS. 1 to 5. In the below description, an XYZ orthogonal coordinate system is set up and positional relationships of respective elements will be described with reference to the XYZ orthogonal coordinate system. For example, a predetermined direction in a horizontal plane is defined as an X-axis direction, a direction perpendicular to the X-axis direction in the horizontal plane is defined as a Y-axis direction, and the direction (that is, vertical direction) perpendicular to the X-axis direction and the Y-axis direction is defined as a Z-axis direction.

Figure 1:
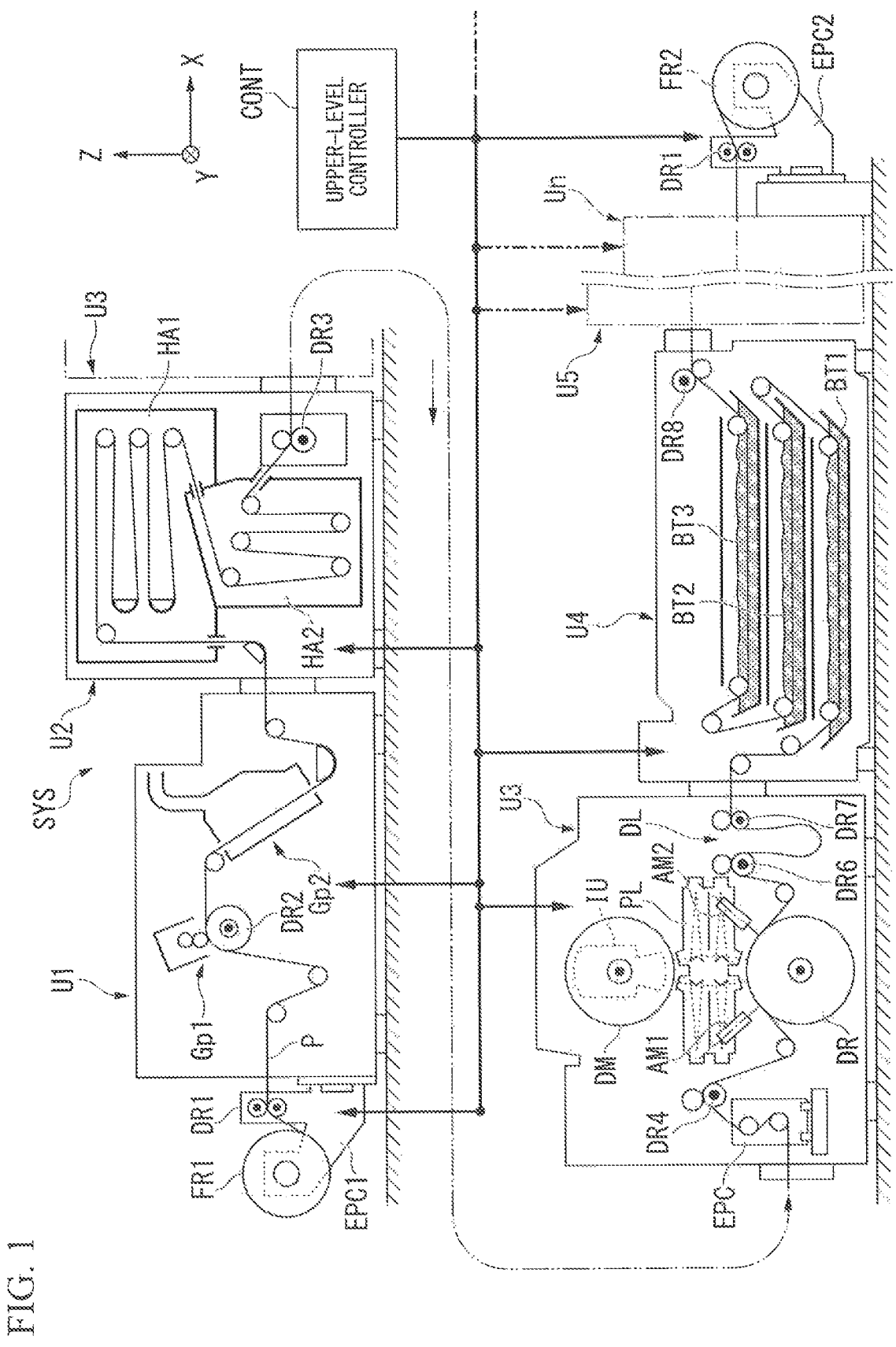
FIG. 1 is a diagram showing a configuration of a device manufacturing system.

FIG. 1 is a diagram showing a partial configuration of a device manufacturing system (flexible display manufacturing line) SYS according to this embodiment. Here, for example, a flexible substrate P (such as a sheet or a film) drawn out from a feed roll FR1 sequentially passes through n processing apparatuses U1, U2, U3, U4, U5, . . . , Un and is wound around a collection roll FR2. An upper-level controller CONT collectively controls the processing apparatuses U1 to Un constituting the manufacturing line.

In FIG. 1, the XYZ orthogonal coordinate system is set so that a front surface (or a rear surface) of the substrate P is perpendicular to the XZ plane and the width direction perpendicular to the conveyance direction (length direction) of the substrate P is set as the Y-axis direction. The substrate P may have the front surface reformed and activated in advance by a predetermined pre-process or may have a minute partition structure (uneven structure) for accurate patterning formed on the front surface.

The substrate P wound around the feed roll FR1 is drawn out and conveyed to the processing apparatus U1 by a nipping driving roller DR1, and the substrate is servo-controlled by an edge position controller EPC1 so that the center in the Y-axis direction (width direction) of the substrate P is in a range of ±dozen μm to several tens of μm with respect to a target position.

The processing apparatus U1 is a coater that continuously or selectively coats the surface of the substrate P with a photosensitive functional liquid (such as a photo resist, a photosensitive silane coupling material, or a UV-curable resin liquid) in the conveyance direction (length direction) of the substrate P using a printing method. The inside of the processing apparatus U1 is provided with a cylinder roller DR2 around which the substrate P is wound, a coating mechanism Gp1 including a coating roller configured to uniformly coat the surface of the substrate P with the photosensitive functional liquid, or the like on the cylinder roller DR2, and a drying mechanism GP2 configured to remove solvent or water included in the photosensitive functional liquid applied to the substrate P.

The processing apparatus U2 is a heater that heats the substrate P conveyed from the processing apparatus UL to a predetermined temperature (for example, several tens of ° C. to about 120° C.) to stably bond a photosensitive functional layer formed on the surface thereof. The inside of the processing apparatus U2 is provided with a plurality of rollers and an air-turn bar configured to turn and convey the substrate P, a heating chamber part HA1 for heating the conveyed substrate P, a cooling chamber part HA2 for lowering the temperature of the heated substrate P so as to match the ambient temperature of a subsequent process (processing apparatus U3), and a nipping driving roller DR3.

The processing apparatus U3 as a substrate processing apparatus is an exposure apparatus that irradiates the photosensitive functional layer (sensitive substrate) of the substrate P conveyed from the processing apparatus U2 with UV patterning light corresponding to a circuit pattern or an interconnection pattern for a display. The inside of the processing apparatus U3 is provided with an edge position controller EPC that controls the center in the Y-axis direction (width direction) of the substrate P to a predetermined position, a nipping driving roller DR4, a rotary drum DR (substrate supporting member) that has the substrate P partially wound thereon with a predetermined tension and that supports a part on the substrate P to be patterned and exposed in the same cylindrical surface shape, and two sets of driving rollers DR6 and DR7 that gives predetermined looseness (margin) DL to the substrate P.

The inside of the processing apparatus U3 is provided with a transmissive cylindrical mask DM, an illumination mechanism IU (illumination system) that is disposed in the cylindrical mask DM and that illuminates a mask pattern formed on the outer circumferential surface of the cylindrical mask DM, a projection optical system PL (exposure mechanism) that projects an image of a part of the mask pattern of the cylindrical mask DM onto a part of the substrate P supported in the cylindrical surface shape by the rotary drum DR, and alignment microscopes AM1, AM2 (the detection probe, the pattern detecting device) that detect an alignment mark (specific pattern) or the like formed in advance on the substrate P so as to relatively align the substrate P with the projected image of a part of the mask pattern.

A detailed configuration of the processing apparatus U3 will be described later.

The processing apparatus U4 is a wet processing apparatus that performs a wet development process, an electroless plating process, and the like on the photosensitive functional layer of the substrate P conveyed from the processing apparatus U3. The inside of the processing apparatus U4 is provided with three processing baths BT1, BT2, and BT3 layered in the Z-axis direction, a plurality of rollers configured to bend and convey the substrate P, and a nipping driving roller DR8.

The processing apparatus U5 is a heating and drying apparatus that adjusts the water content of the substrate P wetted through the wet process to a predetermined value by heating the substrate P conveyed from the processing apparatus U4 and details thereof will not be described. Thereafter, the substrate P passing through several processing apparatuses and passing through the final processing apparatus Un in a series of processes is wound around the collection roll FR2 via the nipping drive roller DR1. At the time of winding, the relative position in the Y-axis direction of the driving roller DR1 and the collection roll FR2 is sequentially corrected and controlled by an edge position controller EPC2 so that the center in the Y-axis direction (width direction) of the substrate P or the substrate end in the Y-axis direction does not scatter in the Y-axis direction.

Examples of the substrate P used in this embodiment include a resin film and a foil formed of metal or alloy such as stainless steel. For example, the material of the resin film includes one or two of polyethylene resin, polypropylene resin, polyester resin, vinylethylene copolymer resin, polyvinyl chloride resin, cellulose resin, polyamide resin, polyimide resin, polycarbonate resin, polystyrene resin, and vinyl acetate resin.

It is preferable that a substrate having a thermal expansion coefficient which is not excessively large is selected as the substrate P so as to substantially ignore deformation due to heat applied in various processing steps. The thermal expansion coefficient may be set to be smaller than a threshold value based on process temperatures or the like, for example, by mixing inorganic filler into a resin film. Examples of the inorganic filler include titanium oxide, zinc oxide, alumina, and silicon oxide. The substrate P may be a single-layered member of ultrathin glass with a thickness of about 100 μm manufactured using a float process or the like or may be a multi-layered member formed by bonding the aforementioned resin film, the foil, or the like to the ultrathin glass. The substrate P may have the surface thereof reformed and activated in advance by a predetermined pre-process or may have a minute partition structure (uneven structure) for accurate patterning formed on the surface.

The device manufacturing system SYS according to this embodiment is a so-called roll-to-roll system that continuously performs various processes for manufacturing one device on the substrate P. The substrate P subjected to various processes is diced for each device (for example, a display panel of an EL display) and is divided into plurality of devices. The size of the substrate P is, for example, about 10 cm to 2 m in the width direction (the Y-axis direction as a short side) and is 10 m or more in the length direction (the X-axis direction as a long side). The size in the width direction (the Y-axis direction as a short side) of the substrate P may be 10 cm or less or may be 2 m or more. The size in the length direction (the X-axis direction as a long side) of the substrate P may be 10 m or less.

Figure 2:
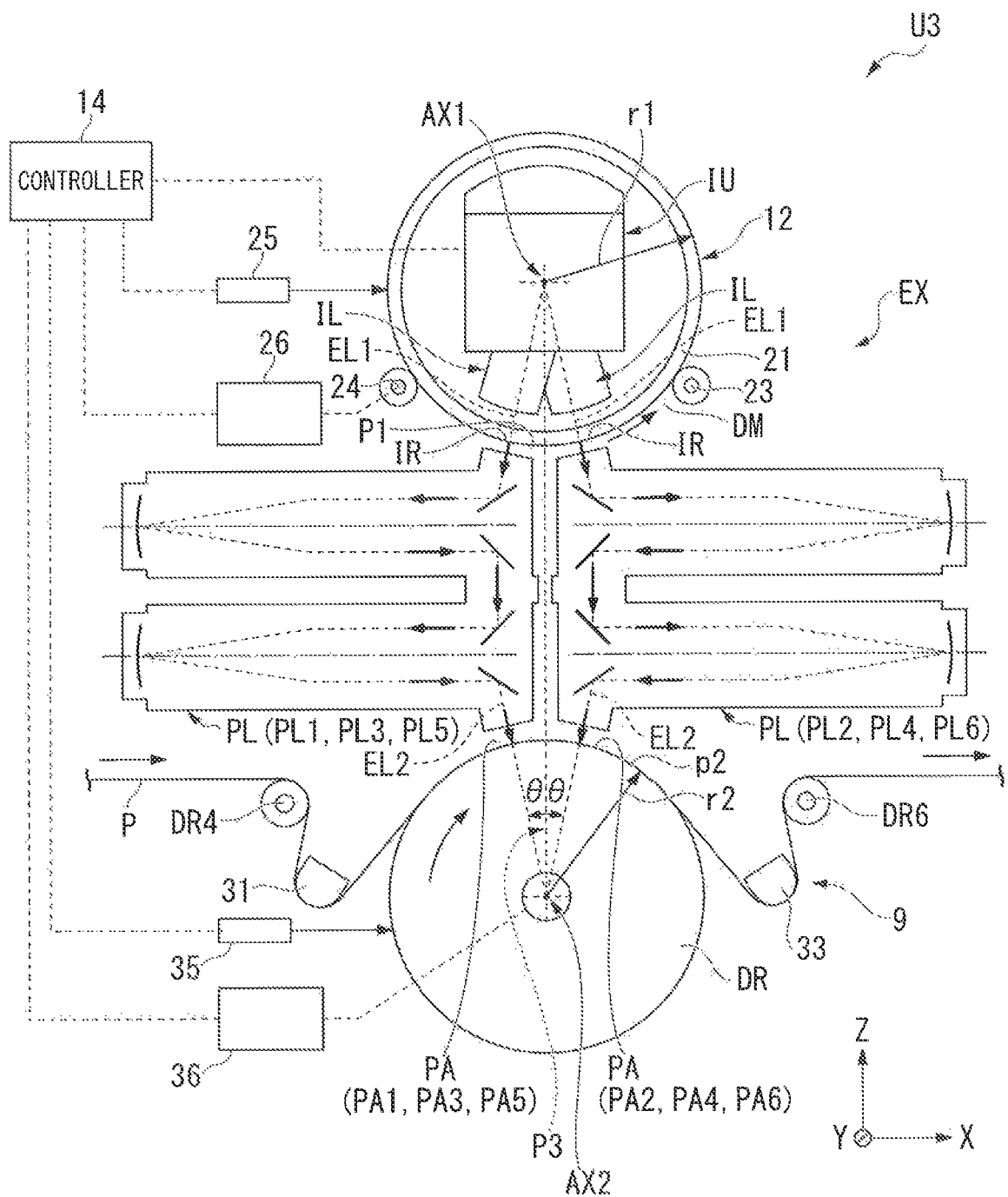
FIG. 2 is a diagram showing an entire configuration of a processing apparatus (exposure apparatus) according to a first embodiment.

The configuration of the processing apparatus U3 according to this embodiment will be described below with reference to FIGS. 2 to 5. FIG. 2 is a diagram showing the entire configuration of the processing apparatus U3 according to this embodiment. The processing apparatus U3 shown in FIG. 2 includes an exposure apparatus (processing mechanism) EX that performs an exposure process and at least a part of the conveying device 9 (substrate conveying device).

The exposure apparatus EX according to this embodiment is a so-called scanning exposure apparatus and projects an image of a pattern formed on the cylindrical mask DM onto the substrate P through a projection optical system PL (PL1 to PL6) with an equal projection magnification (×1) while synchronizing the feeding of the substrate P (convey of the substrate P) with the rotation of the cylindrical mask DM. In FIGS. 2 to 5, the Y-axis of the XYZ orthogonal coordinate system is set to be parallel to the rotation center line AX1 of the cylindrical mask DM and the X-axis is set to the scanning exposure direction, that is, the conveyance direction of the substrate P at an exposure position.

As shown in FIG. 2, the exposure apparatus EX includes a mask supporting device 12 (mask supporting member), an illumination mechanism IU, a projection optical system PL, and a controller 14 (substrate conveyance mechanism). The processing apparatus U3 rotationally moves the cylindrical mask DM supported by the mask supporting device 12 and conveys the substrate P through the use of the conveying device 9 (substrate conveyance mechanism). The illumination mechanism IU illuminates a part of the (illumination area IR) of the cylindrical mask DM supported by the mask supporting device 12 with an illumination light beam EL1 with uniform brightness. The projection optical system PL projects an image of a pattern in the illumination area IR on the cylindrical mask DM onto a part (projection area PA) of the substrate P conveyed by the conveying device 9. The position on the cylindrical mask DM at which the illumination area IR is located is changed with the movement of the cylindrical mask DM. A position on the substrate P which is located at the projection area PA is changed in accordance with the movement of the substrate P and thus an image of a predetermined pattern (mask pattern) on the cylindrical mask DM is projected onto the substrate P. The controller 14 controls each parts of the exposure apparatus EX so as to cause the each parts to perform processes. In this embodiment, the controller 14 controls at least a part of the conveying device 9.

The controller 14 may be a part or the whole part of the upper-level controller CONT of the device manufacturing system SYS. The controller 14 may be a device which is controlled by the upper-level controller CONT and which is other than the upper-level controller CONT. The controller 14 includes, for example, a computer system. The computer system includes, for example, a CPU, various memories, an OS, and hardware such as peripherals. The operations of the each part of the processing apparatus U3 are stored in the form of a program in a computer-readable recording medium, and various processes are performed by causing the computer system to read and execute the program. The computer system includes a homepage providing environment (or a display environment) when it can access the Internet or an intranet system. Examples of the computer-readable recording medium include portable mediums such as a flexible disk, a magneto-optical disk, a ROM, and a CD-ROM and a storage device such as a hard disk built in a computer system. The computer-readable recording medium may include a medium that dynamically holds a program for a short time, like a communication line when the program is transmitted via a network such as the Internet or a communication circuit such as a telephone line, and a medium that holds a program for a predetermined time, like a volatile memory in a computer system serving as a server or a client in that case. The program may be configured to realize a part of the above-mentioned functions of the processing apparatus U3 or may be configured to realize the above-mentioned functions of the processing apparatus U3 by combination with a program recorded in advance in a computer system. The upper-level controller CONT can be embodied using a computer system, similarly to the controller 14.

As shown in FIG. 2, the mask supporting device 12 includes a first drum member 21 (mask supporting member) supporting the cylindrical mask DM, a guide roller 23 supporting the first drum member 21, a driving roller 24 driving the first drum member 21, a first detector 25 detecting the position of the first drum member 21, and a first driving part 26.

The first drum member 21 forms a first surface P1 on which the illumination area IR is located on the cylindrical mask DM. In this embodiment, the first surface P1 includes a surface (hereinafter, referred to as cylindrical surface) which is obtained by rotating a segment (generating line) about an axis (first center line AX1) parallel to the segment. The cylindrical surface is, for example, an outer circumferential surface of a cylinder or an outer circumferential surface of a column. The first drum member 21 is formed of, for example, glass or quartz and has a cylindrical shape with a constant thickness, and the outer circumferential surface (cylindrical surface) thereof forms the first surface P1. That is, in this embodiment, the illumination area IR on the cylindrical mask DM is curved in a cylindrical surface shape having a constant radius r1 from the rotation center line AX1.

The cylindrical mask DM is formed as, for example, a transmissive planar sheet mask in which a pattern is formed as a light-shielding layer of chromium or the like, on one surface of a strip-shaped ultrathin glass plate with good flatness (for example, with a thickness of 100 μm to 500 μm), is curved along the outer circumferential surface of the first drum member 21, and is used in a state where the sheet mask is wound around (attached to) the outer circumferential surface. The cylindrical mask DM has a non-pattern-formed area in which no pattern is formed and is attached to the first drum member 21 in the non-pattern-formed area. The cylindrical mask DM can be released from the first drum member 21.

Instead of forming the cylindrical mask DM out of an ultrathin glass plate and winding the cylindrical mask DM around the first drum member 21 formed of a transparent cylindrical base material, a mask pattern may be directly drawn and formed on the outer circumferential surface of the first drum member 21 formed of a transparent cylindrical base material by using a light-shielding layer of chromium or the like, thereby forming the mask pattern integrally with the outer circumferential surface. In this case, the first drum member 21 serves as a supporting member of the pattern of the cylindrical mask DM.

The first detector 25 optically detects the rotational position of the first drum member 21 and is constituted, for example, by a rotary encoder. The first detector 25 supplies the controller 14 with information (a two-phase signal or the like from the encoder head) indicating the detected rotational position of the first drum member 21. The first driving part 26 including an actuator such as an electric motor adjusts a torque for rotating the driving roller 24 in response to a control signal supplied from the controller 14. The controller 14 controls the rotational position of the first drum member 21 by controlling the first driving part 26 on the basis of the detection result from the first detector 25. In other words, the controller 14 controls one or both of the rotational position and the rotation speed of the cylindrical mask DM supported by the first drum member 21.

The conveying device 9 includes a driving roller DR4, a first guiding member 31, a rotary drum DR forming a second surface p2 on which the projection area PA on the substrate P is located, a second guiding member 33, driving rollers DR6 and DR7 (see FIG. 1), a second detector 35, and a second driving part 36.

In this embodiment, the substrate P conveyed to the driving roller DR4 from the upstream side of the conveying path is conveyed to the first guiding member 31 via the driving roller DR4. The substrate P passing through the first guiding member 31 is supported by the surface of a cylindrical or columnar rotary drum DR with a radius of r2 and is conveyed to the second guiding member 33. The substrate P passing through the second guiding member 33 is conveyed to the downstream side of the conveying path via the driving rollers DR6 and DR7. The rotation center line AX2 of the rotary drum DR and the rotation center lines of the driving rollers DR4, DR6, and DR7 are set to be parallel with the Y-axis.

The first guiding member 31 and the second guiding member 33 adjust a tension or the like acting on the substrate P in the conveying path, for example, by moving in a direction intersecting the width direction of the substrate P (by moving in the XZ plane in FIG. 2). The first guiding member 31 (and the driving roller DR4) and the second guiding member 33 (and the driving rollers DR6 and DR7) are configured, for example, to be movable in the width direction (the Y-axis direction) of the substrate P and thus can adjust the position in the Y-axis direction of the substrate P wound around the outer circumferential surface of the rotary drum DR and the like. The conveying device 9 only has to convey the substrate P along the projection area PA of the projection optical system PL and the configuration thereof can be appropriately changed.

The rotary drum (the rotary cylindrical member, the substrate supporting member) DR forms the second surface (supporting surface) p2 supporting a part of the projection area PA on the substrate P onto which an image-forming light beam from the projection optical system PL is projected in a circular arc shape (cylindrical shape). In this embodiment, the rotary drum DR is a part of the conveying device 9 and also serves as a supporting member (substrate stage) supporting the substrate P (exposing surface) as an object to be exposed. That is, the rotary drum DR may be a part of the exposure apparatus EX. The rotary drum DR is rotatable about the rotation center line AX2 (hereinafter, referred to as second center line AX2), the substrate P is curved in a cylindrical surface shape along the outer circumferential surface (cylindrical surface) on the rotary drum DR, and the projection area PA is located in a part of the curved portion.

In this embodiment, the rotary drum DR rotates with a torque supplied from the second driving part 36 including an actuator such as an electric motor. The second detector 35 is constituted, for example, by a rotary encoder and optically detects the rotational position of the rotary drum DR. The second detector 35 supplies information (for example, a two-phase signal from the encoder head) indicating the detected rotational position of the rotary drum DR to the controller 14. The second driving part 36 adjusts the torque for rotating the rotary drum DR in response to a control signal supplied from the controller 14. The controller 14 controls the rotational position of the rotary drum DR by controlling the second driving part 36 on the basis of the detection result from the second detector 35, and synchronously moves (synchronously rotates) the first drum member 21 (the cylindrical mask DM) and the rotary drum DR. A detailed configuration of the second detector 35 will be described later.

The exposure apparatus EX of this embodiment is an exposure apparatus on which a so-called multi-lens type projection optical system is assumed to be mounted. The projection optical system PL includes a plurality of projection modules that project an image of a part of the pattern on the cylindrical mask DM. For example, in FIG. 2, three projection modules (projection optical systems) PL1, PL3, and PL5 are arranged at constant intervals in the Y-axis direction on the left side of the center plane P3 and three projection modules (projection optical systems) PL2, PL4, and PL6 are arranged at constant intervals in the Y-axis direction on the right side of the center plane P3.

In such multi-lens type exposure apparatus EX, the entire image of a desired pattern is projected by overlapping the ends in the Y-axis direction of the areas (projection areas PA1 to PA6) exposed by the plurality of projection modules PL1 to PL6 with each other. In such exposure apparatus EX, even when the size in the Y-axis direction of a pattern on the cylindrical mask DM increases and a substrate P with a large width in the Y-axis direction needs to be essentially handled, the projection modules PA and the modules on the illumination mechanism IU side corresponding to the projection modules PA only have to be additionally provided in the Y-axis direction and thus there is a merit that it is possible to easily cope with an increase in size of a panel (the width of the substrate P).

The exposure apparatus EX may not be a multi-lens type. For example, when the size in the width direction of the substrate P is small to a certain degree, the exposure apparatus EX may project an image of the entire width of the pattern onto the substrate P using a single projection module. Each of the plurality of projection modules PL to PL6 may project a pattern corresponding to one device. That is, the exposure apparatus EX may project a plurality of device patterns in parallel using the plurality of projection modules.

The illumination mechanism IU of this embodiment includes a light source device (not shown) and an illumination optical system. The illumination optical system includes a plurality (for example, six) of illumination modules IL arranged in the Y-axis direction to correspond to the plurality of projection modules PL1 to PL6. The light source device includes a lamp light source such as a mercury lamp or a solid light source such as a laser diode and a light-emitting diode (LED).

Examples of illumination light emitted from the light source device includes bright rays (a g ray, an h ray, an i ray) emitted from a lamp light source, far-ultraviolet light (DUV light) such as a KrF excimer laser beam (with a wavelength of 248 nm), and an ArF excimer laser beam (with a wavelength of 193 nm). The illumination light emitted from the light source device is uniformized in illuminance distribution and is distributed to a plurality of illumination modules IL via a light guide member such as an optical fiber.

Each of the plurality of illumination modules IL includes plurality of optical members such as lenses. In this embodiment, light emitted from the light source device and passing through any of the plurality of illumination modules IL is referred to as an illumination light beam EL1. Each of the plurality of illumination modules IL includes, for example, an integrator optical system, a rod lens, and a fly-eye lens and illuminates the illumination areas IR with the illumination light beam EL1 with a uniform illuminance distribution. In this embodiment, the plurality of illumination modules IL is arranged inside the cylindrical mask DM. Each of the plurality of illumination modules IL illuminates the corresponding illumination area IR of the mask pattern formed on the outer circumferential surface of the cylindrical mask DM from the inside of the cylindrical mask DM.

Figure 3:
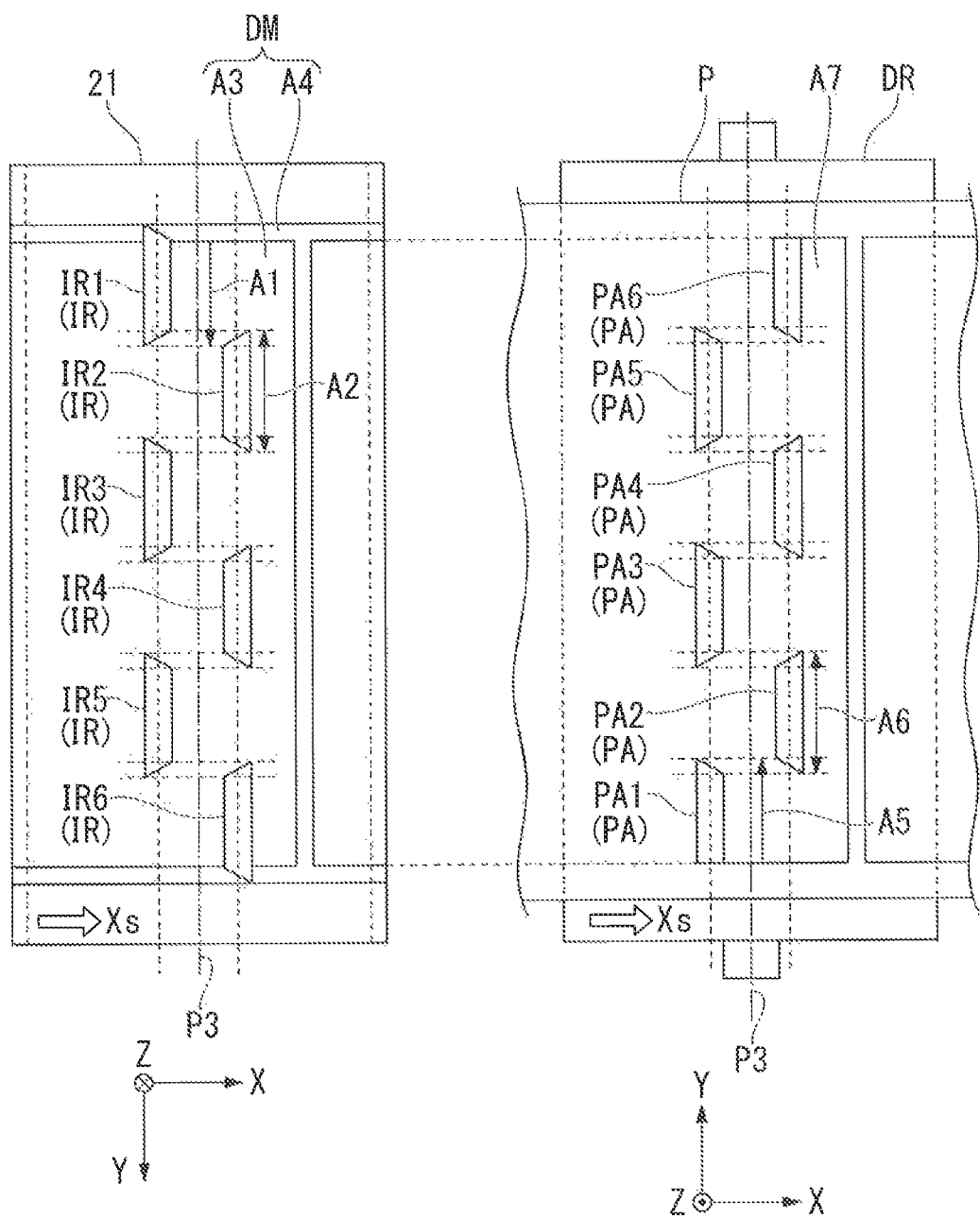
FIG. 3 is a diagram showing an arrangement of illumination areas and projection areas in the exposure apparatus.

FIG. 3 is a diagram showing an arrangement of the illumination areas IR and the projection areas PA in this embodiment. FIG. 3 shows a plan view (the left view in FIG. 3) when the illumination areas IR on the cylindrical mask DM disposed in the first drum member 21 is viewed from the −Z-axis side and a plan view (the right view in FIG. 3) when the projection areas PA on the substrate P disposed on the rotary drum DR are viewed from the +Z-axis side. Reference sign Xs in FIG. 3 represents the moving direction (rotating direction) of the first drum member 21 or the rotary drum DR.

The plurality of illumination modules IL illuminate the first illumination area IR1 to the sixth illumination area IR6 on the cylindrical mask DM, respectively. For example, the first illumination module IL illuminates the first illumination area IR1 and the second illumination module IL illuminates the second illumination area IR2.

The first illumination area IR1 in this embodiment is defined as a trapezoidal area which is thin and long in the Y-axis direction. However, in a projection optical system having a configuration for forming an intermediate image plane like a projection optical system (projection module) PL to be described below, since a field diaphragm plate having a trapezoidal opening can be disposed at the position of the intermediate image plane, the illumination area may be a rectangular area including the trapezoidal opening. The third illumination area IR3 and the fifth illumination area IR5 are areas having the same shape as the first illumination area IR1 and are arranged at constant intervals in the Y-axis direction. The second illumination area IR2 is a trapezoidal (or rectangular) area which is symmetric about the center plane P3 with the first illumination area IR1. The fourth illumination area IR4 and the sixth illumination area IR6 are areas having the second illumination area IR2 and are arranged at constant intervals in the Y-axis direction.

As shown in FIG. 3, the first illumination area IR1 to the sixth illumination area IR6 are arranged so that triangular parts of oblique side parts of the neighboring trapezoidal areas overlap with each other when viewed in the circumferential direction of the first surface P1. Accordingly, for example, a first area A1 on the cylindrical mask DM passing through the first illumination area IR1 with the rotation of the first drum member 21 partially overlaps with a second area A2 on the cylindrical mask DM passing through the second illumination area IR2 with the rotation of the first drum member 21.

In this embodiment, the cylindrical mask DM includes a pattern-formed area A3 in which a pattern is formed and a non-pattern-formed area A4 in which a pattern is not formed. The non-pattern-formed area A4 is arranged to surround the pattern-formed area A3 in a frame shape and has a characteristic blocking an illumination light beam EL1. The pattern-formed area A3 of the cylindrical mask DM moves in the direction Xs with the rotation of the first drum member 21 and the partial areas in the Y-axis direction in the pattern-formed area A3 pass through any of the first illumination area IR1 to the sixth illumination area IR6. In other words, the first illumination area IR1 to the sixth illumination area IR6 are arranged to cover the entire width in the Y-axis direction of the pattern-formed area A3.

As shown in FIG. 2, the plurality of projection modules PL1 to PL6 arranged in the Y-axis direction correspond to the first to sixth illumination modules IL in a one-to-one correspondence manner. An image of a partial pattern of the cylindrical mask DM appearing in the illumination area IR illuminated by the corresponding illumination module IL is projected onto the corresponding projection area PA on the substrate P.

For example, the first projection module PL1 corresponds to the first illumination module IL and projects an image of a pattern of the cylindrical mask DM in the first illumination area IR1 (see FIG. 3) illuminated by the first illumination module IL onto the first projection area PA1 on the substrate P. The third projection module PL3 and the fifth projection module PL5 correspond to the third illumination module 1L and the fifth illumination module IL, respectively. The third projection module PL3 and the fifth projection module PL5 are arranged at positions overlapping with the first projection module PL1 when viewed in the Y-axis direction.

The second projection module PL2 corresponds to the second illumination module 1L and projects an image of a pattern of the cylindrical mask DM in the second illumination area IR2 (see FIG. 3) illuminated by the second illumination module IL onto the second projection area PA2 on the substrate P. The second projection module PL2 is arranged at a position about the center plane P3 with the first projection module PL1 when viewed in the Y-axis direction.

The fourth projection module PL4 and the sixth projection module PL6 correspond to the fourth illumination module IL and the sixth illumination module IL, respectively. The fourth projection module PL4 and the sixth projection module PL6 are arranged at positions overlapping with the second projection module PL2 when viewed in the Y-axis direction.

In this embodiment, light traveling from the illumination module IL of the illumination mechanism IU to the illumination areas IR1 to IR6 on the cylindrical mask DM is defined as an illumination light beam EL1. Light modulated in intensity distribution based on the partial patterns of the cylindrical mask DM appearing in the illumination areas IR1 to IR6, made incident on the projection modules PL1 to PL6, and arriving at the projection areas PA1 to PA6 is defined as an image-forming light beam EL2 (exposing illumination light). In this embodiment, as shown in FIG. 2, principal rays passing through the center points of the projection areas PA1 to PA6 out of the image-forming light beams EL2 arriving at the projection areas PA1 to PA6 are arranged at position (specific positions) of angle θ in the circumferential direction with the center plane P3 when viewed in the direction of the rotation center line AX2 of the rotary drum DR.

As shown in the right drawing of FIG. 3, an image of a pattern in the first illumination area IR1 is projected onto the first projection area PA1, an image of a pattern in the third illumination area IR3 is projected onto the third projection area PA3, and an image of a pattern in the fifth illumination area IR5 is projected onto the fifth projection area PA5. In this embodiment, the first projection area PA1, the third projection area PA3, and the fifth projection area PA5 are arranged in a line in the Y-axis direction.

An image of a pattern in the second illumination area IR2 is projected onto the second projection area PA2. In this embodiment, the second projection area PA2 is arranged to be symmetric about the center plane P3 with the first projection area PA1 when viewed in the Y-axis direction. An image of a pattern in the fourth illumination area IR4 is projected onto the fourth projection area PA4 and an image of a pattern in the sixth illumination area IR6 is projected onto the sixth projection area PA6. In this embodiment, the second projection area PA2, the fourth projection area PA4, and the sixth projection area PA6 are arranged in a line in the Y-axis direction.

The first projection area PA1 to the sixth projection area PA6 are arranged so that the ends (the triangular parts of the trapezoid) of the neighboring projection areas (the odd-numbered projection areas and the even-numbered projection areas) in a direction parallel to the second center line AX2 overlap with each other when viewed in the circumferential direction of the second surface p2. Accordingly, a third area A5 on the substrate P passing through the first projection area PA1 with the rotation of the rotary drum DR partially overlaps with a fourth area A6 on the substrate P passing through the second projection area PA2 with the rotation of the rotary drum DR. The shapes of the first projection area PA1 and the second projection area PA2 are set so that the exposure amount in the area in which the third area A5 and the fourth area A6 overlap is substantially equal to the exposure amount in which the areas do not overlap.

The detailed configuration of the projection optical system PL according to this embodiment will be described with reference to FIG. 4. In this embodiment, each of the second projection module PL2 to the fifth projection module PL5 has the same configuration as the first projection module PL1. Accordingly, the configuration of the first projection module PL1 will be described representatively of the projection optical system PL.

Figure 4:
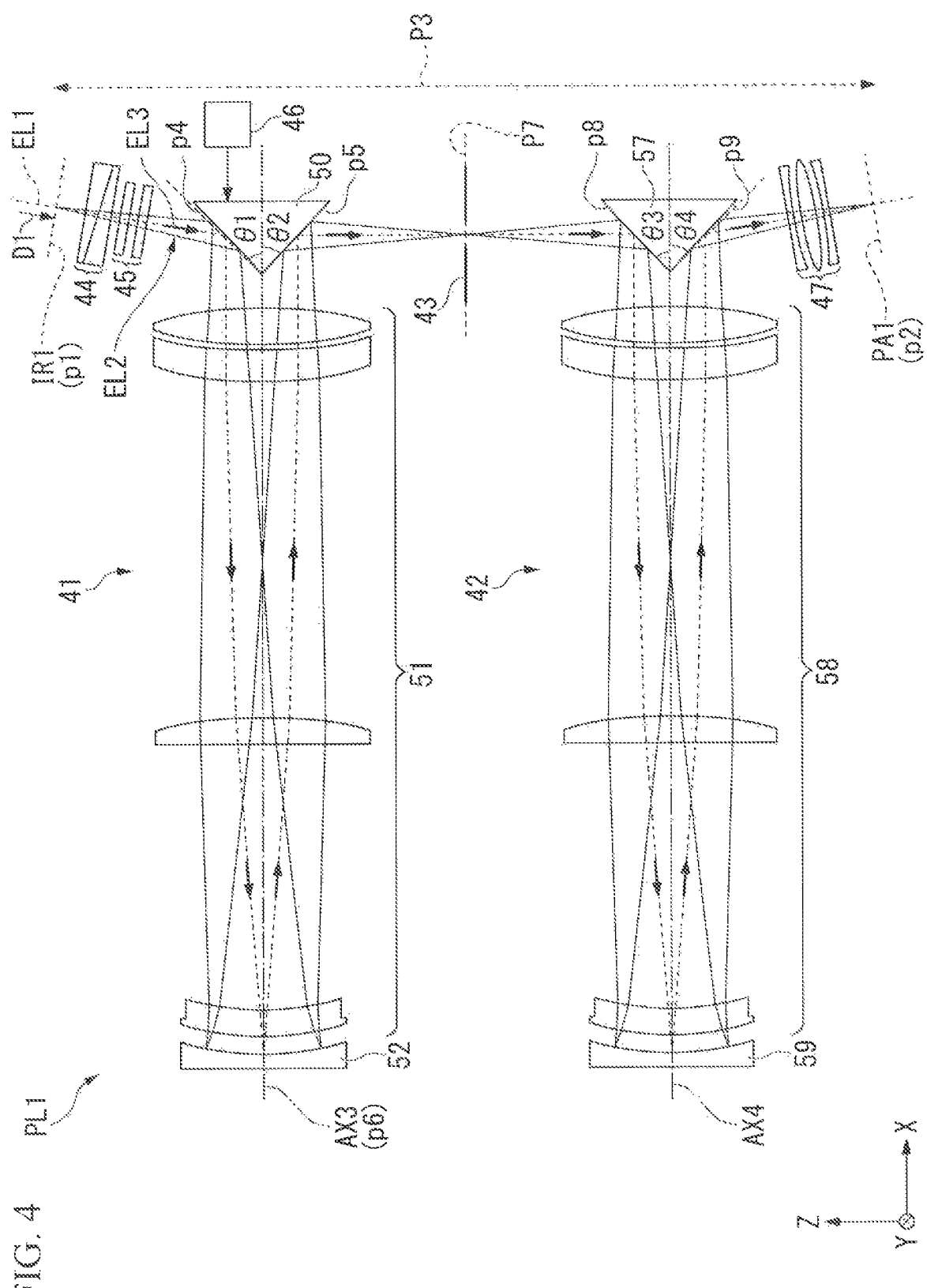
FIG. 4 is a diagram showing a configuration of a projection optical system applied to the exposure apparatus.

The first projection module PL1 shown in FIG. 4 includes a first optical system 41 that forms an image of a pattern of the cylindrical mask DM arranged in the first illumination area IR1 on the intermediate image plane P7, a second optical system 42 that re-forms at least a part of the intermediate image formed by the first optical system 41 in the first projection area PA1 of the substrate P, and a first field diaphragm 43 that is disposed on the intermediate image plane P7 on which the intermediate image is formed.

The first projection module PL1 includes a focus correcting optical member 44 configured to finely adjust a focused state of a mask pattern image (hereinafter, referred to as projection image) formed on the substrate P, an image shift correcting optical member 45 configured to finely horizontally shift the projection image on the image plane, a magnification correcting optical member 47 configured to finely correct the magnification of the projection image, and a rotation correcting mechanism 46 configured to finely rotate the projection image in the image plane.

The image-forming light beam EL2 from the pattern of the cylindrical mask DM is emitted in the normal direction (Dl) from the first illumination area IR1, passes through the focus correcting optical member 44, and is made incident on the image shift correcting optical member 45. The image-forming light beam EL2 passing through the image shift correcting optical member 45 is reflected at a first reflection surface (planar mirror) p4 of a first deflection member 50 which is an element of the first optical system 41, passes through a first lens group 51, is reflected at a first concave mirror 52, passes through the first lens group 51 again, is reflected at a second reflection surface (planar mirror) p5 of the first deflection member 50, and is made incident on a first field diaphragm 43. The image-forming light beam EL2 passing through the first field diaphragm 43 is reflected at a third reflection surface (planar mirror) p8 of a second deflection member 57 which is an element of the second optical system 42, passes through a second lens group 58, is reflected at a second concave mirror 59, passes through the second lens group 58 again, is reflected at a fourth reflection surface (planar mirror) p9 of the second deflection member 57, and is then made incident on the magnification correcting optical member 47. The image-forming light beam EL2 emitted from the magnification correcting optical member 47 is made incident on the first projection area PA1 on the substrate P and the image of the pattern appearing in the first illumination area IR1 is projected onto the first projection area PA1 at an equal magnification (×1).

As shown in FIG. 2, when the radius r1 of the cylindrical mask DM and the radius r2 of the cylindrical surface of the substrate P wound around the rotary drum DR are set to be equal to each other, the principal ray of the image-forming light beam EL2 at the mask side of each of the projection modules PL1 to PL6 is inclined so as to pass through the center line AX1 of the cylindrical mask DM, but the inclination angle thereof is equal to the inclination angle θ (±θ about the center plane P3) of the principal ray of the image-forming light beam EL2 at the substrate side.

In order to give such inclination angle θ, the angle θ1 of the first reflection surface p4 of the first deflection member 50 shown in FIG. 4 about the optical axis AX3 is set to be smaller by Δθ1 than 45° and the angle θ4 of the fourth reflection surface p9 of the second deflection member 57 about the optical axis AX4 is set to be smaller by Δθ4 than 45°. Δθ1 and Δθ4 are set to have a relationship of Δθ1=Δθ4=θ/2 with the angle θ shown in FIG. 2.

Figure 5:
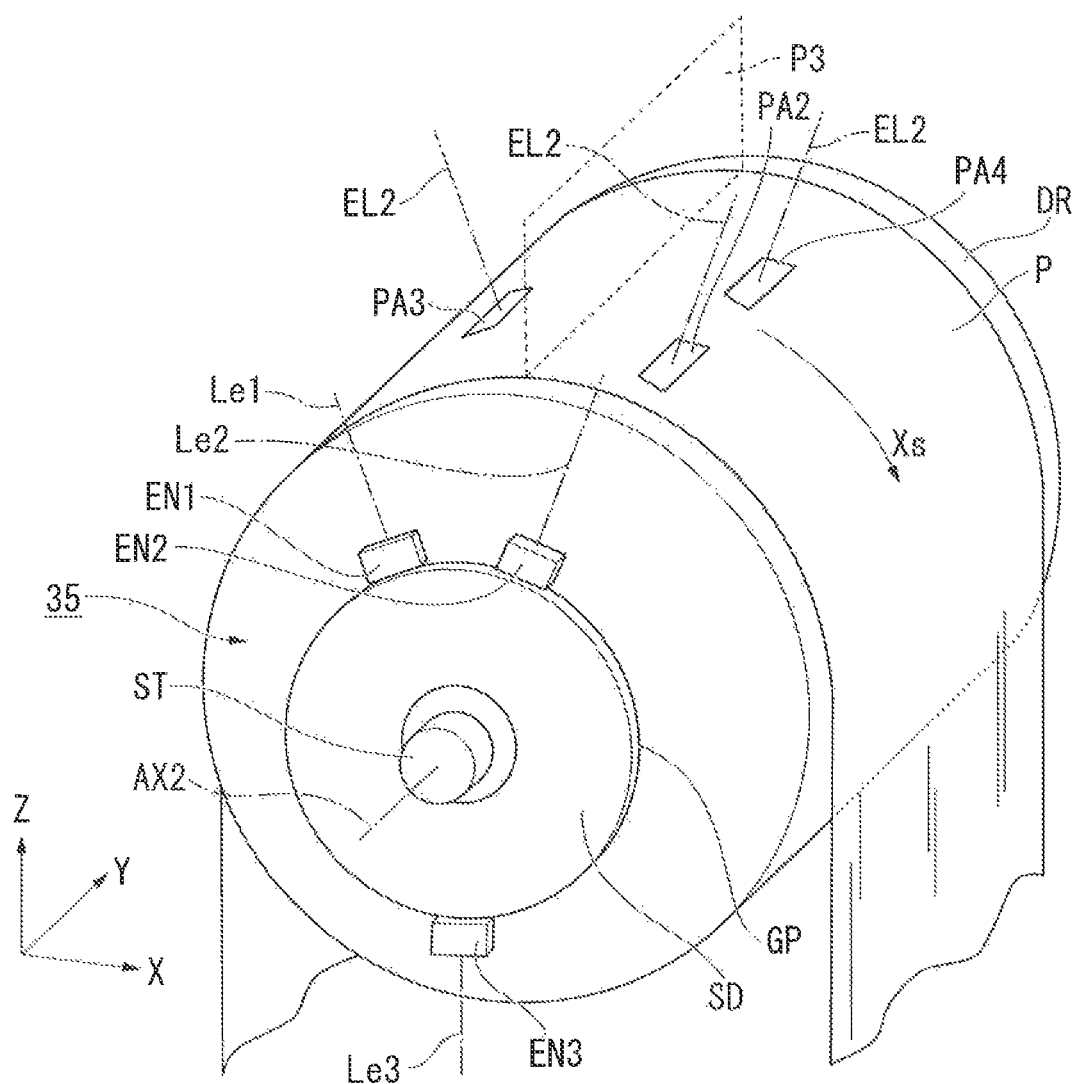
FIG. 5 is a perspective view showing an appearance of a rotary drum.

FIG. 5 is a perspective view showing the appearance of the rotary drum DR.

In FIG. 5, for the purpose of convenience of explanation, only the second projection area PA2 to the fourth projection area PA4 are shown and the first projection area PA1, the fifth projection area PA5, and the sixth projection area PA6 are not shown.

The second detector 35 optically detects the rotational position of the rotary drum DR and includes a scale disk (the scale member, the disk-like member) SD with high roundness and encoder heads (reading mechanism) EN1 to EN3.

The scale disk SD is fixed to the rotation shaft ST of the rotary drum DR and rotates along with the rotation shaft ST about the rotation center line AX2 and a scale portion GP is carved on the outer circumferential surface. The encoder heads EN1 to EN3 are disposed to face the scale portion GP and read the scale portion GP in a non-contacting manner. The encoder heads EN1 and EN2 have measurement sensitivity (detection sensitivity) to displacement in a tangent direction (in the XZ plane) of the scale portion GP. When the installation azimuths thereof (angle directions in the XZ plane about the rotation center line AX2) are denoted by installation azimuth lines Le1 and Le2, the encoder heads EN1 and EN2 are arranged so that the installation azimuth lines Le1 and Le2 are ±θ° with respect to the center plane P3.

That is, the installation azimuth line Le1 of the encoder head EN1 matches the inclination angle θ of the principal ray passing through the center points of the projection fields PA1, PA3, and PA5 of the odd-numbered projection modules PL1, PL3, and PL5 about the center plane P3. The installation azimuth line Le2 of the encoder head EN2 matches the inclination angle θ of the principal ray passing through the center points of the projection fields PA2, PA4, and PA6 of the even-numbered projection modules PL2, PL4, and PL6 about the center plane P3.

The third encoder head (the third reading mechanism) EN3 is arranged on the opposite side of the rotation center line AX2 with respect to the encoder heads EN1 and EN2, and the installation azimuth line Le3 thereof is set on the center plane P3.

The scale disk SD in this embodiment is manufactured with a diameter as large as possible (for example, a diameter of 20 cm or more) so as to enhance the measurement resolution using metal with a low thermal expansion coefficient, glass, ceramics, or the like as a base material. In FIG. 5, the diameter of the scale disk SD is shown to be smaller than the diameter of the rotary drum DR. However, a so-called measurement Abbe error can be further reduced by causing the diameter of the scale portion GP of the scale disk SD to match (to be almost equal to) the diameter of the outer circumferential surface around which the substrate P is wound in the outer circumferential surface of the rotary drum DR.

The minimum pitch of the scales (grids) caved in the circumferential direction of the scale portion GP is limited by the performance of a scale carving device or the like. Accordingly, when the diameter of the scale disk SD is set to be large, the angle measurement resolution corresponding to the minimum pitch can be accordingly enhanced.

As described above, the directions of the installation azimuth lines Le1 and Le2 in which the encoder heads EN1 and EN2 for reading the scale portion OP are arranged are set to be equal to the directions in which the principal rays of the image-forming light beams EL2 are made incident on the substrate P with respect to the substrate P when viewed from the rotation center line AX2. Accordingly, even when the rotary drum DR is shifted in the X-axis direction due to a slight rattle (about 2 μm to 3 μm) of a bearing supporting the rotation shaft, a positional error in the conveyance direction (Xs) of the substrate P which can be generated in the projection areas PA1 to PA6 can be measured with high accuracy by the use of the encoder heads EN1 and EN2.

By comparing the measured values by the encoder heads EN1 and EN2 with the measured value by the encoder head EN3, it is possible to suppress the influence of an eccentric error of the scale disk SD from the rotation shaft ST and thus to perform the measurement with high accuracy.

When the position in the rotating direction or the rotation speed of the rotary drum DR is stably detected on the basis of the measurement signals from the encoder heads EN1, EN2, and EN3, the controller 14 controls the second driving part 36 in a servo mode. Accordingly, it is possible to control the rotational position of the rotary drum DR with higher accuracy. By servo-controlling the rotational position and the rotation speed of the first drum member 21 through the use of the first driving part 26 on the basis of the measurement signal corresponding to the rotational position or the rotation speed of the first drum member 21 (cylindrical mask DM) detected by the first detector 25, it is possible to synchronously move (synchronously rotate) the first drum member 21 and the rotary drum DR.

Accordingly, the speed in the circumferential direction of a pattern on the cylindrical mask DM and the conveyance speed of the substrate P by the rotary drum DR are accurately set to the projection magnification of the projection optical system PL, for example, 1:1 herein.

Accordingly, the images of the patterns located in the illumination areas IR of the cylindrical mask DM illuminated by the plurality of illumination modules IL are projected onto the projection areas PA on the substrate P corresponding to the illumination modules.

In this way, in this embodiment, the installation azimuth lines Le1 and Le2 of the encoder heads EN1 and EN2 arranged around the scale portion GP of the scale disk SD are set to match (to be equal to) the inclination direction of the principal ray of the image-forming light beam EL2 traveling toward the projection areas PA on the substrate P when viewed from the direction of the rotation center line AX2. Accordingly, even when the rotary drum DR is finely shifted in the direction of the scanning exposure (conveyance direction) of the substrate P, it is possible to measure the shift in real time by the use of the encoder heads EN1 and EN2 and thus to correct the variation in exposure position due to the shift, for example, by the use of the image shift correcting optical member 45 or the like in the projection optical system PL with high accuracy and at a high speed.

Therefore, it is possible to perform an exposure process on the substrate P with high positional accuracy.

Second Embodiment

A substrate processing apparatus according to a second embodiment of the invention will be described below with reference to FIG. 6.

In the drawing, the same elements as in the first embodiment shown in FIGS. 1 to 5 will be given the same reference signs and description thereof will not be repeated.

Figure 6:
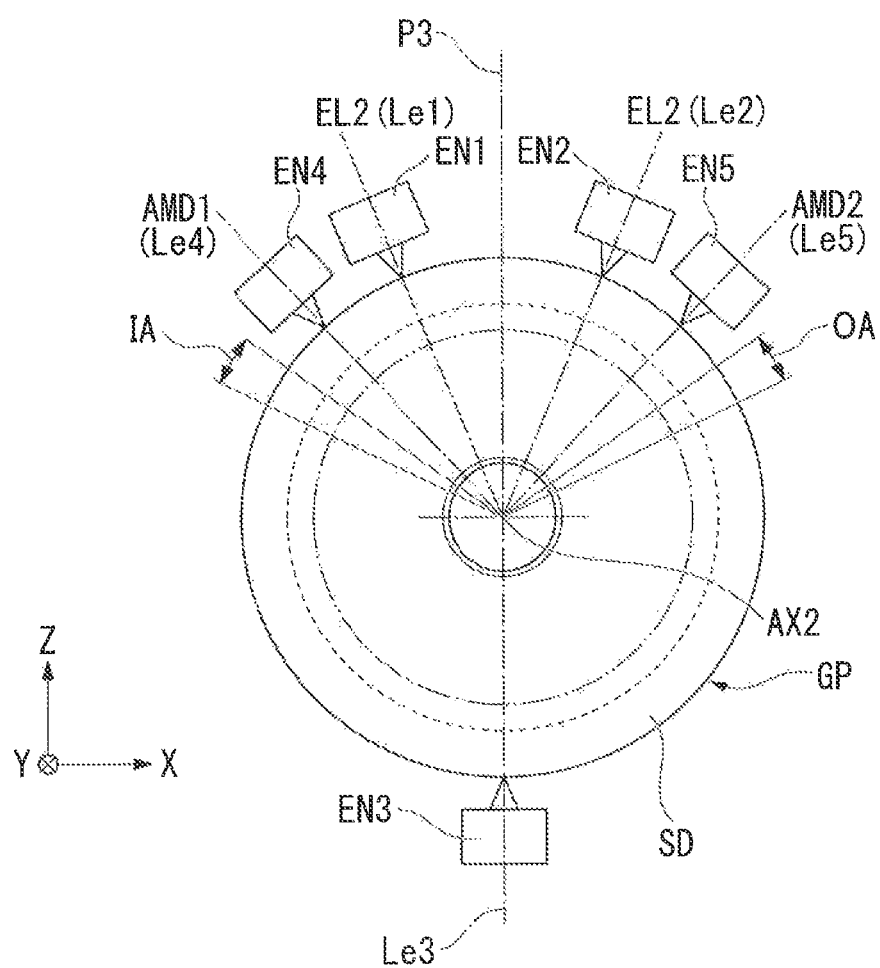
FIG. 6 is a diagram showing a scale disk according to a second embodiment when viewed in a rotation center line direction.

FIG. 6 is a diagram showing the scale disk SD installed in the rotary drum DR when viewed from the direction of the rotation center line AX2 (the Y-axis direction). In this embodiment, like in FIG. 5, encoder heads EN1 and EN2 arranged in the installation azimuth lines Le1 and Le2 inclined in the same direction as the direction in which the image-forming light beam EL2 (principal ray) traveling toward the rotation center line AX2 is made incident on the substrate P and an encoder head EN3 arranged in the installation azimuth line Le3 (the center plane P3) to face the encoder heads EN1 and EN2 are provided in the XZ plane as shown in FIG. 6. In this embodiment, in addition to the encoder heads EN1, EN2, and EN3, encoder heads EN4 and EN5 are respectively arranged in the installation azimuth lines Le4 and Le5 set in the radial direction of the scale portion GP to be parallel to the observation directions AMD1 and AMD2 (extending to the rotation center line AX2) of the substrate P by the alignment microscopes AM1 and AM2 (the detection probe, the pattern detecting device) shown in FIG. 1.

The positions in the circumferential direction about the rotation center line AX2 at which the alignment microscopes AM1 and AM2 and the encoder heads EN4 and EN5 are set to be located (in a specific range) between an approaching area IA in which the substrate P starts contacting the rotary drum DR and a separation area OA in which the substrate P is separated from the rotary drum DR.

The alignment microscope AM1 of this embodiment is arranged on the preceding side of the exposure position (projection area), detects an image of alignment marks (which are formed in an area of several tens of μm square to several hundreds of μm square) formed in the vicinity of the ends in the Y-axis direction of the substrate P at a high speed by the use of an imaging device or the like in a state where the substrate P is conveyed at a predetermined speed, and samples the images of the marks in a microscope field (imaging range) at a high speed. By storing the rotation angle position of the scale disk SD which is sequentially measured by the encoder head EN4 at the instant of sampling, the correspondence between the mark position on the substrate P and the rotation angle of the rotary drum DR is calculated.

On the other hand, the alignment microscope AM2 is arranged after the exposure position (projection area), and samples an image of alignment marks (which are formed in an area of several tens of μm square to several hundreds of μm square) formed in the vicinity of the ends in the Y-axis direction of the substrate P at a high speed by the use of an imaging device or the like similarly to the alignment microscope AM1. By storing the rotation angle position of the scale disk SD which is sequentially measured by the encoder head EN5 at the instant of sampling, the correspondence between the mark position on the substrate P and the rotation angle of the rotary drum DR is calculated.

When the mark detected by the alignment microscope AM1 is detected by the alignment microscope AM2, the difference between the angle position measured and stored by the encoder head EN4 and the angle position measured and stored by the encoder head EN5 is compared with an opening angle of the installation azimuth lines Le4 and Le5 of two alignment microscopes AM1 and AM2 accurately calibrated in advance. When there is an error therebetween, there is a possibility that the substrate P slightly slides on the rotary drum DR or expands or contracts in the conveyance direction (circumferential direction) between the approach area IA and the separation area OA.

In general, the positional error at the time of patterning is determined depending on fineness or overlap accuracy of device patterns formed on the substrate P. For example, in order to accurately overlap and expose an underlying pattern layer with a line pattern with a width of 10 μm, only an error of one over several thereof, that is, a positional error of about ±2 μm in terms of the size on the substrate P, is allowed.

In order to realize such high-accuracy measurement, the measuring direction (the tangential direction of the outer circumference of the rotary drum DR in the XZ plane) of a mark image by the alignment microscopes AM1 and AM2 and the measuring direction (the tangential direction of the outer circumference of the scale portion GP in the XZ plane) by the encoder heads EN4 and EN5 need to be matched within an allowable angle error.

As described above, in this embodiment, the operations and advantages of the first embodiment can be achieved. In addition, the encoder heads EN4 and EN5 are arranged so as to match the measuring directions (the tangential direction of the circumferential surface of the rotary drum DR) of an alignment mark (specific pattern) on the substrate P by the alignment microscopes AM1 and AM2. Accordingly, even when the rotary drum DR (the scale disk SD) is shifted in the circumferential direction (the tangential direction) perpendicular to the installation azimuth line Le4 or Le5 in the XZ plane at the time of detecting the position (sampling the image) of the substrate P (mark) by the use of the alignment microscope AM1 and AM2, it is possible to measure a position with high accuracy in consideration of such shift.

As a result, the driving of the cylindrical mask DM, the driving of the rotary drum DR, or the applying of a tension to the substrate P by the controller 14 can be subjected to accurate feedback control or feedforward control, and it is thus possible to perform a high-accuracy exposure process on the substrate P.

In this embodiment, the encoder head EN4 set to the position in the circumferential direction of the imaging field of the alignment microscope AM1 can be arranged in the vicinity of the encoder head EN1 set to the positions in the circumferential direction of the odd-numbered projection areas PA1, PA3, and PA5, and the encoder head EN5 set to the position in the circumferential direction of the imaging field of the alignment microscope AM2 can be arranged in the vicinity of the encoder head EN2 set to the positions in the circumferential direction of the even-numbered projection areas PA2, PA4, and PA6.

Accordingly, it is possible to measure a pitch deviation in the circumferential direction of the scales (grids) carved in the scale portion GP using a set of two neighboring encoder heads (EN1 and EN4, or EN2 and EN5). By measuring such pitch deviation over the entire circumference of the scale disk SD, it is possible to prepare a correction map corresponding to the rotation angle position of the scale disk SD and thus to perform higher-accuracy measurement.

In this embodiment, since the encoder heads EN1 to EN5 are arranged at five positions around the scale disk SD, it is possible to calculate roundness (deformation), an eccentric error, and the like of the scale portion GP of the scale disk SD by combining and calculating the values measured by two or three appropriate encoder heads thereof.

Third Embodiment

Figure 7A:
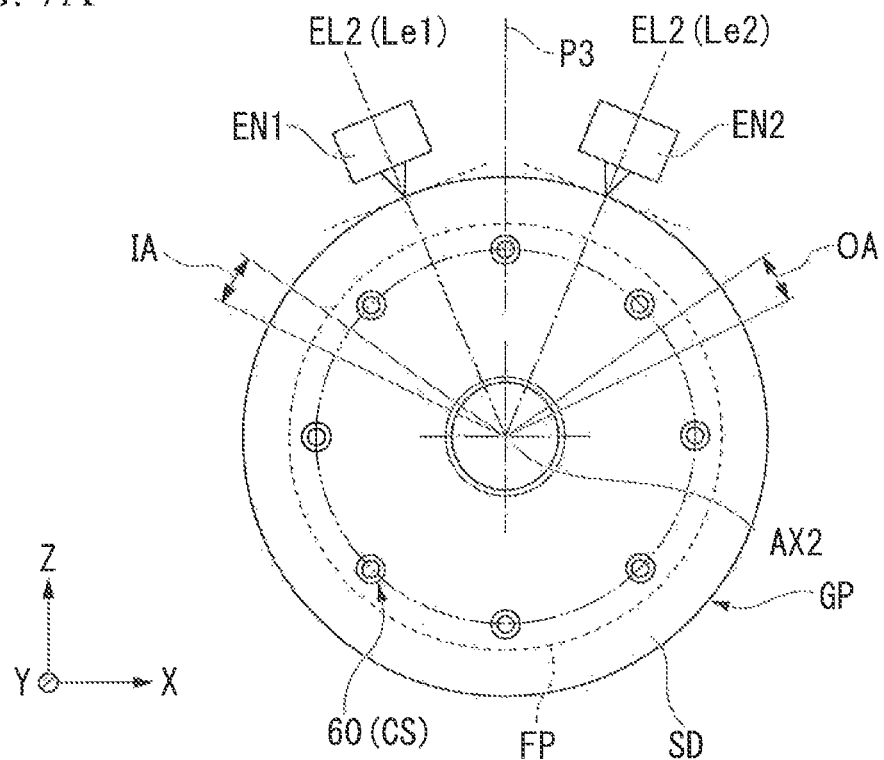
FIG. 7A is a diagram showing a rotary drum according to a third embodiment.
Figure 7B:
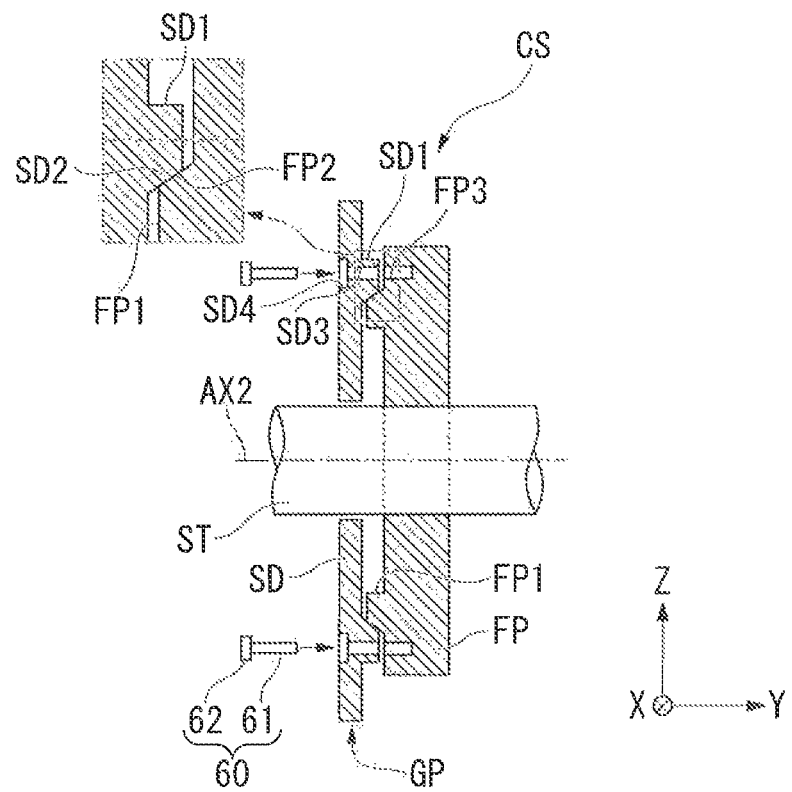
FIG. 7B is a diagram showing the rotary drum according to the third embodiment.

A substrate processing apparatus according to a third embodiment of the invention will be described below with reference to FIGS. 7A and 7B. In the drawings, the same elements as in the first and second embodiments shown in FIGS. 1 to 6 will be given the same reference signs and a description thereof will not be repeated.

In this embodiment, a roundness adjusting device that adjusts roundness of the scale disk SD is provided. As shown in FIG. 7B, the roundness adjusting device CS includes a protrusion SD1 protruding in a ring shape along the circumferential direction from the surface on the +Y-axis side of the scale disk SD and a disk-like fixed plate FP into which the rotation shaft ST is inserted and fixed on the +Y-axis side of the scale disk SD.

The surface of the fixed plate FP on the side facing the scale disk SD is provided with a protrusion FP1 protruding in a ring shape along the circumferential direction. An inclined surface SD2 gradually increasing in diameter toward the fixed plate FP is formed on the inner circumference side of the protrusion SD1. An inclined surface FP2 gradually decreasing in diameter toward the scale disk SD and fitted to the inclined surface SD2 is formed on the outer circumference side of the protrusion FP1. The diameter of the tip of the inclined surface FP2 is set to be larger than the diameter of the base of the inclined surface SD2. The diameter of the tip of the inclined surface SD2 is set to be smaller than the diameter of the base of the inclined surface FP2.

In the scale disk SD, a through-hole SD3 and a stepped portion SD4 opened to the −Y-axis side are formed along the rotation center line AX2 at a distance from the rotation center line AX2 at which the protrusion SD1 is located. A female-screwed portion FP3 is formed in the fixed plate FP so as to be coaxial with the through-hole SD3 and the stepped portion SD4.

The through-hole SD3, the stepped portion SD4, and the female-screwed portion FP3 are formed at a plurality of positions (eight in this embodiment) at predetermined pitches in the circumferential direction around the rotation axis line AX2, and the respective positions serve as an adjustment portion.

An adjustment screw 60 including a male-threaded portion 61 inserted into the through-hole SD3 and screwed to the female-screwed portion FP3 and a head portion 62 engaging with the stepped portion SD4 is attached to each adjustment portion.

In the roundness adjusting device CS having this configuration, by screwing the adjustment screw 60 in, the scale disk SD moves in the direction in which it gets close to the fixed plate FP and thus the inclined surface SD2 is elastically minutely deformed to the outer diameter side along the inclined surface FP2. On the contrary, by reversely rotating the adjustment screw 60, the scale disk SD moves in the direction in which it is spaced apart from the fixed plate FP and thus the inclined surface SD2 is elastically minutely deformed to the inner diameter side along the inclined surface FP2.

In this way, by operating the adjustment screw 60 in each adjustment portion, the protrusion SD1 in the adjustment portion in the scale disk SD can be minutely adjusted in the circumferential direction and the diameter of the scale portion GP formed on the outer circumferential surface can be finely adjusted. Therefore, by operating the adjustment portion (adjustment screw 60) at an appropriate position depending on the roundness of the scale disk SD, it is possible to enhance the roundness of the scale portion GP of the scale disk SD or to reduce a fine eccentric error with respect to the rotation center line AX2, thereby improving the position detection accuracy in the rotating direction of the rotary drum DR. The degree of adjustment varies depending on the diameter of the scale disk SD and the radius position of the adjustment portion, and is several micrometers at most.

In this embodiment, similarly to the first and second embodiments, the third encoder head (the third reading mechanism) EN3 may be arranged on the opposite side of the encoder heads EN1 and EN2 with the rotation center line AX2 interposed therebetween.

Fourth Embodiment

A substrate processing apparatus according to a fourth embodiment of the invention will be described below with reference to FIGS. 8 and 9. In the drawings, the same elements as in the first to third embodiments shown in FIGS. 1 to 7B will be given the same reference signs and a description thereof will not be repeated.

Figure 8:
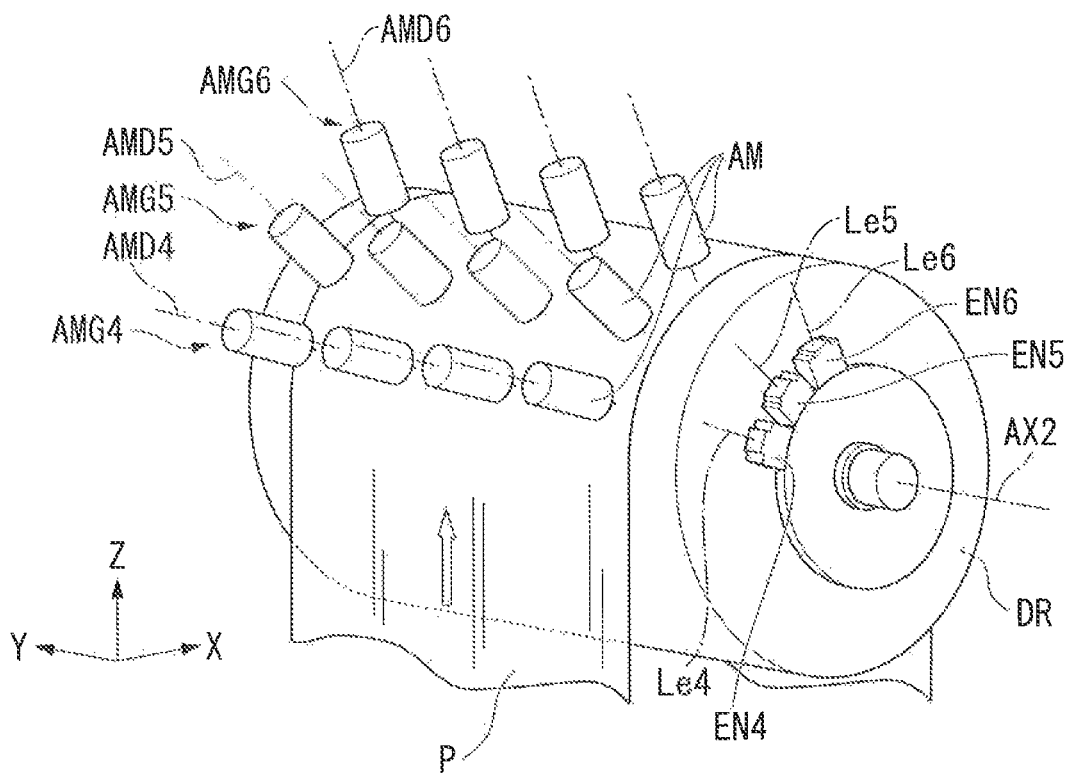
FIG. 8 is a perspective view showing an appearance of a rotary drum according to a fourth embodiment.

FIG. 8 is a perspective view showing the appearance of the rotary drum DR around which the substrate P is wound. In FIG. 8, the encoder heads EN1 and EN2 having the same installation azimuth in the circumferential direction as the image-forming light beam EL2 are not shown.

As shown in FIG. 8, in this embodiment, total twelve alignment microscopes (also referred to as non-contacting detection probes) AM are arranged around the substrate P wound around the rotary drum DR.

The twelve alignment microscopes are arranged so that three alignment microscope groups AMG4, AMG5, and AMG6 each including four alignment microscopes AM arranged at predetermined intervals in the direction (the Y-axis direction) in which the rotation center line AX2 extends are arranged at predetermined angle intervals in the circumferential direction of the rotary drum DR.

The four alignment microscopes AM constituting the alignment microscope group AMG4 face the rotation center line AX2 and have observation (detection) center lines AMD4 inclined in the same direction in the XZ plane. The four alignment microscopes AM constituting the alignment microscope group AMG5 face the rotation center line AX2 and have observation (detection) center lines AMD5 inclined in the same direction in the XZ plane. The four alignment microscopes AM constituting the alignment microscope group AMG6 face the rotation center line AX2 and have observation (detection) center lines AMD6 inclined in the same direction in the XZ plane.

The alignment microscope groups AMG4 to AMG6 are arranged to be closer to the approaching area IA side (the −X-axis side) than the exposure positions (the projection areas PA1 to PA6) to the substrate P in the circumferential direction of the rotary drum DR. That is, the alignment microscope groups AMG4 to AMG6 are arranged around the rotary drum DR so that the detection areas by the alignment microscope groups AMG4 to AMG6 are set at the upstream side in the conveyance direction of the substrate P than the two encoder heads EN1 and EN2 arranged to correspond to the exposure positions (the projection areas PA1 to PA6).

In this embodiment as shown in FIG. 8, the encoder heads EN4 to EN6 (the detection position reading mechanism) are arranged in the installation azimuth lines Le4, Le5, and Le6 extending in the same direction as the observation (detection) center lines AMD4 to AMD5 of three alignment microscope groups AMG4 to AMG6 when viewed in the XZ plane. The encoder heads EN4 to EN6 read the scale portion GP in a non-contacting manner.

Figure 9:
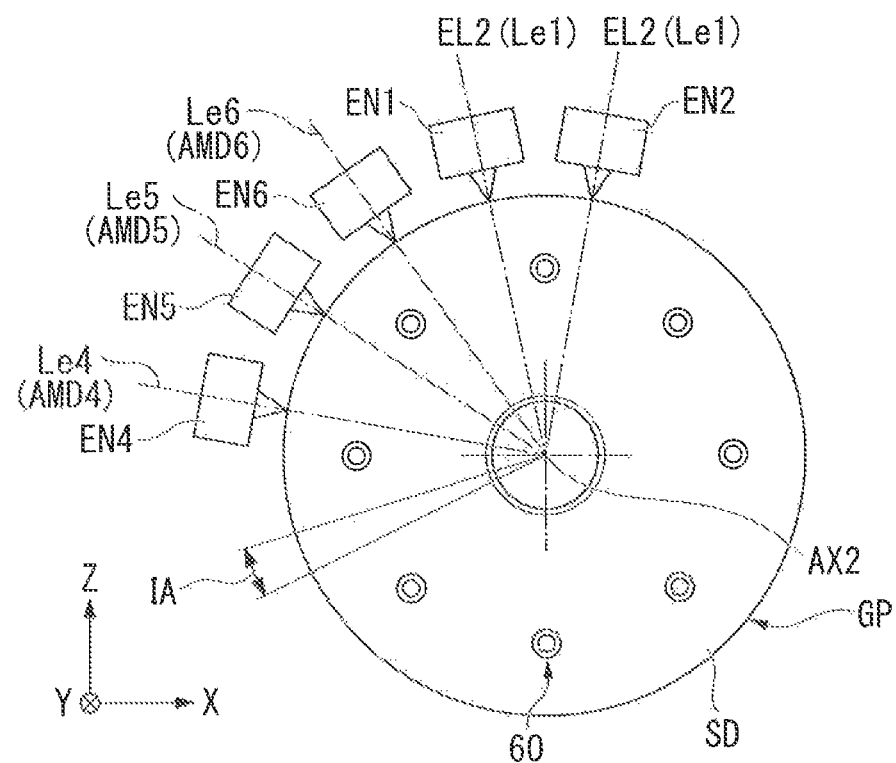
FIG. 9 is a front view of the rotary drum.

FIG. 9 shows an arrangement of three encoder heads EN4 to EN6 when viewed in the XZ plane. The three encoder heads EN4 to EN6 are arranged at positions on the preceding side in the conveyance direction of the substrate P (on the upstream side in the conveyance direction of the substrate P) on the rotary drum DR with respect to the two encoder heads EN1 and EN2 arranged to correspond to the exposure positions (the projection areas PA1 to PA6) and at positions on the subsequent side of the approaching area IA of the substrate P (on the downstream side in the conveyance direction of the substrate P).

In the processing apparatus U3 having this configuration, an alignment mark (specific pattern) having a predetermined correlation with a pattern (pattern-formed area) is discretely or continuously formed in the length direction of the substrate P at the positions corresponding to the alignment microscopes AM (the detection probe, the pattern detecting device) of the alignment microscope groups AMG4 to AMG6 (the detection probe) on the substrate P, and the alignment mark is sequentially detected by the alignment microscope groups AMG4 to AMG6. Accordingly, error information such as the position, size, rotation, and deformation of a pattern can be measured in advance before exposing the substrate P and it is possible to form a pattern with high accuracy by correcting projection conditions in the exposure process on the basis of the error information or the like.

Each of the alignment microscope groups AMG4 to AMG6 includes four alignment microscopes AM arranged in a line in the Y-axis direction (the width direction of the substrate P), and two alignment microscopes AM on both sides of the Y-axis direction can normally detect marks formed in the vicinity of both ends of the substrate P. Two alignment microscope AM on the inner side out of four alignment microscopes AM arranged in a line in the Y-axis direction (the width direction of the substrate P) can observe and detect, for example, alignment marks formed in margins and the like between the pattern-formed areas of plurality of display panels formed along the length direction on the substrate P.

Alternatively, a specific area in which a display panel is not formed may be set at plurality of locations in the length direction of the substrate P and twelve alignment marks may be formed in the specific areas in an arrangement in which twelve alignment microscopes AM constituting three alignment microscope groups AMG4 to AMG6 can detect the alignment marks. Accordingly, it is possible to rapidly and minutely measure how a part immediately before the exposure positions (the projection areas PA1 to PA6) of the substrate P is deformed as a surface, on the basis of the relative positional relationship of the marks detected by the twelve alignment microscopes AM.

Therefore, in this embodiment, the operations and advantages described in the above-mentioned embodiments can be achieved. In addition, the encoder heads EN4 to EN6 corresponding to three lines of alignment microscope groups AMG4 to AMG6 can be arranged adjacent to each other in a circumferential portion before the exposure positions around the scale disk SD. Accordingly, by analyzing the measurement results of the encoder heads EN4 to EN6, the measurement error due to a pitch deviation in the circumferential direction of the scales or grids carved in the scale portion GP can be known in advance and the measurement results of the encoder heads EN1 and EN2 arranged to correspond to the exposure positions can be corrected using the predicted measurement error due to the pitch deviation being known in advance.

As a result, it is possible to perform a patterning process (exposure process) on the substrate P with high positioning accuracy.

Fifth Embodiment

A substrate processing apparatus according to a fifth embodiment of the invention will be described below with reference to FIG. 10. In the drawings, the same elements as in the first to fourth embodiments shown in FIGS. 1 to 9 will be given the same reference signs and a description thereof will not be repeated.

The first to fourth embodiments have described the configuration in which the scale disk SD of the encoder is fixed to the rotation shaft ST of the rotary drum DR. This embodiment employs a configuration in which the scale portion GP is directly formed in the rotary drum DR conveying the substrate P or the cylindrical mask DM.

Figure 10:
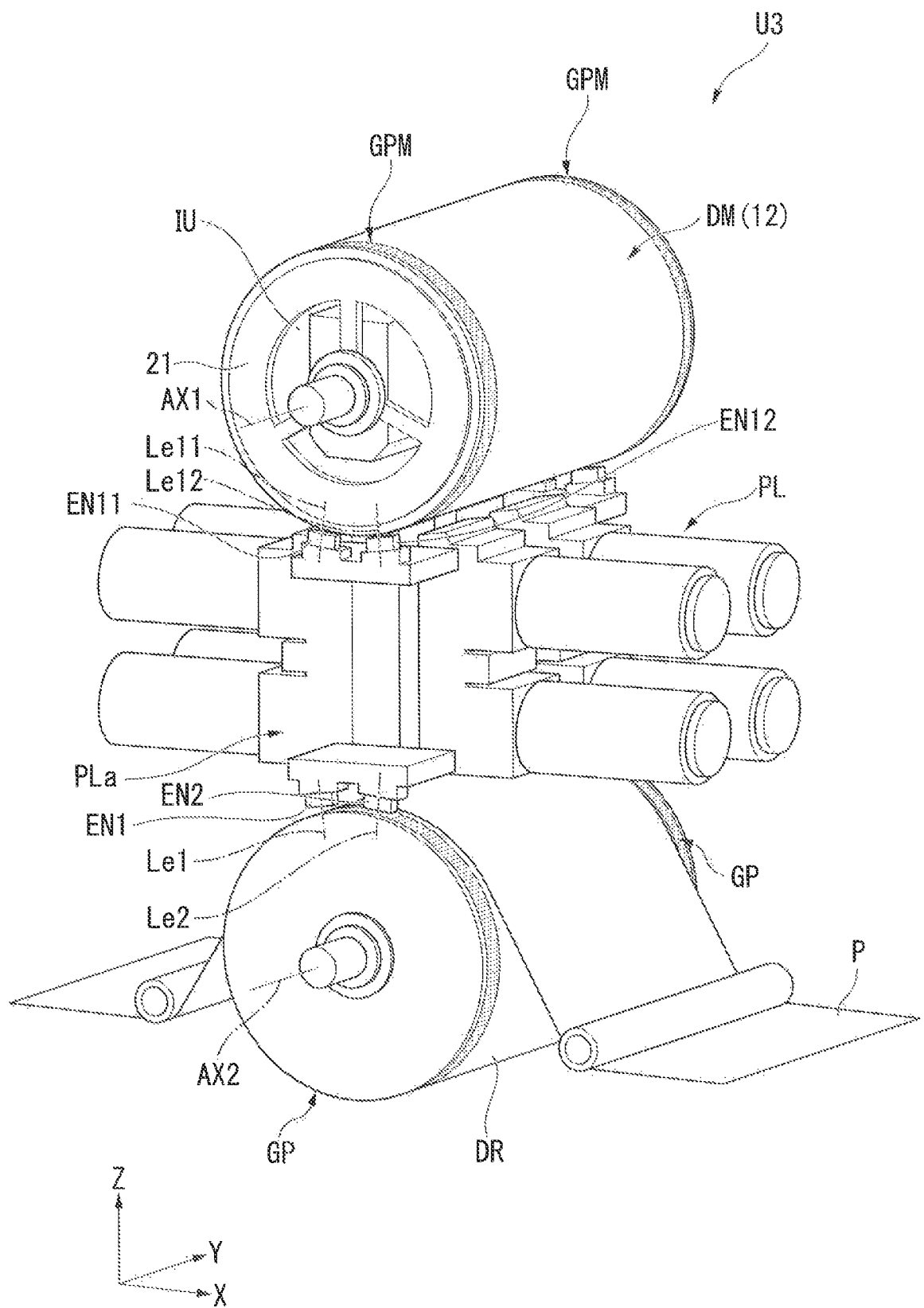
FIG. 10 is a diagram showing an entire configuration of a processing apparatus according to a fifth embodiment.

FIG. 10 is a diagram showing the entire configuration of the processing apparatus U3 shown in FIG. 1.

As shown in FIG. 10, at both ends in the direction of the rotation center line AX2 on the outer circumferential surface of the rotary drum DR also serving as a second scale member, a scale portion (the second scale portion) GP is arranged in a ring shape over the entire circumference in the circumferential direction.

The substrate P is wound around an inner portion other than the scale portion GP formed at both ends of the rotary drum DR. When a strict arrangement relationship is necessary, the outer circumferential surface of the scale portion GP and the outer circumferential surface of a portion of the substrate P wound around the rotary drum DR are set to be flush with each other (to have the same radius from the center line AX2). For this purpose, the outer circumferential surface of the scale portion GP can be set to be higher by the thickness of the substrate P in the radial direction than the outer circumferential surface of the rotary drum DR around which the substrate is wound.

In this embodiment, the encoder heads EN1 and EN2 are arranged at the positions of the installation azimuth lines Le1 and Le2 described above with reference to FIG. 5 to face the scale portions GP at both ends of the rotary drum DR and to correspond to the image-forming light beam EL2 (principal ray) from the projection areas PA to PA6 of the projection optical system PL.

The encoder heads EN1 and EN2 are fixed to a support column PLa configured to support the multi-lens type projection optical system PL mechanically stable. The support column PLa is formed of metal such as invar having a small thermal expansion coefficient with a variation in temperature and can suppress position variations of the projection modules PL1 to PL6 or a relative arrangement variation of the projection optical system PL and the encoder heads EN1 and EN2, due to the variation in temperature so as to be small.

On the other hand, in the edges of both ends in the rotation center line AX1 of the first drum member 21 supporting the cylindrical mask DM, scale portions GPM as the first scale member are disposed in a ring shape over the entire circumference in the circumferential direction around the rotation center line AX1.

The cylindrical mask DM is configured so that a mask pattern is located in the inner portion other than the scale portions GPM formed at both ends of the first drum member 21. When a strict arrangement relationship is necessary, the outer circumferential surface of the scale portion GPM and the outer circumferential surface of a pattern surface (cylindrical surface) of the cylindrical mask DM are set to be flush with each other (to have the same radius from the center line AX1).

Encoder heads EN11 and EN12 are arranged at positions facing the scale portions GPM at both ends of the first drum member 21 (the cylindrical mask DM) and at positions of the installation azimuth lines Le11 and Le12 in the same direction as the illumination direction of the illumination light beam EL1 (see FIG. 2) for illuminating the illumination areas IR of the cylindrical mask DM when viewed from the direction of the rotation center line AX1. The encoder heads EN1 and EN12 are fixed to the support column PLa supporting the projection optical system PL.

In the cylindrical mask DM, scale or grid patterns carved in the scale portion GPM can be formed on the outer circumferential surface of the first drum member 21 along with a device pattern to be transferred to the substrate P. Accordingly, the relative positional relationship between the device pattern and the scale portions GPM can be strictly set and an origin pattern indicating an origin of one turn in a part of the scale portion GPM can be accurately carved at a specific position in the circumferential direction of the device pattern.

In this embodiment, the cylindrical mask DM is exemplified to be transmissive. However, the scale portions GPM (such as the scales, the grids, and the origin patterns) can be similarly formed in a reflective cylindrical mask along with a device pattern. In general, when a reflective cylindrical mask is manufactured, a metal column member of a shaft as the first drum member 21 is machined with a high-precision lathe and a high-precision polishing machine and it is thus possible to suppress roundness or shaft displacement (eccentricity) of the outer circumferential surface thereof so as to be very small. Accordingly, it is possible to perform high-precision encoder measurement by forming the scale portions GPM in the same process step as forming the device pattern on the outer circumferential surface.

In such processing apparatus U3 having this configuration, the position in the rotating direction of the first drum member 21 (cylindrical mask DM) is measured by the encoder heads EN11 and EN12 arranged in the same installation azimuth lines Le11 and Le12 as the illumination direction of the illumination light beam EL1 traveling toward the mask pattern. Accordingly, even when the mask pattern slightly moves in the circumferential direction with respect to the field area (or the principal ray) at the object side of the projection optical system PL corresponding to the illumination areas IR1 to IR6 on the cylindrical mask DM due to a mechanical error (eccentric error, displacement) or the like of the rotation shaft of the cylindrical mask DM and thus an image projected onto the substrate P is shifted in the conveyance direction (the length direction) of the substrate P, the degree of shift can be easily estimated from the measurement results of the encoder heads EN11 and EN12.

Although not shown in FIG. 10, a plurality of alignment microscopes AM for detecting alignment marks or alignment patterns on the substrate P are also disposed in this embodiment. The mark detection positions by the alignment microscopes AM are determined as described with reference to FIG. 6 or 9 and the encoder heads EN4, EN5, and EN6 are also disposed to correspond thereto.

In this case, the plurality of alignment microscopes AM and the encoder heads EN4, EN5, and EN6 are all fixed to the support column PLa.

A plurality of alignment marks (referred to as mask-side marks) for alignment with the substrate P are formed on the outer circumferential surface of the cylindrical mask DM. The mask-side alignment microscopes for detecting the mask-side marks are fixed to the support column PLa and the encoder heads for reading the scale portion GPM in the azimuth in the XZ plane corresponding to the detection positions of the mask-side alignment microscopes are also fixed to the support column PLa.

In such a type of scanning exposure apparatus, the surface of the substrate P needs to be normally set within a depth of focus (DOF) on the image-forming surface side of the projection optical system PL. Accordingly, a plurality of focus sensors are also provided which accurately measures a variation in position (position in the radial direction from the rotation center line AX2) in the principal ray direction on the surface of the substrate P in the pun order within the projection areas PA1 to PA6 on the substrate P based on the projection modules PL1 to PL6 or positions in the vicinity thereof.

The focus sensor (such as a non-contacting height sensor) employs various methods. When a resolution of the μm order is necessary, an oblique incident light type focus sensor is used which obliquely projects a light beam to a target surface (the substrate P) and photo-electrically detects a variation in position at which the light beam reflected from the target surface is received. In this case, a light projecting unit configured to project a light beam onto the substrate P and a light receiving unit configured to receive a reflected light beam from the substrate P are required, and these units are also fixed to the support column PLa shown in FIG. 10.

Therefore, in this embodiment, the same operations and advantages as described in the above-mentioned embodiments can be achieved. In addition, since the encoder heads EN1, EN2, EN11, and EN12 corresponding to the projection areas or the encoder heads EN4, EN5, and EN6 corresponding to the alignment microscopes are fixed to the support column PLa stably supporting the projection optical system PL, the relative displacement between the encoder heads (measurement positions) and the projection optical systems PL (processing positions), that is, a so-called baseline variation, can be suppressed.

In this embodiment, the outer circumferential surface of the scale portion GPM formed in the cylindrical mask DM can be set to almost the same radius as the mask pattern-formed surface and the outer circumferential surface of the scale portion GP formed in the rotary drum DR can be set to almost the same radius as the outer circumferential surface of the substrate P. Accordingly, the encoder heads EN11 and EN12 can detect the scale portion GPM at the same positions in the radial direction as the illumination areas IR1 to IR6 on the cylindrical mask DM, and the encoder heads EN1 and EN2 can detect the scale portion GP at the same positions in the radial direction as the projection areas PA1 to PA6 on the substrate P wound around the rotary drum DR. Accordingly, it is possible to reduce the Abbe error that is caused because the measurement position and the processing position are different from each other in the radial direction of the rotary system.

The rotary drum DR and the first drum member 21 (cylindrical mask DM) are provided with the scale portions GP and GPM. Accordingly, since the circumferential length can be increased in comparison with the case where the scale disk SD is used, the resolution is improved even in the scale portion having the same pitch and it is possible to detect a position with higher accuracy.

Modification Example

The fifth embodiment and the first to fourth embodiments have described the configuration in which scales or grids for measuring a position in the rotating direction are carved on the cylindrical outer circumferential surface of the first drum member 21 constituting the cylindrical mask DM or the outer circumferential end surfaces of the scale disk SD and are measured by the encoder heads, but the invention is not limited to this configuration.

Figure 11:
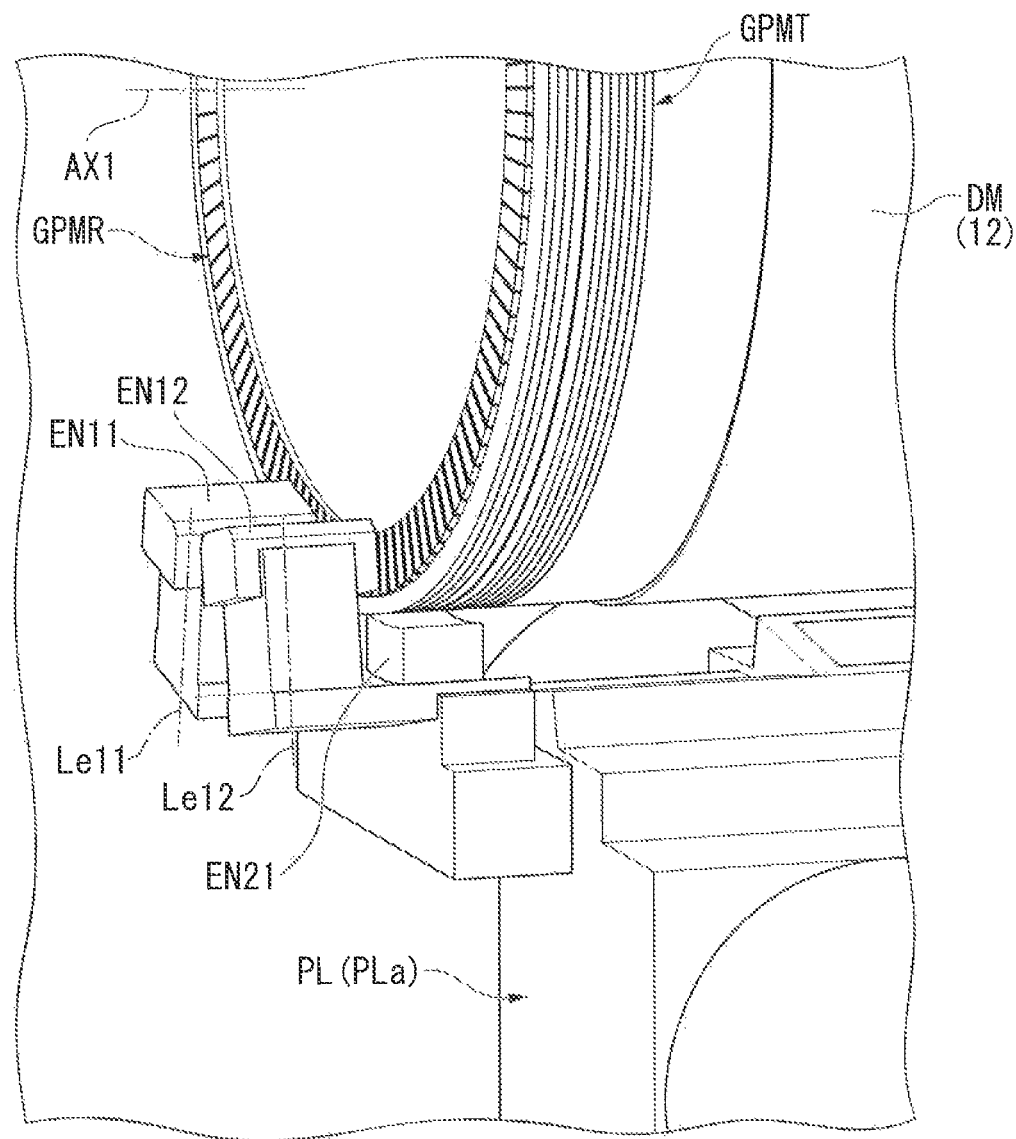
FIG. 11 is a detailed diagram showing a part of a first drum member including a scale portion.

For example, as shown in FIG. 11, a configuration in which a scale portion GPMR for measuring a variation in position in the rotating direction is formed in a ring-shape along the circumferential direction in a circumferential edge of an end surface of the first drum member 21 (the cylindrical mask DM) and a scale portion GPMT for measuring a variation in position in the direction of the rotation center line AX1 (the Y-axis direction) is formed in a ring shape along the circumferential direction in an edge of the circumferential surface having a mask pattern formed thereon may be employed.

In this case, the encoder head EN1 and EN12 can be disposed in the installation azimuth lines Le11 and Le112 facing the scale portion GPMR and extending in the same direction as the illumination direction of the illumination light beam EL1 and an encoder head EN21 (the measurement direction of which is the Y-axis direction) for reading the scale portion GPMT in a non-contacting manner can be disposed to face the scale portion GPMT. The encoder heads EN11, EN12, and EN21 are fixed to the support column PLa supporting the projection optical system PL.

By employing this configuration, it is possible to measure a variation in position in the direction of the rotation center line AX1 (the Y-axis direction) in addition to the variation in position in the rotating direction of the cylindrical mask DM.

Here, the scale portions GPMR and the GPMT and the encoder heads EN11, EN12, and EN21 shown in FIG. 11 are also similarly disposed at the opposite end of the first drum member 21.

In this way, when the scale portions GPMR and GPMT are formed at both ends of the first drum member 21 constituting the cylindrical mask DM, it is also possible to accurately measure slight torsion of the cylindrical mask DM around the center line AX1 or slight expansion or contraction in the direction of the center line AX1 in real time and it is thus possible to accurately detect image deformation (such as a projection magnification error in the Y-axis direction) or a minute rotation error of the mask pattern projected onto the substrate P.

In the same way as disposing the scale portion GPMR for determining the position in the rotating direction on the end surface side of the first drum member 21 constituting the cylindrical mask DM, a scale portion for determining the position in the rotating direction may be disposed at the end surface side (the surface side parallel to the XY plane) of the rotary drum DR on which the substrate P is wound. Similarly to the scale portion GPMT shown in FIG. 11, a scale portion for determining the position in the direction in which the rotation center line AX2 extends may be formed on the outer circumferential surface in the vicinity of both ends in the direction of the center line AX2 of the rotary drum DR.

Sixth Embodiment

A substrate processing apparatus according to a sixth embodiment of the invention will be described below with reference to FIG. 12. In the drawing, the same elements as in the fifth embodiment shown in FIGS. 10 and 11 will be given the same reference signs and a description thereof will not be repeated.

In this embodiment, a speed measuring device for measuring information on the relative rotational speed of the first drum member 21 (cylindrical mask DM) and the rotary drum DR (substrate P) is provided in addition to the encoder heads EN1, EN2, EN11, and EN12 for measuring a position in the rotating direction.

Figure 12:
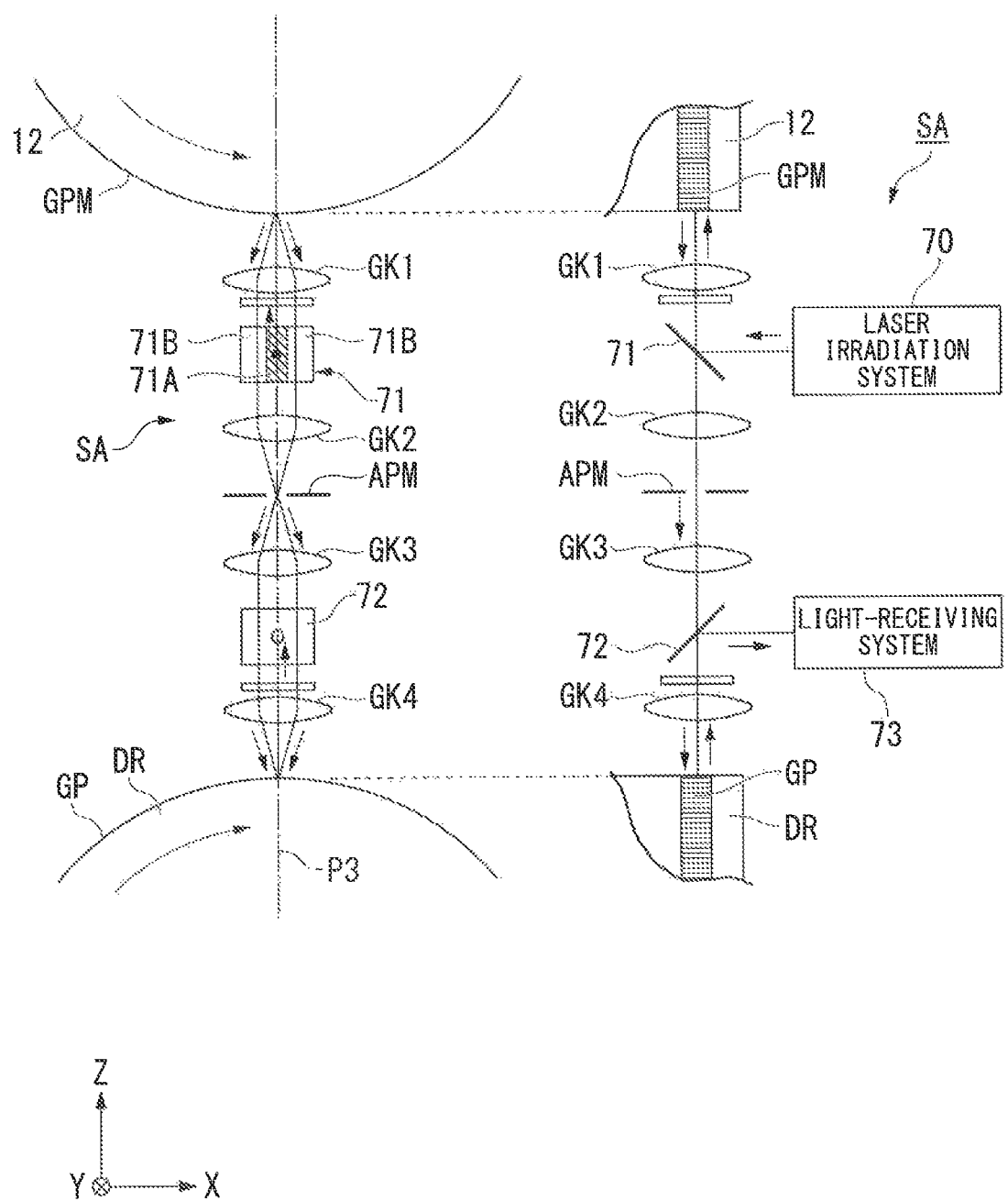
FIG. 12 is a diagram schematically showing a configuration of a speed measuring device.

FIG. 12 is a diagram schematically showing the configuration of a speed measuring device SA which is disposed between the first drum member 21 and the rotary drum DR.

In the speed measuring device SA, an optical member (optical splitter) 71 including a light-reflecting portion 71A at the center in the X-axis direction (the arrangement direction of the scale portions GPM and GP) and light-transmitting portions 71B on both sides of the light-reflecting portion 71A is disposed to face a laser irradiation system 70. A laser beam emitted from the laser irradiation system 70 is reflected by the reflection surface of the optical member 71 and is projected to the scale portion GPM of the first drum member 21 via a lens GK1.

By causing a laser beam to be incident on the rotating scale portion GPM, a Doppler-shifted diffracted beam (±first-order reflected and diffracted beam) and a zeroth reflected beam are formed and are made incident on the lens GK1. The zeroth reflected beam (a first diffracted beam or a second diffracted beam) is reflected to the laser irradiation system 70 by the light-reflecting portion 71A of the optical member 71, but the ±first-order reflected and diffracted beam (a first diffracted beam or a second diffracted beam) transmits the light-transmitting portions 71B of the optical member 71 and reaches a lens GK2 and a field diaphragm APM.

The optical member 71 is disposed in a pupil space of an image-forming system constituted by the lenses GK1 and GK2. The field diaphragm APM is disposed at a position (image-plane position) optically conjugate to the scale portion GPM in the image-forming system constituted by the lenses GK1 and GK2. Accordingly, an image (a diffraction image moving or an interference fringe flowing according to the scales) of the scale portion GPM based on the ±first-order reflected and diffracted beam is formed at the position of the field diaphragm APM.

The ±first-order reflected and diffracted beam which transmitted the field diaphragm AMP and made incident on a lens GK3 transmits a beam splitter (or a polarizing beam splitter) 72 and is projected to the scale portion GP on the rotary drum DR via a lens GK4. When the ±first-order reflected and diffracted beam is projected to the scale portion GP, ±first-order re-diffracted beams having each of the diffracted beam as a zeroth beam are generated in the same direction, respectively, become interference beams interfering with each other, and are returned to the lens GK4 and the beam splitter 72, and the re-diffracted beams (interference beams) reflected by the beam splitter 72 are received by a light-receiving system 73.

In the above-mentioned configuration, the image-forming system constituted by the lenses GK3 and GK4 re-forms a diffraction image formed at the position of the field diaphragm APM on the scale portion GP at the rotary drum DR side, and the beam splitter 72 is disposed in a pupil space of the image-forming system constituted by the lenses GK3 and GK4.

In the above-mentioned configuration, for example, when the scale pitch of the scale portion GPM and the scale pitch of the scale portion GP are equal to each other, a photoelectric signal received by the light-receiving system 72 is a signal with constant intensity when a difference is present between the circumferential speed of the scale portion GPM (the first drum member 21) and the circumferential speed of the scale portion GP (the rotary drum DR), but a photoelectric signal modulated with the frequency corresponding to the difference in the circumferential speed is output when a difference is not present between the circumferential speed of the scale portion GPM and the circumferential speed of the scale portion GP. Therefore, by analyzing a waveform variation of the photoelectric signal output from the light-receiving system 72, it is possible to measure the speed difference between the scale portion GPM and the scale portion GP, that is, the relative speed difference between the mask pattern of the cylindrical mask DM and the substrate P wound around the rotary drum DR.

(Device Manufacturing Method)

Figure 13:
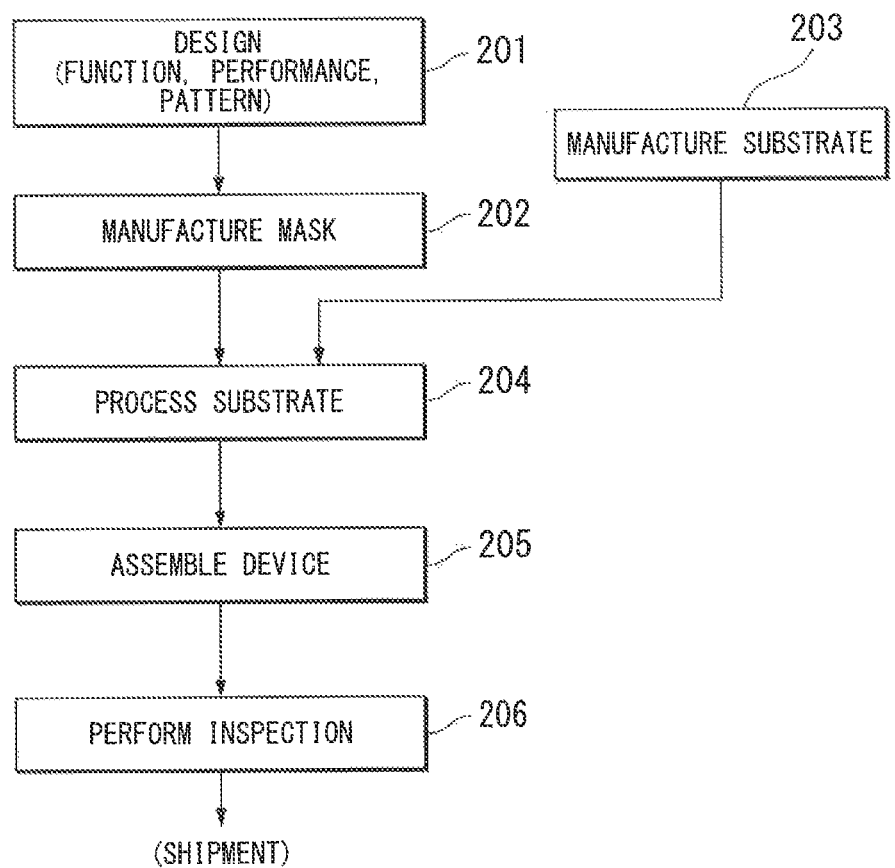
FIG. 13 is a flowchart showing a device manufacturing method according to an embodiment.

A device manufacturing method will be described below. FIG. 13 is a flowchart showing the device manufacturing method according to this embodiment.

In the device manufacturing method shown in FIG. 13, first, functions and performance of a device such as an organic EL display panel are designed (step 201). Subsequently, a cylindrical mask DM is manufactured on the basis of the design of the device (step S202). A substrate such as a transparent film or sheet or an ultrathin metal foil as a base material of the device is prepared by purchase, manufacturing, or the like (step 203).

Subsequently, the prepared substrate is input to a roll type or patch type manufacturing line, and TFT backplane layers such as electrodes, interconnections, insulating films, and semiconductor films or an organic EL light-emitting layer as a pixel portion, which constitute the device, are formed on the substrate (step 204). Step 204 typically includes a step of forming a resist pattern on a film of the substrate and a step of etching the film using the resist pattern as a mask. The forming of the resist pattern includes a step of uniformly forming the resist film on the surface of the substrate, a step of exposing the resist film on the substrate with an exposing light patterned by the cylindrical mask DM depending on the above-mentioned embodiments, and a step of developing the resist film having a latent image of the mask pattern formed thereon by exposure.

In manufacturing a flexible device using a printing technique or the like, a step of forming a functional photosensitive layer (such as a photosensitive silane coupling material) on the surface of the substrate using a coating method, a step of irradiating the functional photosensitive layer with a patterned exposing light via the cylindrical mask DM to form a hydrophilic portion and a hydrophobic portion in the functional photosensitive layer depending on the pattern shape on the basis of the above-mentioned embodiments, a step of coating a highly-hydrophilic portion of the functional photosensitive layer with a plating base liquid and forming a metal pattern (such as an electrode layer and an interconnection layer of a TFT) by electroless plating, and the like are performed by the manufacturing line shown in FIG. 1.

Subsequently, depending on the device to be manufactured, a step of dicing or cutting the substrate or bonding and mixing another substrate manufactured in another step, for example, a sheet-like color filter or a thin glass substrate having a sealing function thereto and therewith is performed and devices are assembled (step 205). Then, the devices are subjected to a post process such as inspection (step S206). In this way, a device can be manufactured.

While the exemplary embodiments of the invention have been described with reference to the accompanying drawings, the invention is not limited to the embodiments. The shapes or combinations of the constituent members described in the above-mentioned embodiments are only examples and can be modified in various forms depending on design request or the like without departing from the gist of the invention.

In the above-mentioned embodiments, for example, as shown in FIGS. 5, 6, and 9 and the like, the configuration has been described in which the encoder heads EN1 and EN2 are disposed at the positions of the installation azimuth lines Le1 and Le2 and the like inclined in the same direction as the incidence direction of the image-forming light beam EL2 as the specific positions at which the projection process (the exposure process) or the like is performed on the substrate P.

Figure 14:
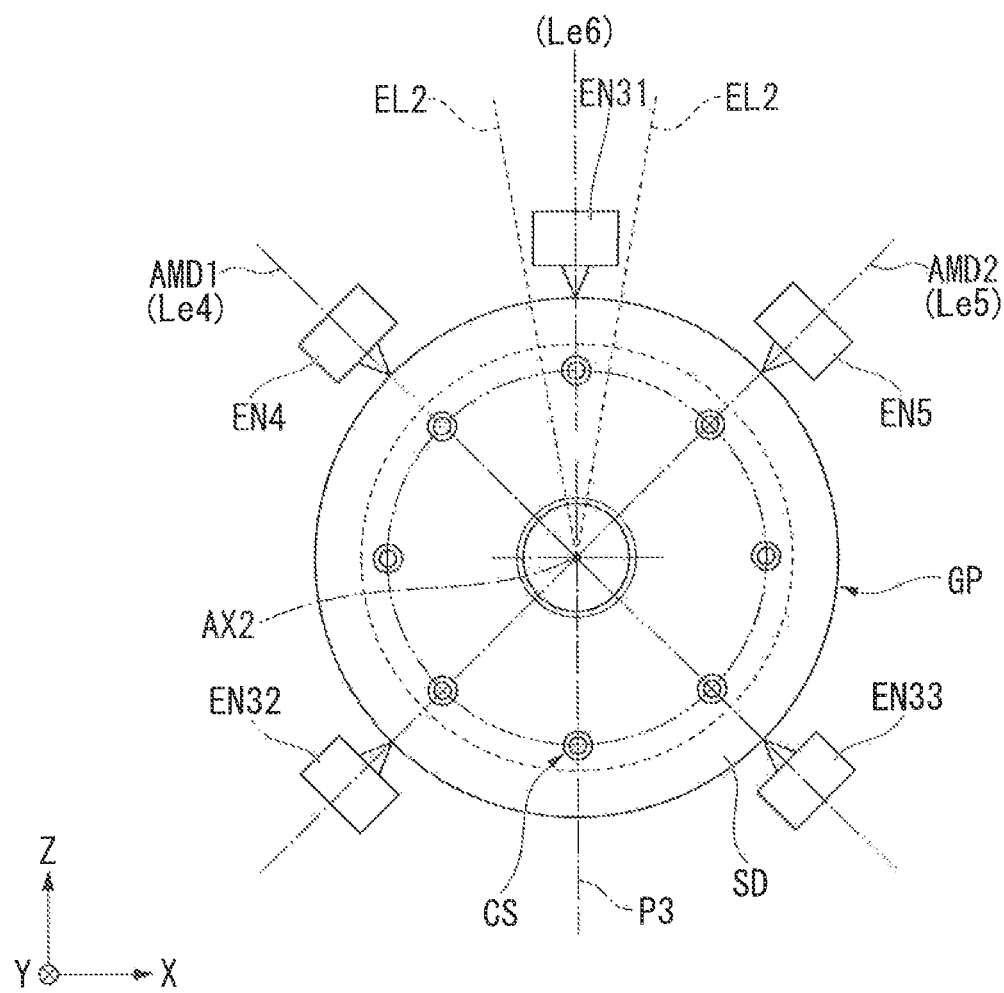
FIG. 14 is a diagram showing a reading mechanism according to another embodiment.

However, as shown in FIG. 14, when the inclination angle of the image-forming light beam EL2 based on the odd-numbered projection modules PL1, PL3, and PL5 about the center plane P3 and the inclination angle of the image-forming light beam EL2 based on the even-numbered projection modules PL2, PL4, and PL6 about the center plane P3 are both small, a single encoder head EN31 may be disposed at the position (in the installation azimuth line Le6) of the center plane P3 between the two image-forming light beams EL2.

In this way, when the single encoder head EN31 is disposed at the intermediate position between the two projection areas (the image-forming light beams EL2) when viewed in the XZ plane, for example, as shown in the drawing, encoder heads EN32 and EN33 are disposed at two positions symmetric about the center plane P3 and on the opposite side of the rotation center line AX2 to the encoder head EN31 and information of the rotational position of the scale portion GP measured by the three encoder heads EN31 to EN33 can be used to detect the variation in position in the circumferential direction of the rotary drum DR with higher accuracy.

Particularly, when the three encoder heads EN31, EN32, and EN33 are disposed at intervals of 120° around the scale portion GP, it is possible to simply calculate the eccentric error or the like of the scale portion GP (the rotary drum DR and the like).

When this configuration is employed, the encoder heads EN4 and EN5 are disposed at the positions of the installation azimuth lines Le4 and Le5 extending in the same azimuths as the observation center lines AMD1 and AMD2 in which the alignment microscopes AM1 and AM2 are disposed, as described in the second embodiment. Accordingly, the encoder heads EN32 and EN33 can be disposed in the extensions of the installation azimuth lines Le4 and Le5. That is, the encoder head EN33 can be installed at a position point-symmetric with the encoder head EN4 about the rotary center line AX2 and the encoder head EN32 can be installed at a position point-symmetric with the encoder head EN5 about the rotary center line AX2.

In the condition shown in FIG. 14, when total five encoder heads are disposed around the scale disk SD, it is possible to detect the eccentric error, the shaft shift, the scale deformation, the pitch error, and the like of the scale disk SD on the basis of the measurement signals from the encoder heads EN4, EN5, and EN31 to EN33 and to correct the eccentric error and the like with high accuracy.

This advantage can also be achieved, as shown in FIG. 10, when the scale portion GPM is directly formed in the first drum member 21 constituting the cylindrical mask DM and when the scale portion GP is directly formed in the rotary drum DR.

Figure 15:
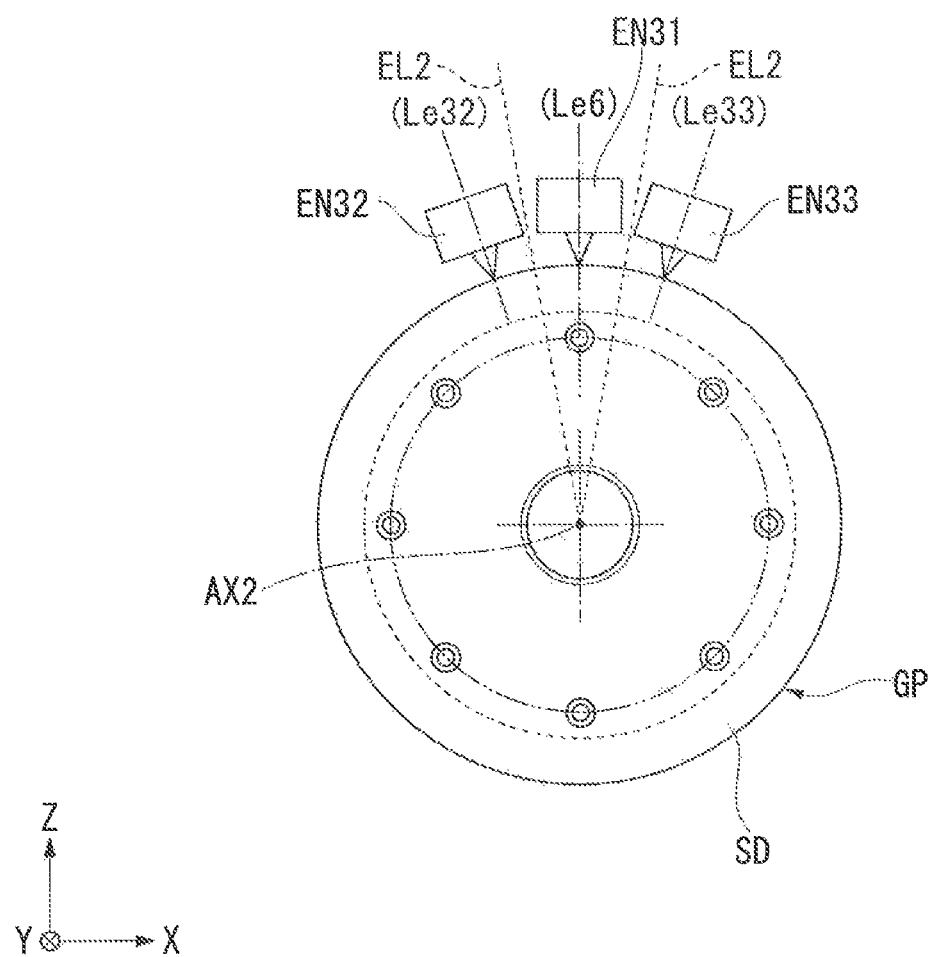
FIG. 15 is a diagram showing a reading mechanism according to another embodiment.

For example, as shown in FIG. 15, when the encoder head EN31 can be disposed at the position of the installation azimuth line Le6 like in FIG. 14, the encoder head EN32 may be disposed at the position of the installation azimuth line Le32 inclined by an angle symmetric with the installation azimuth line Le6 with respect to the line in which the image-forming light beam EL2 from the odd-numbered projection modules PL1, PL3, and PL5 travels toward the center line AX2, and the encoder head EN33 may be disposed at the position of the installation azimuth line Le33 inclined by an angle symmetric with the installation azimuth line Le6 with respect to the line in which the image-forming light beam EL2 from the even-numbered projection modules PL2, PL4, and PL6 travels toward the center line AX2.

In this arrangement, an average angle position of the reading result by the encoder head EN31 and the reading result by the encoder head EN32 may be set to correspond to the projection areas PA of the odd-numbered projection modules PL1, PL3, and PL5, and an average angle position of the reading result by the encoder head EN31 and the reading result by the encoder head EN33 may be set to correspond to the projection areas PA of the even-numbered projection modules PL2, PL4, and PL6.

Figure 16:
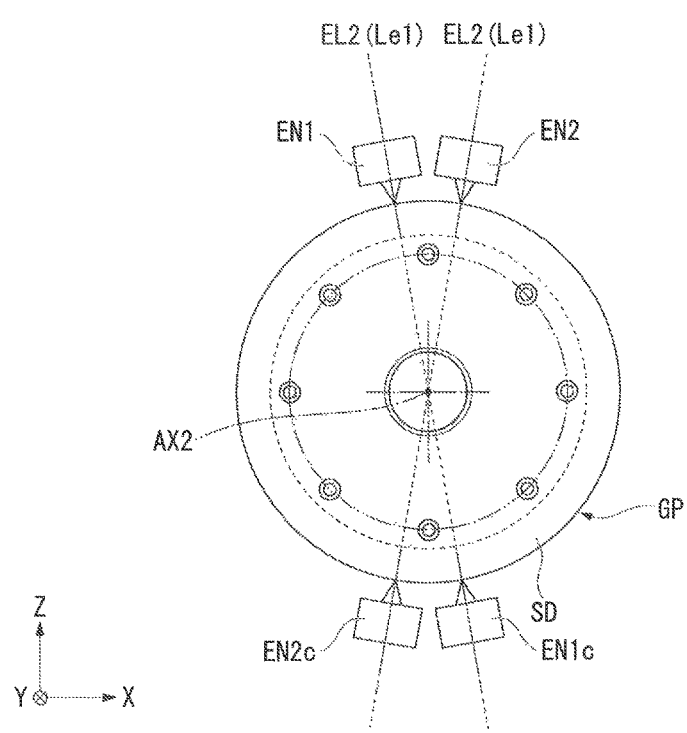
FIG. 16 is a diagram showing a reading mechanism according to another embodiment.

When the encoder heads EN1 and EN2 having the same direction as the incidence direction of the image-forming light beam EL2 as the reading direction are arranged, for example, as shown in FIG. 16, an encoder head EN1c may be disposed on the diagonally-opposite side of the encoder head EN1 and an encoder head EN2c may be disposed on the diagonally-opposite side of the encoder head EN2.

In this case, from the reading result of the scale portion GP by the encoder head EN1, it is difficult to distinguishably understand whether the rotary drum DR (the scale disk SD) has rotated about the rotary center line AX2 or has shifted in the X-axis direction. However, the distinguishable understanding can be accurately performed by comparison with the reading result of the scale portion GP by the encoder head EN1c located at the diagonally-opposite position (180°). Similarly, the degree of shift in the X-axis direction and the degree of rotation (the variation in angle position) can also be accurately distinguishably calculated by comparing the reading results by the encoder head EN2 and the encoder head EN2c located on the diagonally-opposite side with each other.

The arrangement methods of the encoder heads shown in FIGS. 14 to 16 can be similarly applied to an encoder system in which the scale portions GP and GPM are disposed on the outer circumferential surface of the rotary drum DR conveying the substrate P or the cylindrical mask DM as shown in FIGS. 10 and 11.

The above-mentioned embodiments are exemplary examples of the exposure apparatus that projects a pattern beam from the cylindrical mask DM to the substrate P supported in a cylindrical shape by the rotary drum DR. However, in an apparatus having a configuration in which any one of the mask pattern and the substrate P is conveyed by a rotation system, the encoder systems described in the above-mentioned embodiments can be similarly applied to the rotation system.

Examples of such an apparatus include an optical drawing apparatus (an example of which will be described later) that scans a substrate P on a rotary drum in the width (short-side) direction of the substrate P with a laser spot beam at high speed while conveying the substrate P supported by the rotary drum in the length direction of the substrate P and draws a pattern of interconnections or circuits formed by a CAD or the like, a maskless exposure apparatus that modulates a plurality of micro mirrors such as a DMD or an SLM and gives a contrast distribution (pattern beam) to a light beam projected to a predetermined area on the substrate P, a printing apparatus that draws a desired pattern with liquid droplets from an ink jet heads arranged in the width (short-side) direction of a substrate P while conveying the substrate P supported by a rotary drum in the length direction, a processing apparatus that irradiates a substrate P supported by a rotary drum with an energy beam (such as an electron beam and a laser beam) to process (such as baking, annealing, reforming, and punching) a specific area of the surface of the substrate P, and an inspection apparatus that observes a pattern on a substrate P supported by a rotary drum with an observation system (detection probe) such as a fluorescent microscope or a phase difference microscope and that detects a pattern defect or the like.

In these apparatus, the installation azimuth lines Le1 and Le2 and the like of the encoder heads may be set in accordance with the positions in the circumferential direction of the rotary drum when the spot beam of the optical drawing apparatus, the projection light beam of the maskless exposure apparatus, the droplets ejected from the heads of the printing apparatus, the energy beam of the processing apparatus, and the observation area of the inspection apparatus are set on the substrate.

Seventh Embodiment

Hereinafter, another embodiment of the invention will be described with reference to the accompanying drawings. Here, the invention is not limited to the embodiment. The following embodiment is an exemplary example of an exposure apparatus using a so-called roll-to-roll type of which continuously performs various processes against the substrate in order to manufacture one device on a substrate P.

In the below description, an XYZ orthogonal coordinate system is set up and positional relationships of respective elements will be described with reference to the XYZ orthogonal coordinate system. For example, a predetermined direction in a horizontal plane is defined as an X-axis direction, a direction perpendicular to the X-axis direction in the horizontal plane is defined as a Y-axis direction, and the direction (that is, the vertical direction) perpendicular to the X-axis direction and the Y-axis direction is defined as a Z-axis direction.

Figure 17:
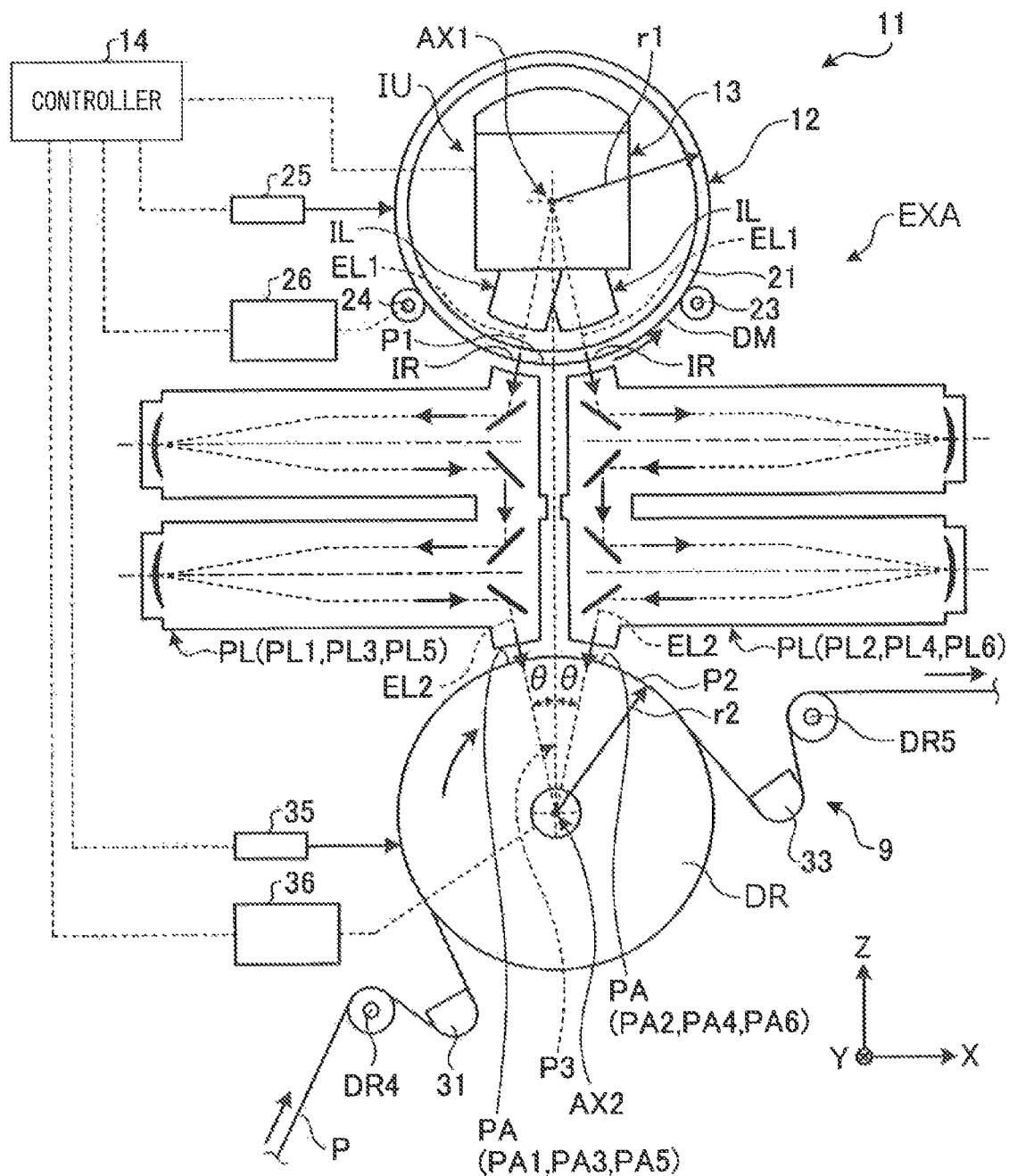
FIG. 17 is a diagram schematically showing an entire configuration of a processing apparatus (exposure apparatus) according to a seventh embodiment.
Figure 18:
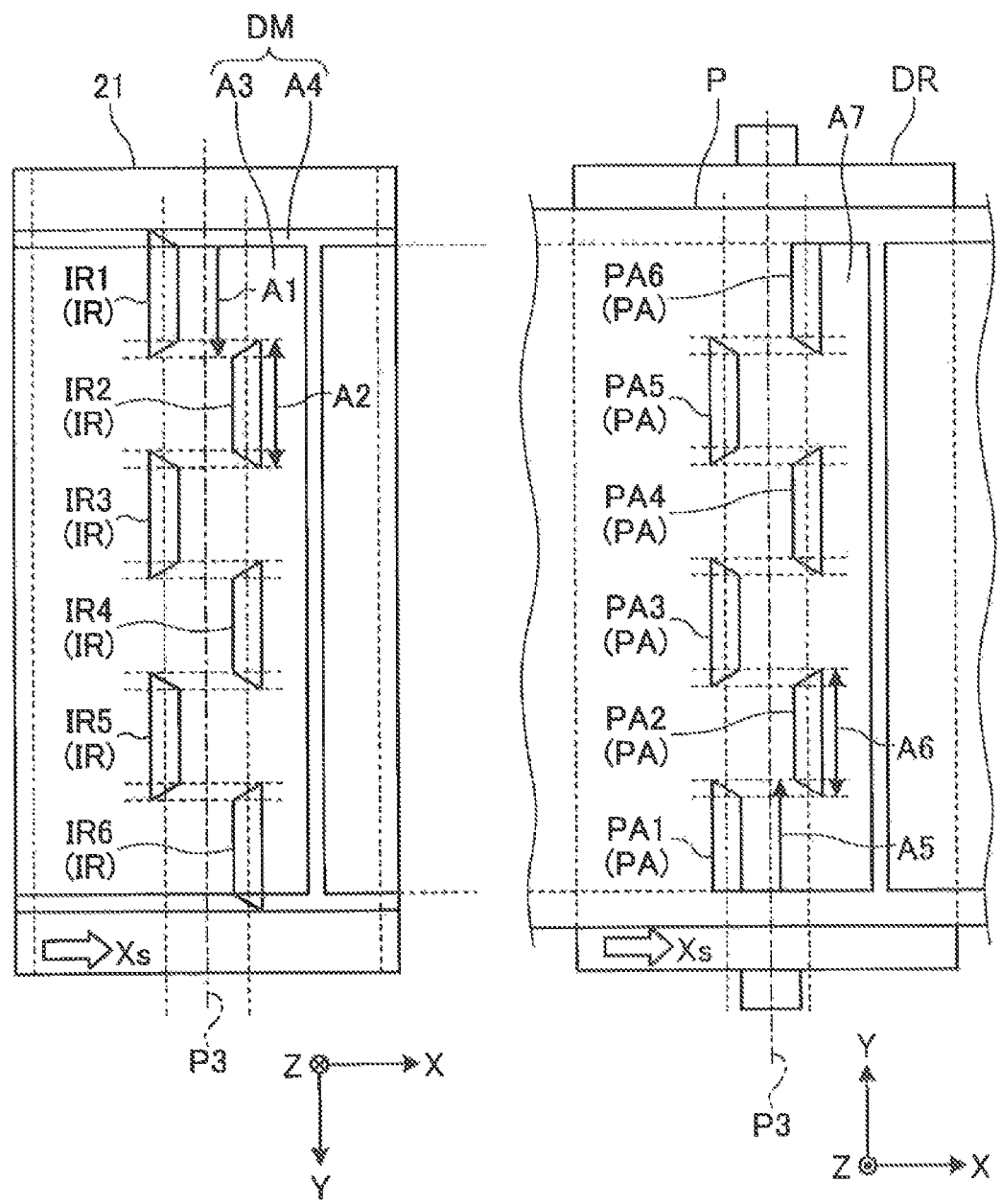
FIG. 18 is a diagram schematically showing an arrangement of illumination areas and projection areas in FIG. 17.
Figure 19:
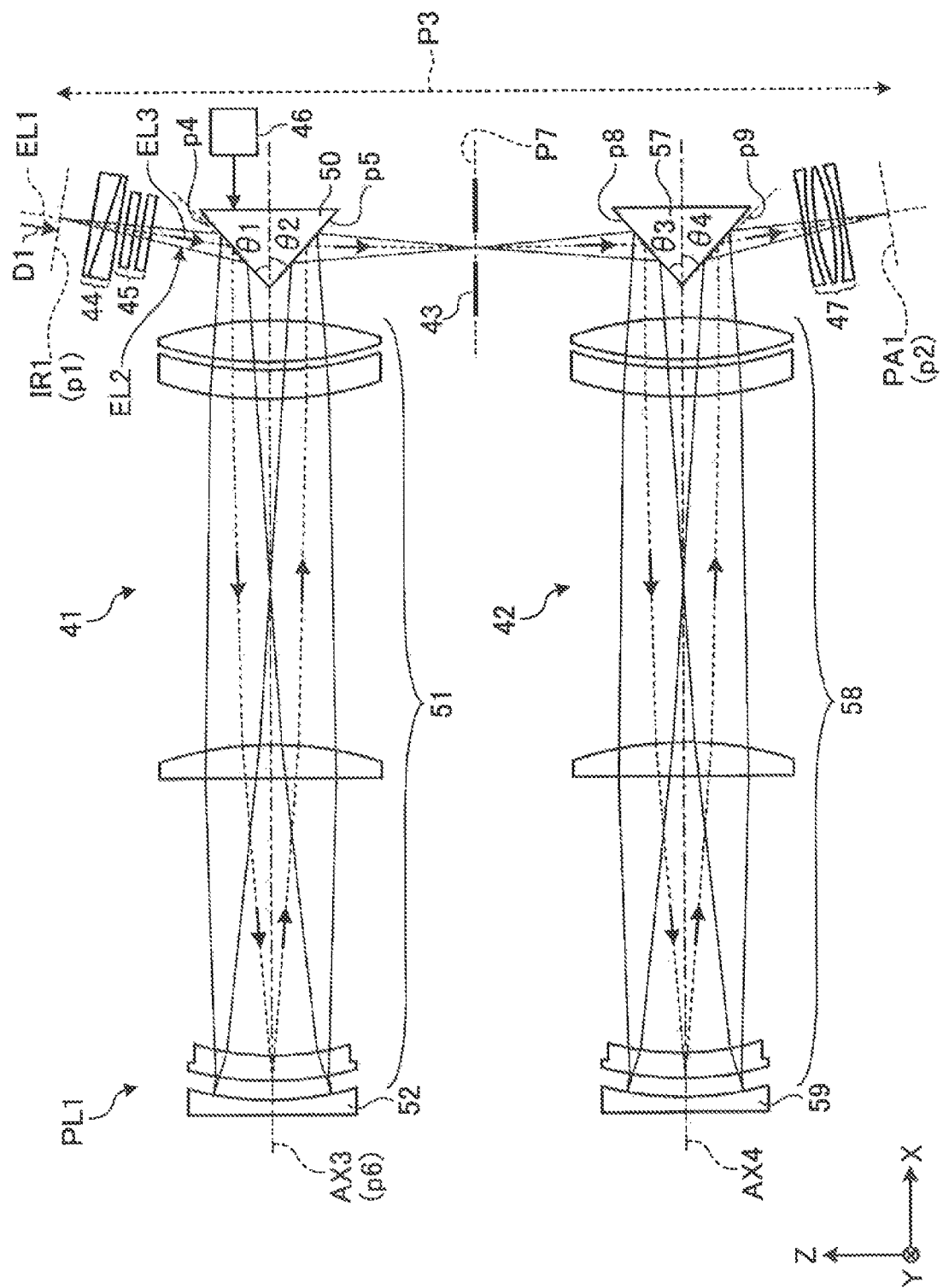
FIG. 19 is a diagram schematically showing a configuration of a projection optical system applied to the processing apparatus (exposure apparatus) shown in FIG. 17.

The configuration of the exposure apparatus according to this embodiment will be described below with reference to FIGS. 17 to 19. FIG. 17 is a diagram schematically showing the entire configuration of a processing apparatus (exposure apparatus) according to the seventh embodiment. FIG. 18 is a diagram schematically showing an arrangement of illumination areas and projection areas in FIG. 17. FIG. 19 is a diagram schematically showing the configuration of a projection optical system applied to the processing apparatus (exposure apparatus) shown in FIG. 17.

As shown in FIG. 17, the processing apparatus 11 includes an exposure apparatus (processing mechanism) EXA and a conveying device 9. The conveying device 9 feeds a substrate P (such as a sheet, a film, or a sheet substrate) to the exposure apparatus EXA. For example, a device manufacturing system is assumed in which a flexible substrate P drawn out form a feed roll not shown sequentially passes through n processing apparatuses, is processed by the processing apparatus 11, and is sent to another processing apparatus by the conveying device 9, and the substrate P is wound around a collection roll. In this way, the processing apparatus 11 may be constituted as a part of a device manufacturing system (flexible display manufacturing line).

The exposure apparatus EXA is a so-called scanning exposure apparatus and projects (transfers) an image of a pattern formed on the cylindrical mask DM onto the substrate P through a projection optical system PL (PL1 to PL6) with an equal projection magnification (×1) while synchronizing the feeding of the substrate P (conveyance of the substrate P) with the rotation of the cylindrical mask DM.

In the exposure apparatus EXA shown in FIG. 17, the Y-axis of the XYZ orthogonal coordinate system is set to be parallel to the rotation center line AX1 of the first drum member 21. Similarly, in the exposure apparatus EXA, the Y-axis of the XYZ orthogonal coordinate system is set to be parallel to the rotation axis line AX2 of the rotary drum DR (second drum member).

As shown in FIG. 17, the exposure apparatus EXA includes a mask supporting device 12, an illumination mechanism IU (transfer processing part), a projection optical system PL (transfer processing part), and a controller 14. The exposure apparatus EXA rotationally moves the cylindrical mask DM supported by the mask supporting device 12 and conveys the substrate P through the use of the conveying device 9. The illumination mechanism IU illuminates a part of the (illumination area IR) of the cylindrical mask DM supported by the mask supporting device 12 with an illumination light beam EL1 with uniform brightness. The projection optical system PL projects (transfers) an image of a pattern in the illumination area IR on the cylindrical mask DM onto a part (projection area PA) of the substrate P conveyed by the conveying device 9. The position on the cylindrical mask DM at which the illumination area IR is located is changed with the movement of the cylindrical mask DM. A position on the substrate P which is located at the projection area PA is changed in accordance with the movement of the substrate P. Accordingly, an image of a predetermined pattern (mask pattern) on the cylindrical mask DM is projected onto the substrate P. The controller 14 controls each parts of the exposure apparatus EXA so as to cause the each parts to perform processes. In this embodiment, the controller 14 controls the conveying device 9.

The controller 14 may be a part or the whole part of the upper-level controller collectively controlling plurality of processing apparatuses of the device manufacturing system. The controller 14 may be a device which is controlled by the upper-level controller and which is other than the upper-level controller. The controller 14 includes, for example, a computer system. The computer system includes, for example, a CPU, various memories, an OS, and hardware such as peripherals. The operations of the each parts of the processing apparatus 11 are stored in the form of a program in a computer-readable recording medium, and various processes are performed by causing the computer system to read and execute the program. The computer system includes a homepage providing environment (or a display environment) when it can access the Internet or an intranet system. Examples of the computer-readable recording medium include portable mediums such as a flexible disk, a magneto-optical disk, a ROM, and a CD-ROM and a storage device such as a hard disk built in a computer system. The computer-readable recording medium may include a medium that dynamically holds a program for a short time, like a communication line when the program is transmitted via a network such as the Internet or a communication circuit such as a telephone line, and a medium that holds a program for a predetermined time, like a volatile memory in a computer system serving as a server or a client in that case. The program may be configured to realize a part of the above-mentioned functions of the processing apparatus 11 or may be configured to realize the above-mentioned functions of the processing apparatus 11 by combination with a program recorded in advance in a computer system. The upper-level controller can be embodied using a computer system, similarly to the controller 14.

As shown in FIG. 17, the mask supporting device 12 includes a first drum member 21 supporting the cylindrical mask DM, a guide roller 23 supporting the first drum member 21, a driving roller 24 that is used to drive the first drum member 21 by the first driving part 26 in response to a control command of the controller 14, and a first detector 25 detecting the position of the first drum member 21.

The first drum member 21 is a cylindrical member having a curved surface curved with a constant radius from a rotation center line AX1 (hereinafter, referred to as first center line AX1) serving as a predetermined axis and rotates around the predetermined axis. The first drum member 21 forms a first surface P1 on which the illumination area IR is located on the cylindrical mask DM. In this embodiment, the first surface P1 includes a surface (hereinafter, referred to as cylindrical surface) which is obtained by rotating a segment (generating line) about an axis (first center line AX1) parallel to the segment. The cylindrical surface is, for example, an outer circumferential surface of a cylinder or an outer circumferential surface of a column. The first drum member 21 is formed of, for example, glass or quartz and has a cylindrical shape with a constant thickness, and the outer circumferential surface (cylindrical surface) thereof forms the first surface P1.

That is, in this embodiment, the illumination area IR on the cylindrical mask DM is curved in a cylindrical surface shape having a constant radius r1 from the rotation center line AX1. In this way, the first drum member 21 includes a curved surface curved with a constant radius from the rotation center line AX1 as a predetermined axis. The first drum member 21 can be driven by the driving roller 24 to rotate about the rotation axis line AX1 as the predetermined axis.

The cylindrical mask DM is formed as a transmissive planar sheet mask in which a pattern is formed as a light-shielding layer of chromium or the like, for example, on one surface of a strip-shaped ultrathin glass plate with good flatness (for example, with a thickness of 100 μm to 500 μm).

The mask supporting device 12 curves the cylindrical mask DM along the curved surface of the outer circumferential surface of the first drum member 21, and the cylindrical mask is used in a state where the cylindrical mask is wound around (attached to) the curved surface. The cylindrical mask DM has a non-pattern-formed area in which no pattern is formed and is attached to the first drum member 21 in the non-pattern-formed area. The cylindrical mask DM can be released from the first drum member 21.

Instead of forming the cylindrical mask DM out of an ultrathin glass plate and winding the cylindrical mask DM around the first drum member 21 formed of a transparent cylindrical base material, a mask pattern may be directly drawn and formed on the outer circumferential surface of the first drum member 21 formed of a transparent cylindrical base material by using a light-shielding layer of chromium or the like, thereby forming the mask pattern integrally with the outer circumferential surface. In this case, the first drum member 21 serves as a supporting member of the pattern of the cylindrical mask DM.

The first detector 25 optically detects the rotational position of the first drum member 21 and is constituted, for example, by a rotary encoder. The first detector 25 outputs information indicating the detected rotational position of the first drum member 21, for example, a two-phase signal or the like from the encoder head (encoder head part) to be described later, to the controller 14.

The first driving part 26 including an actuator such as an electric motor adjusts a torque for rotating the driving roller 24 and a rotation speed in response to a control signal input from the controller 14. The controller 14 controls the rotational position of the first drum member 21 by controlling the first driving part 26 on the basis of the detection result from the first detector 25. The controller 14 controls one or both of the rotational position and the rotation speed of the cylindrical mask DM supported by the first drum member 21.

The conveying device 9 includes a driving roller DR4, a first guiding member 31, a rotary drum DR forming a second surface P2 on which the projection area PA on the substrate P is located, a second guiding member 33, driving rollers DR4 and DR5, a second detector 35, and a second driving part 36.

In this embodiment, the substrate P conveyed to the driving roller DR4 from the upstream side of the conveying path is conveyed to the first guiding member 31 via the driving roller DR4. The substrate P passing through the first guiding member 31 is supported by the surface of a cylindrical or columnar rotary drum DR with a radius of r2 and is conveyed to the second guiding member 33. The substrate P passing through the second guiding member 33 is conveyed to the downstream side of the conveying path. The rotation center line AX2 of the rotary drum DR and the rotation center lines of the driving rollers DR4 and DR5 are set to be parallel with the Y-axis.

The first guiding member 31 and the second guiding member 33 adjust a tension or the like acting on the substrate P in the conveying path, for example, by moving in the conveyance direction of the substrate P. The first guiding member 31 (and the driving roller DR4) and the second guiding member 33 (and the driving roller DR5) are configured, for example, to be movable in the width direction (the Y-axis direction) of the substrate P and thus can adjust the position in the Y-axis direction of the substrate P wound around the outer circumferential surface of the rotary drum DR and the like. The conveying device 9 only has to convey the substrate P along the projection area PA of the projection optical system PL and the configuration of the conveying device 9 can be appropriately changed.

The rotary drum DR is a cylindrical member having a curved surface curved with a constant radius from a rotation axis line AX2 (hereinafter, referred to as second center line AX2) serving as a predetermined axis and is a rotary drum rotating around the predetermined axis. The rotary drum DR forms the second surface (supporting surface) P2 supporting a part of the projection area PA on the substrate P onto which an image-forming light beam from the projection optical system PL is projected in a circular arc shape (cylindrical shape).

In this embodiment, the rotary drum DR is a part of the conveying device 9 and also serves as a supporting member (substrate stage) supporting the substrate P as an object to be exposed. That is, the rotary drum DR may be a part of the exposure apparatus EXA. In this way, the rotary drum DR is rotatable about the rotation center line AX2 (hereinafter, referred to as second center line AX2), the substrate P is curved in a cylindrical surface shape along the outer circumferential surface (cylindrical surface) on the rotary drum DR, and the projection area PA is located in a part of the curved portion.

In this embodiment, the rotary drum DR rotates with a torque supplied from the second driving part 36 including an actuator such as an electric motor.

The second detector 35 is constituted, for example, by a rotary encoder and optically detects the rotational position of the rotary drum DR. The second detector 35 outputs information (for example, a two-phase signal from the encoder heads EN1, EN2, EN3, EN4, and EN5 to be described later) indicating the detected rotational position of the rotary drum DR to the controller 14. The second driving part 36 adjusts the torque for rotating the rotary drum DR in response to a control signal supplied from the controller 14.

The controller 14 controls the rotational position of the rotary drum DR by controlling the second driving part 36 on the basis of the detection result from the second detector 35, and synchronously moves (synchronously rotates) the first drum member 21 (the cylindrical mask DM) and the rotary drum DR. A detailed configuration of the second detector 35 will be described later.

The exposure apparatus EXA of this embodiment is an exposure apparatus on which a so-called multi-lens type projection optical system PL is assumed to be mounted. The projection optical system PL includes plurality of projection modules that project an image of a part of the pattern on the cylindrical mask DM. For example, in FIG. 17, three projection modules (projection optical systems) PL1, PL3, and PL5 are arranged at constant intervals in the Y-axis direction on the left side of the center plane P3 and three projection modules (projection optical systems) PL2, PL4, and PL6 are arranged at constant intervals in the Y-axis direction on the right side of the center plane P3.

In such multi-lens type exposure apparatus EXA, the entire image of a desired pattern is projected by overlapping the ends in the Y-axis direction of the areas (projection areas PA1 to PA6) exposed by the plurality of projection modules PL1 to PL6 with each other. In such exposure apparatus EXA, even when the size in the Y-axis direction of a pattern on the cylindrical mask DM increases and a substrate P with a large width in the Y-axis direction needs to be essentially handled, the projection modules PA and the modules on the illumination mechanism IU side corresponding to the projection modules PA only have to be additionally provided in the Y-axis direction and thus there is a merit in that it is possible to easily cope with an increase in the size of a panel (the width of the substrate P).

The exposure apparatus EXA may not be a multi-lens type. For example, when the size in the width direction of the substrate P is small to a certain degree, the exposure apparatus EXA may project an image of the entire width of the pattern onto the substrate P using a single projection module. Each of the plurality of projection modules PL1 to PL6 may project a pattern corresponding to one device. That is, the exposure apparatus EXA may project a plurality of device patterns in parallel using the plurality of projection modules.

The illumination mechanism IU of this embodiment includes a light source device 13 and an illumination optical system. The illumination optical system includes a plurality (for example, six) of illumination modules IL arranged in the Y-axis direction to correspond to the plurality of projection modules PL1 to PL6. The light source device includes a lamp light source such as a mercury lamp or a solid light source such as a laser diode and a light-emitting diode (LED).

Examples of illumination light emitted from the light source device includes bright rays (a g ray, an h ray, an i ray) emitted from a lamp light source, far-ultraviolet light (DUV light) such as a KrF excimer laser beam (with a wavelength of 248 nm), and an ArF excimer laser beam (with a wavelength of 193 nm). The illumination light emitted from the light source device is uniformized in illuminance distribution and is distributed to the plurality of illumination modules IL, via a light guide member such as an optical fiber.

Each of the plurality of illumination modules IL includes plurality of optical members such as lenses. In this embodiment, light emitted from the light source device and passing through any of the plurality of illumination modules IL is referred to as an illumination light beam EL1. Each of the plurality of illumination modules IL includes, for example, an integrator optical system, a rod lens, and a fly-eye lens and illuminates the illumination areas IR with the illumination light beam EL1 with a uniform illuminance distribution. In this embodiment, the plurality of illumination modules IL are arranged inside the cylindrical mask DM. Each of the plurality of illumination modules IL illuminates the corresponding illumination area IR of the mask pattern formed on the outer circumferential surface of the cylindrical mask DM from the inside of the cylindrical mask DM.

FIG. 18 is a diagram showing an arrangement of the illumination areas IR and the projection areas PA in this embodiment. FIG. 18 shows a plan view (the left view in FIG. 18) when the illumination areas IR on the cylindrical mask DM disposed in the first drum member 21 is viewed from the −Z-axis side and a plan view (the right view in FIG. 18) when the projection areas PA on the substrate P disposed on the rotary drum DR are viewed from the +Z-axis side. Reference sign Xs in FIG. 18 represents the rotating direction (moving direction) of the first drum member 21 or the rotary drum DR.

The plurality of illumination modules IL illuminate the first illumination area IR1 to the sixth illumination area IR6 on the cylindrical mask DM, respectively. For example, the first illumination module IL illuminates the first illumination area IR1 and the second illumination module IL illuminates the second illumination area IR2.

The first illumination area IR1 is defined as a trapezoidal area which is thin and long in the Y-axis direction. However, in a projection optical system having a configuration for forming an intermediate image plane like a projection optical system (projection module) PL, since a field diaphragm plate having a trapezoidal opening can be disposed at the position of the intermediate image plane, the illumination area may be a rectangular area including the trapezoidal opening. The third illumination area IR3 and the fifth illumination area IR5 are areas having the same shape as the first illumination area IR1 and are arranged at constant intervals in the Y-axis direction.

The second illumination area IR2 is a trapezoidal (or rectangular) area which is symmetric about the center plane P3 with the first illumination area IR1. The fourth illumination area IR4 and the sixth illumination area IR6 are areas having the second illumination area IR2 and are arranged at constant intervals in the Y-axis direction.

As shown in FIG. 18, the first to sixth illumination areas IR1 to IR6 are arranged so that triangular parts of oblique side parts of the neighboring trapezoidal areas overlap with each other when viewed in the circumferential direction of the first surface P1. Accordingly, for example, a first area A1 on the cylindrical mask DM passing through the first illumination area IR1 with the rotation of the first drum member 21 partially overlaps with a second area A2 on the cylindrical mask DM passing through the second illumination area IR2 with the rotation of the first drum member 21.

In this embodiment, the cylindrical mask DM includes a pattern-formed area A3 in which a pattern is formed and a non-pattern-formed area A4 in which a pattern is not formed. The non-pattern-formed area A4 is arranged to surround the pattern-formed area A3 in a frame shape and has a characteristic blocking an illumination light beam EL1.

The pattern-formed area A3 of the cylindrical mask DM moves in the direction Xs with the rotation of the first drum member 21 and the partial areas in the Y-axis direction in the pattern-formed area A3 pass through any of the first to sixth illumination areas IR1 to IR6. In other words, the first to sixth illumination areas IR1 to IR6 are arranged to cover the entire width in the Y-axis direction of the pattern-formed area A3.

As shown in FIG. 17, the plurality of projection modules PL1 to PL6 arranged in the Y-axis direction correspond to the first to sixth illumination modules IL in a one-to-one correspondence manner. An image of a partial pattern of the cylindrical mask DM appearing in the illumination area IR illuminated by the corresponding illumination module IL is projected onto the corresponding projection area PA on the substrate P.

For example, the first projection module PL1 corresponds to the first illumination module IL and projects an image of a pattern of the cylindrical mask DM in the first illumination area IR1 (see FIG. 18) illuminated by the first illumination module IL onto the first projection area PA1 on the substrate P. The third projection module PL3 and the fifth projection module PL5 correspond to the third illumination module IL and the fifth illumination module IL, respectively. The third projection module PL3 and the fifth projection module PL5 are arranged at positions overlapping with the first projection module PL1 when viewed in the Y-axis direction.

The second projection module PL2 corresponds to the second illumination module IL and projects an image of a pattern of the cylindrical mask DM in the second illumination area IR2 (see FIG. 18) illuminated by the second illumination module IL onto the second projection area PA2 on the substrate P. The second projection module PL2 is arranged at a position about the center plane P3 with the first projection module PL1 when viewed in the Y-axis direction.

The fourth projection module PL4 and the sixth projection module PL6 correspond to the fourth illumination module IL and the sixth illumination module IL, respectively. The fourth projection module PL4 and the sixth projection module PL6 are arranged at positions overlapping with the second projection module PL2 when viewed in the Y-axis direction.

In this embodiment, light traveling from the illumination module IL of the illumination mechanism IU to the illumination areas IR1 to IR6 on the cylindrical mask DM is defined as an illumination light beam EL1. Light modulated in intensity distribution based on the partial patterns of the cylindrical mask DM appearing in the illumination areas IR1 to IR6, made incident on the projection modules PL1 to PL6, and arriving at the projection areas PA1 to PA6 is defined as an image-forming light beam EL2.

As shown in FIG. 17, principal rays passing through the center points of the projection areas PA1 to PA6 out of the image-forming light beams EL2 arriving at the projection areas PA1 to PA6 are arranged at position (specific positions) of angle θ in the circumferential direction with the center plane P3 when viewed in the direction of the second center line AX2 of the rotary drum DR.

As shown in FIG. 18, an image of a pattern in the first illumination area IR1 is projected onto the first projection area PA1, an image of a pattern in the third illumination area IR3 is projected onto the third projection area PA3, and an image of a pattern in the fifth illumination area IR5 is projected onto the fifth projection area PA5. In this embodiment, the first projection area PA1, the third projection area PA3, and the fifth projection area PA5 are arranged in a line in the Y-axis direction.

An image of a pattern in the second illumination area IR2 is projected onto the second projection area PA2. In this embodiment, the second projection area PA2 is arranged to be symmetric about the center plane P3 with the first projection area PA1 when viewed in the Y-axis direction. An image of a pattern in the fourth illumination area IR4 is projected onto the fourth projection area PA4 and an image of a pattern in the sixth illumination area IR6 is projected onto the sixth projection area PA6. In this embodiment, the second projection area PA2, the fourth projection area PA4, and the sixth projection area PA6 are arranged in a line in the Y-axis direction.

The first projection area PA1 to the sixth projection area PA6 are arranged so that the ends (the triangular parts of the trapezoid) of the neighboring projection areas (the odd-numbered projection areas and the even-numbered projection areas) in a direction parallel to the second center line AX2 overlap with each other when viewed in the circumferential direction of the second surface P2.

Accordingly, a third area A5 on the substrate P passing through the first projection area PA1 with the rotation of the rotary drum DR partially overlaps with a fourth area A6 on the substrate P passing through the second projection area PA2 with the rotation of the rotary drum DR. The shapes of the first projection area PA1 and the second projection area PA2 are set so that the exposure amount in the area in which the third area A5 and the fourth area A6 overlap is substantially equal to the exposure amount in which the areas do not overlap. In this way, the first projection area PA1 to the sixth projection area PA6 are arranged to cover the entire width in the Y-axis direction of the exposure area A7 to be exposed on the substrate P.

The detailed configuration of the projection optical system PL according to this embodiment will be described with reference to FIG. 19. In this embodiment, each of the second projection module P12 to the fifth projection module PL5 has the same configuration as the first projection module PL1. Accordingly, the configuration of the first projection module PL1 will be described representatively of the projection optical system PL and a description of the second projection module PL2 to the fifth projection module PL5 will not be repeated.

The first projection module PL1 shown in FIG. 19 includes a first optical system 41 that forms an image of a pattern of the cylindrical mask DM arranged in the first illumination area IR1 on the intermediate image plane P7, a second optical system 42 that re-forms at least a part of the intermediate image formed by the first optical system 41 in the first projection area PA1 of the substrate P, and a first field diaphragm 43 that is disposed on the intermediate image plane P7 on which the intermediate image is formed.

The first projection module PL1 includes a focus correcting optical member 44, an image shift correcting optical member 45, a rotation correcting mechanism 46, and a magnification correcting optical member 47.

The focus correcting optical member 44 is a focus adjusting device finely adjusting a focused state of a mask pattern image (hereinafter, referred to as projection image) formed on the substrate P. The image shift correcting optical member 45 is a shift adjusting device finely horizontally shifting the projection image on the image plane. The magnification correcting optical member 47 is a shift adjusting device finely correcting the magnification of the projection image. The rotation correcting mechanism 46 is a shift adjusting device finely rotating the projection image in the image plane.

The image-forming light beam EL2 from the pattern of the cylindrical mask DM is emitted in the normal direction (Dl) from the first illumination area IR1, passes through the focus correcting optical member 44, and is made incident on the image shift correcting optical member 45. The image-forming light beam EL2 passing through the image shift correcting optical member 45 is reflected at a first reflection surface (planar mirror) p4 of a first deflection member 50 which is an element of the first optical system 41, passes through a first lens group 51, is reflected at a first concave mirror 52, passes through the first lens group 51 again, is reflected at a second reflection surface (planar mirror) p5 of the first deflection member 50, and is made incident on a first field diaphragm 43.

The image-forming light beam EL2 passing through the first field diaphragm 43 is reflected at a third reflection surface (planar mirror) p8 of a second deflection member 57 which is an element of the second optical system 42, passes through a second lens group 58, is reflected at a second concave mirror 59, passes through the second lens group 58 again, is reflected at a fourth reflection surface (planar mirror) p9 of the second deflection member 57, and is then made incident on the magnification correcting optical member 47. The image-forming light beam EL2 emitted from the magnification correcting optical member 47 is made incident on the first projection area PA1 on the substrate P and the image of the pattern appearing in the first illumination area IR1 is projected onto the first projection area PA1 at an equal magnification (×1).

As shown in FIG. 17, when the radius of the cylindrical mask DM is defined r1, the radius of the cylindrical surface of the substrate P wound around the rotary drum DR is defined as r2, and the radius r1 and the radius r2 are set to be equal to each other, the principal ray of the image-forming light beam EL2 at the mask side of each of the projection modules PL1 to PL6 is inclined so as to pass through the center line AX1 of the cylindrical mask DM, but the inclination angle thereof is equal to the inclination angle $\theta$ ($\pm\theta$ about the center plane P3) of the principal ray of the image-forming light beam EL2 at the substrate side.

The angle $\theta3$ formed by a third reflection surface p8 of a second deflection member 57 and a second optical axis AX4 is substantially equal to the angle $\theta2$ formed by a second reflection surface p5 of a first deflection member 50 and a first optical axis AX3. The angle $\theta4$ formed by a fourth reflection surface p9 of a second deflection member 57 and the second optical axis AX4 is substantially equal to the angle $\theta1$ formed by a first reflection surface p4 of the first deflection member 50 and the first optical axis AX3. In order to give such inclination angle $\theta$, the angle $\theta1$ of the first reflection surface p4 of the first deflection member 50 shown in FIG. 19 about the optical axis AX3 is set to be smaller by $\Delta\theta1$ than 45° and the angle $\theta4$ of the fourth reflection surface p9 of the second deflection member 57 about the optical axis AX4 is set to be smaller by $\Delta\theta4$ than 45°. $\Delta\theta1$ and $\Delta\theta4$ are set to have a relationship of $\Delta\theta1=\Delta\theta4=\theta/2$ with the angle $\theta$ shown in FIG. 17.

Figure 20:
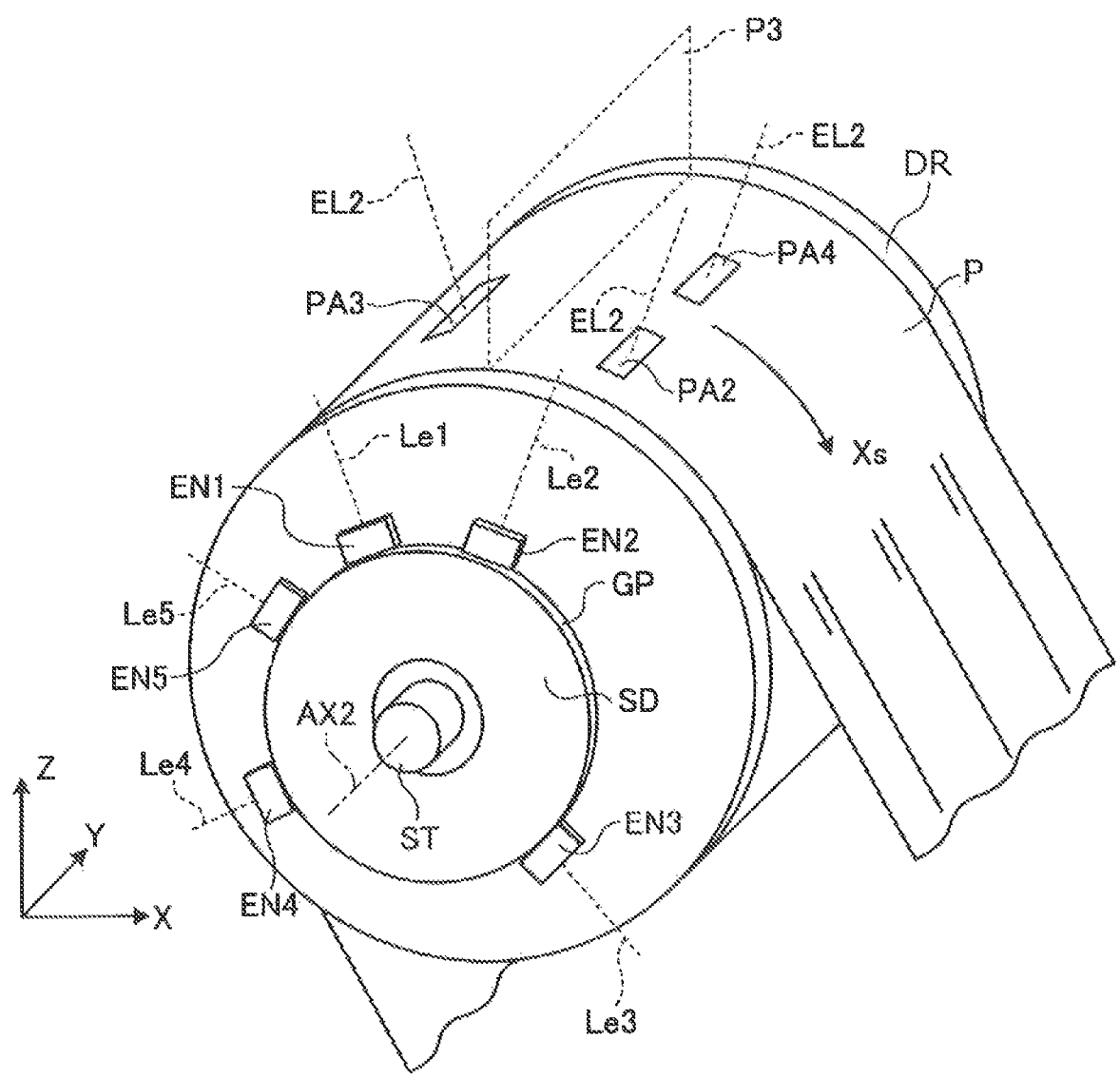
FIG. 20 is a perspective view of a rotary drum applied to the processing apparatus (exposure apparatus) shown in FIG. 17.
Figure 21:
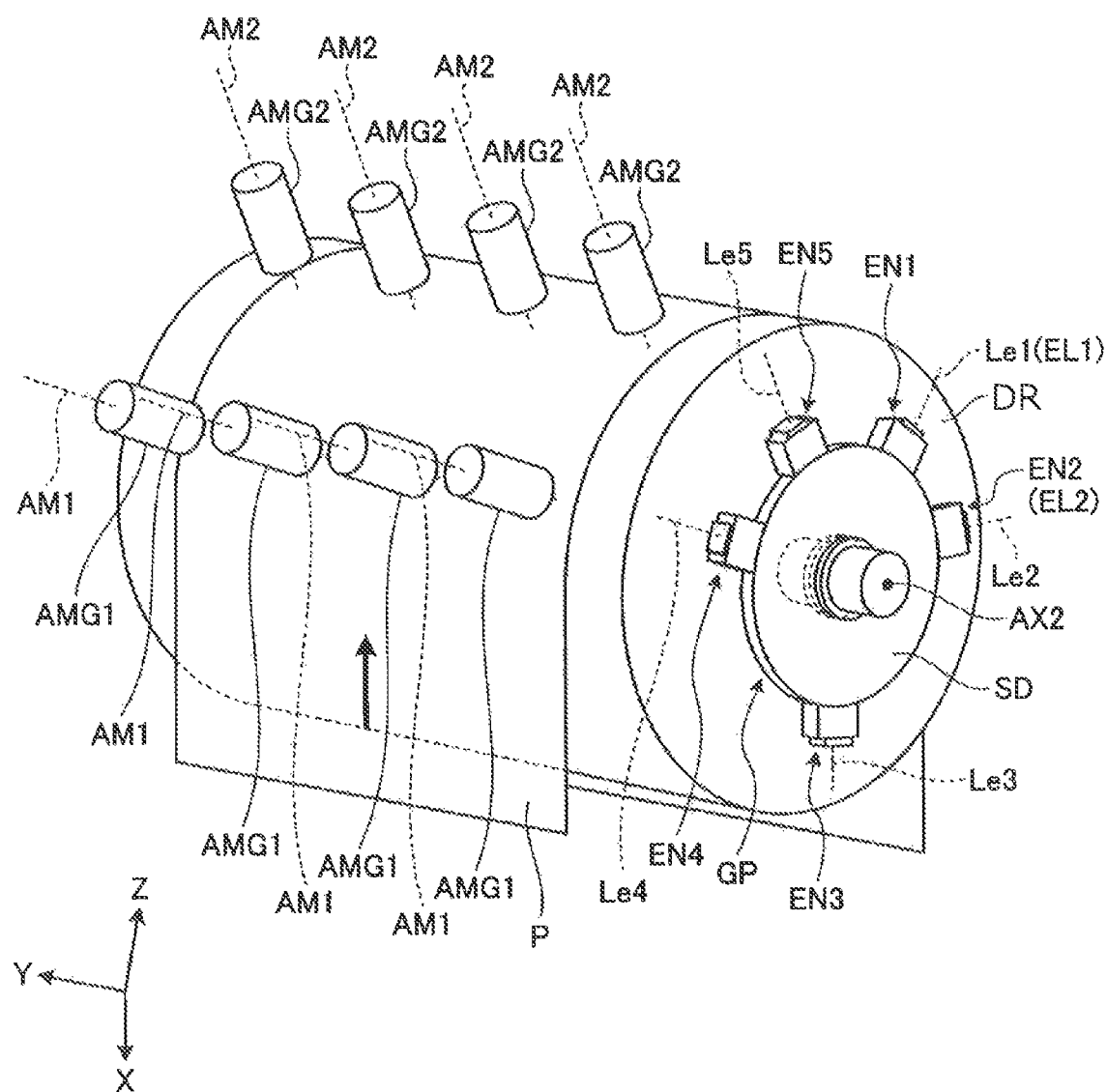
FIG. 21 is a perspective view showing a relationship between a detection probe and a reading device applied to the processing apparatus (exposure apparatus) shown in FIG. 17.
Figure 22:
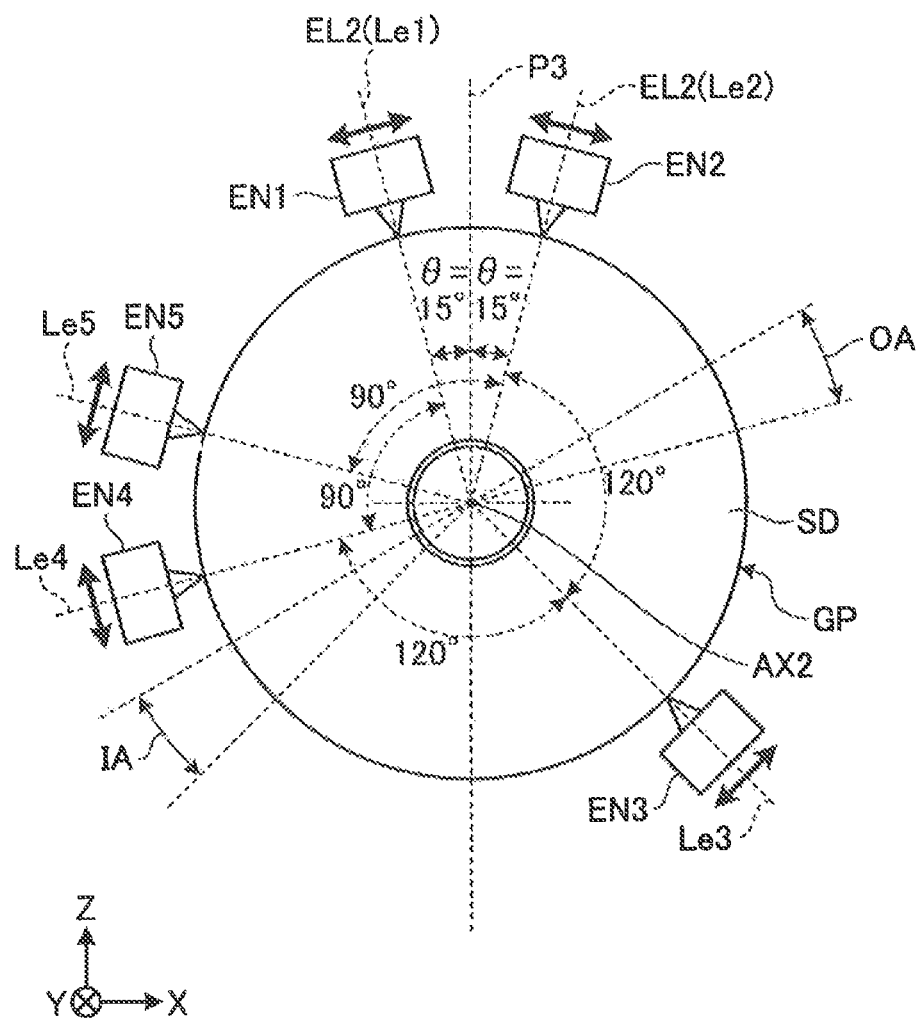
FIG. 22 is a diagram showing a position of the reading device when a scale disk is viewed in the rotation center line direction according to the seventh embodiment.

FIG. 20 is a perspective view of the rotary drum applied to the processing apparatus (exposure apparatus) shown in FIG. 17. FIG. 21 is a perspective view showing a relationship between the detection probes and the reading devices applied to the processing apparatus (exposure apparatus) shown in FIG. 17. FIG. 22 is a diagram showing the positions of the reading devices when the scale disk SD according to the seventh embodiment is viewed in the direction of the rotation center line AX2. In FIG. 20, for the purpose of convenience of explanation, only the second projection area PA2 to the fourth projection area PA4 are shown and the first projection area PA1, the fifth projection area PA5, and the sixth projection area PA6 are not shown.

The second detector 35 shown in FIG. 17 optically detects the rotational position of the rotary drum DR and includes a scale disk SD (the scale member) with high roundness and encoder heads EN1, EN2, EN3, EN4, and EN5 (the encoder head part).

The scale disk SD is fixed to an end of the rotary drum DR so as to be perpendicular to the rotation shaft ST. According, the scale disk SD rotates along with the rotation shaft ST about the rotation center line AX2. A scale portion GP is carved on the outer circumferential surface of the scale disk SD.

The scale portion GP has grid-like scales arranged in a ring shape, for example, with a pitch of 20 μm along the circumferential direction in which the rotary drum DR rotates, and rotates about the rotation shaft ST (the second center line AX2) together with the rotary drum DR. The encoder heads EN1, EN2, EN3, EN4, and EN5 are arranged around the scale portion GP when viewed from the direction of the rotation shaft ST (the second center line AX2).

The encoder heads EN1, EN2, EN3, EN4, and EN5 are disposed to face the scale portion GP and can read the variation in position in the circumferential direction of the scale portion GP in a non-contacting manner, for example, with a resolution of about 0.1 μm by projecting a laser beam (with a diameter of about 1 mm) to the scale portion GP and photo-electrically detecting a reflected and diffracted beam from the grid-like scales. The encoder heads EN1, EN2, EN3, EN4, and EN5 are arranged at different positions in the circumferential direction of the rotary drum DR.

The encoder heads EN1, EN2, EN3, EN4, and EN5 are reading devices having measurement sensitivity (detection sensitivity) to displacement in a tangential direction (in the XZ plane) of the scale portion GP. As shown in FIG. 20, when the installation azimuths (angle directions in the XZ plane about the rotation center line AX2) of the encoder heads EN1, EN2, EN3, EN4, and EN5 are denoted by installation azimuth lines Le1, Le2, Le3, Le4, and Le5, the encoder heads EN1 and EN2 are arranged so that the installation azimuth lines Le1 and Le2 are ±θ° with respect to the center plane P3 as shown in FIG. 22.

In this embodiment, the angle θ is set to 15°. The installation azimuth lines Le1 to Le5 pass through the projection positions on the scale portion GP of the laser beam (with a width of about 1 mm) projected from the encoder heads EN1 to EN5.

The projection modules PL1 to PL6 shown in FIG. 19 are processing parts of the exposure apparatus EXA performing an irradiation process of irradiating the substrate P with light with the substrate P as an object to be processed. The exposure apparatus EXA causes the principal rays of two image-forming light beams EL2 to be incident on the substrate P.

The projection modules PL1, PL3, and PL5 serve as a first processing part and the projection modules PL2, PL4, and PL6 serve as a second processing part. Each positions at which the principal rays of two image-forming light beams EL2 are made incident on the substrate P with respect to the substrate P are specific positions at which the irradiation process of irradiating the substrate P with light is performed. The specific positions are positions at angles ±θ in the circumferential direction with respect to the center plane P3 on the curved substrate P on the rotary drum DR when viewed from the second center line AX2 of the rotary drum DR.

The installation azimuth line Le1 of the encoder head EN1 matches the inclination angle θ of the principal ray passing through the center points of the projection areas (projection fields) PA1, PA3, and PA5 of the odd-numbered projection modules PL1, PL3, and PL5 about the center plane P3. The installation azimuth line Le2 of the encoder head EN2 matches the inclination angle θ of the principal ray passing through the center points of the projection areas (projection fields) PA2, PA4, and PA6 of the even-numbered projection modules PL2, PL4, and PL6 about the center plane P3. Accordingly, the encoder heads EN1 and EN2 serve as the reading devices reading the scale portion GP located in the direction connecting the specific positions and the second center line AX2.

As shown in FIG. 22, the encoder head EN4 is disposed on the upstream side in the conveyance direction of the substrate P, that is, on the preceding side of the exposure position (projection area). The encoder head EN4 is set in the installation azimuth line Le4, which is obtained by rotating the installation azimuth line Le1 of the encoder head EN1 substantially by 90° about the rotation center line AX2 to the upstream side in the conveyance direction of the substrate P. The encoder head EN5 is set in the installation azimuth line Le5, which is obtained by rotating the installation azimuth line Le2 of the encoder head EN2 substantially by 90° about the rotation center line AX2 to the upstream side in the conveyance direction of the substrate P.

As described above, for example, the measurement direction of the scale portion GP by the encoder head EN4 is a direction parallel to the installation azimuth line Le1, that is, the direction of the principal ray of the image-forming light beam EL2 from the odd-numbered projection modules PL1, PL3, and PL5. That is, the measurement direction of the scale portion GP by the encoder head EN4 is also the direction in which a variation in the focusing direction of the substrate P with respect to the best image-forming surface of the projection modules PL1, PL3, and PL5. Accordingly, the measured read value of the encoder head EN4 includes a component indicating that the scale disk SD finely moves in the direction parallel to the installation azimuth line Le1 as a whole due to shaft displacement, eccentricity, rattle, or the like of the rotation center line AX2 (the rotary drum DR).

Similarly, the measured read value of the encoder head EN5 includes a fine movement component in the focusing direction of the substrate P with respect to the best image-forming surface of the even-numbered projection modules PL2, PL4, and PL6.

The magnitude of the fine movement component depends on mechanical processing accuracy or assembly accuracy and is considered to be ±several μm to several tens of μm. Accordingly, it is assumed that the fine movement component of the scale disk SD (the rotary drum DR) in the direction parallel to the installation azimuth line Le1 is measured within an error range of ±10% by the encoder head EN4 (or EN5). In this case, the angle formed by the installation azimuth line Le4 (or Le5) of the encoder head EN4 (or EN5) and the installation azimuth line Le1 (or Le2) of the encoder head EN1 (or EN2) is set to be within a range of 90°±γ, where the angle γ is in a range of 0°≤γ≤5.8°. That is, in this embodiment, substantially 90° means a range of 84.2° to 95.8°.

By setting the angle to this range, the directions of the installation azimuth lines Le4 and Le5 in which the encoder heads EN4 and EN5 reading the scale portion GP are arranged are in the range substantially perpendicular to the direction in which the principal ray of the image-forming light beam EL2 is made incident on the specific position of the substrate P when viewed in the XZ plane and from the direction of the rotation center line AX2.

Accordingly, even when the rotary drum DR is shifted in the Z-axis direction due to a slight rattle (about 2 μm to 3 μm) of the bearing supporting the rotation shaft ST, it is possible to measure an positional error (focus variation), which can occur in the projection areas PA1 to PA6 by the shift, in the direction parallel to the image-forming light beam EL2 with high accuracy by the use of the encoder heads EN4 and EN5 and to measure the position in the circumferential direction with high accuracy by the use of the encoder heads EN1 and EN2.

The encoder head EN3 is set in the installation azimuth line Le3 which is obtained by rotating the installation azimuth line Le2 of the encoder head EN2 substantially by 120° about the rotation center line AX2 and rotating the installation azimuth line Le4 of the encoder head EN4 substantially by 120° about the rotation center line AX2. Here, substantially 1200 means a range of 120°±γ, where the angle γ is in a range of 0°≤γ≤5.8°.

The scale disk SD as the scale member is manufactured with a diameter as large as possible (for example, a diameter of 20 cm or more) so as to enhance the measurement resolution using metal with a low thermal expansion coefficient, glass, ceramics, or the like as a base material. In FIG. 20, the diameter of the scale disk SD is shown to be smaller than the diameter of the rotary drum DR. However, a so-called measurement Abbe error can be further reduced by causing the diameter of the scale portion GP of the scale disk SD to match (to be almost equal to) the diameter of the outer circumferential surface around which the substrate P is wound in the outer circumferential surface of the rotary drum DR. More strictly, it is preferable to set the sum of the radius of the outer circumferential surface of the rotary drum DR and the thickness (for example, 100 μm) of the substrate P to be equal to the radius of the scale portion GP of the scale disk SD.

The minimum pitch of the scales (grids) caved in the circumferential direction of the scale portion GP is limited by the performance of a scale carving device configured to process the scale disk SD or the like. Accordingly, when the diameter of the scale disk SD is set to be large, the angle measurement resolution corresponding to the minimum pitch can be accordingly enhanced.

The directions of the installation azimuth lines Le1 and Le2 in which the encoder heads EN1 and EN2 for reading the scale portion GP are arranged are set to be equal to the directions in which the principal rays of the image-forming light beams EL2 are made incident on the substrate P when viewed from the rotation center line AX2. Accordingly, even when the rotary drum DR is shifted in the X-axis direction due to a slight rattle (about 2 μm to 3 μm) of a bearing supporting the rotation shaft ST, a positional error in the conveyance direction (Xs) of the substrate P which can be generated in the projection areas PA1 to PA6 can be measured with high accuracy by the use of the encoder heads EN1 and EN2.

As shown in FIG. 21, alignment microscopes AMG1 and AMG2 (alignment system) for detecting alignment marks and the like formed in advance on the substrate P are provided in a part of the substrate P supported on the curved surface of the rotary drum DR so as to relatively align the substrate P with an image of a part of the mask pattern projected by the projection optical system PL shown in FIG. 17.

Each of the alignment microscopes AMG1 and AMG2 is a pattern detecting device that is arranged around the rotary drum DR so that a detection probe for detecting a specific pattern formed discretely or continuously on the substrate P and a detection area obtained by the detection probe are set at the rear side (upstream side) in the conveyance direction of the substrate P from the above-mentioned specific position.

As shown in FIG. 21, each of the alignment microscopes AMG1 and AMG2 includes a plurality (for example, four) of detection probes arranged in a line in the Y-axis direction (the width direction of the substrate P). Each of the alignment microscopes AMG1 and AMG2 can normally observe or detect alignment marks formed in the vicinity of both ends of the substrate P by the use of the detection probes at both ends in the Y-axis direction of the rotary drum DR. Each of the alignment microscopes AMG1 and AMG2 can observe or detect alignment marks formed, for example, in margins and the like between pattern-forming areas of plurality of display panels formed in the length direction on the substrate P by the use of the detection probes different from the detection probes at both ends in the Y-axis direction (the width direction of the substrate P) of the rotary drum DR.

As shown in FIGS. 21 and 22, the encoder head EN4 is disposed in the installation azimuth line Le4 set in the radial direction of the scale portion GP so as to be parallel to the observation direction AM1 (the detection center line directed to the second center line AX2) of the substrate P by the alignment microscope AMG1 when viewed in the XZ plane and from the direction of the rotation center line AX2.

That is, the alignment system is disposed so that the position in the circumferential direction of the alignment mark detection area of the alignment microscope AMG1 matches the position in the circumferential direction at which the encoder head EN4 reads the scales.

The encoder head EN5 is disposed in the installation azimuth line Le5 set in the radial direction of the scale portion GP so as to be parallel to the observation direction AM2 (the detection center line directed to the second center line AX2) of the substrate P by the alignment microscope AMG2 when viewed in the XZ plane and from the direction of the rotation center line AX2.

That is, the alignment system is disposed so that the position in the circumferential direction of the alignment mark detection area of the alignment microscope AMG2 matches the position in the circumferential direction at which the encoder head EN5 reads the scales.

In this way, the detection probes of the alignment microscopes AMG1 and AMG2 are arranged around the rotary drum DR when viewed from the direction of the second center line AX2, and arranged so that the directions (the installation azimuth lines Le4 and Le5) connecting the positions at which the encoder heads EN4 and EN5 and the second center line AX2 match the directions connecting the detection areas of the alignment microscopes AMG1 and AMG2 and the second center line AX2.

The positions in the circumferential direction about the rotation center line AX2 at which the alignment microscopes AMG1 and AMG2 and the encoder heads EN4 and EN5 are arranged are set between a sheet approaching area IA in which the substrate P starts contacting the rotary drum DR and a sheet separation area OA in which the substrate P is separated from the rotary drum DR.

The alignment microscopes AMG1 and AMG2 are arranged before the exposure position (projection area PA), detects an image of alignment marks (which are formed in an area of several tens of μm square to several hundreds of μm square) formed in the vicinity of ends in the Y-axis direction of the substrate P at a high speed by the use of an imaging device or the like in a state where the substrate P is conveyed at a predetermined speed, and samples the images of the marks in a microscope field (imaging range) at a high speed. By storing the rotation angle position of the scale disk SD which is sequentially measured by the encoder head EN4 (or EN5) at the instant of sampling, the correspondence between the mark position on the substrate P and the rotation angle of the rotary drum DR is calculated.

When the mark detected by the alignment microscope AMG1 is detected by the alignment microscope AMG2, the difference value between the angle position measured and stored by the encoder head EN4 and the angle position measured and stored by the encoder head EN5 is compared with a reference value corresponding to an opening angle of the installation azimuth lines Le4 and Le5 of two alignment microscopes AMG1 and AMG2 accurately calibrated in advance. As a result, when there is difference between the difference value and the reference value, there is a possibility that the substrate P slightly slides on the rotary drum DR or expands or contracts in the conveyance direction (circumferential direction) between the sheet approaching area IA and the sheet separation area OA.

In general, the positional error at the time of patterning is determined depending on fineness or overlap accuracy of device patterns formed on the substrate P. For example, in order to accurately overlap and expose an underlying pattern layer with a line pattern with a width of 10 µm, only an error of one over several thereof, that is, a positional error of about ±2 µm in terms of the size on the substrate P, is allowed.

In order to realize such high-accuracy measurement, the measuring direction (the tangential direction of the outer circumference of the rotary drum DR in the XZ plane) of a mark image by the alignment microscopes AMG1 and AMG2 and the measuring direction (the tangential direction of the outer circumference of the scale portion GP in the XZ plane) by the encoder heads EN4 and EN5 need to be matched within an allowable angle error.

As described above, the encoder heads EN4 and EN5 are arranged so as to match the measuring directions (the tangential direction of the circumferential surface of the rotary drum DR) of an alignment mark on the substrate P by the alignment microscopes AMG1 and AMG2. Accordingly, even when the rotary drum DR (the scale disk SD) is shifted in the circumferential direction (the tangential direction) perpendicular to the installation azimuth line Le4 or Le5 in the XZ plane at the time of detecting the position (sampling the image) of the substrate P (mark) by the use of the alignment microscope AMG1 and AMG2, it is possible to measure a position with high accuracy in consideration of the shift of the rotary drum DR.

Since the encoder heads EN1 to EN5 are arranged at five positions around the scale portion GP of the scale disk SD when viewed from the direction of the second center line AX2, it is possible to calculate roundness (deformation), an eccentric error, and the like of the scale portion GP of the scale disk SD by combining and calculating the outputs of the values measured by two or three appropriate encoder heads thereof. A case where the displacement in a specific direction in the XZ plane of the rotary drum DR is calculated by a calculation process by combining the outputs of the measured values by two or three or more encoder heads will be described below with reference to FIGS. 23, 24, and 25.

First Calculation Process Example

Figure 23:
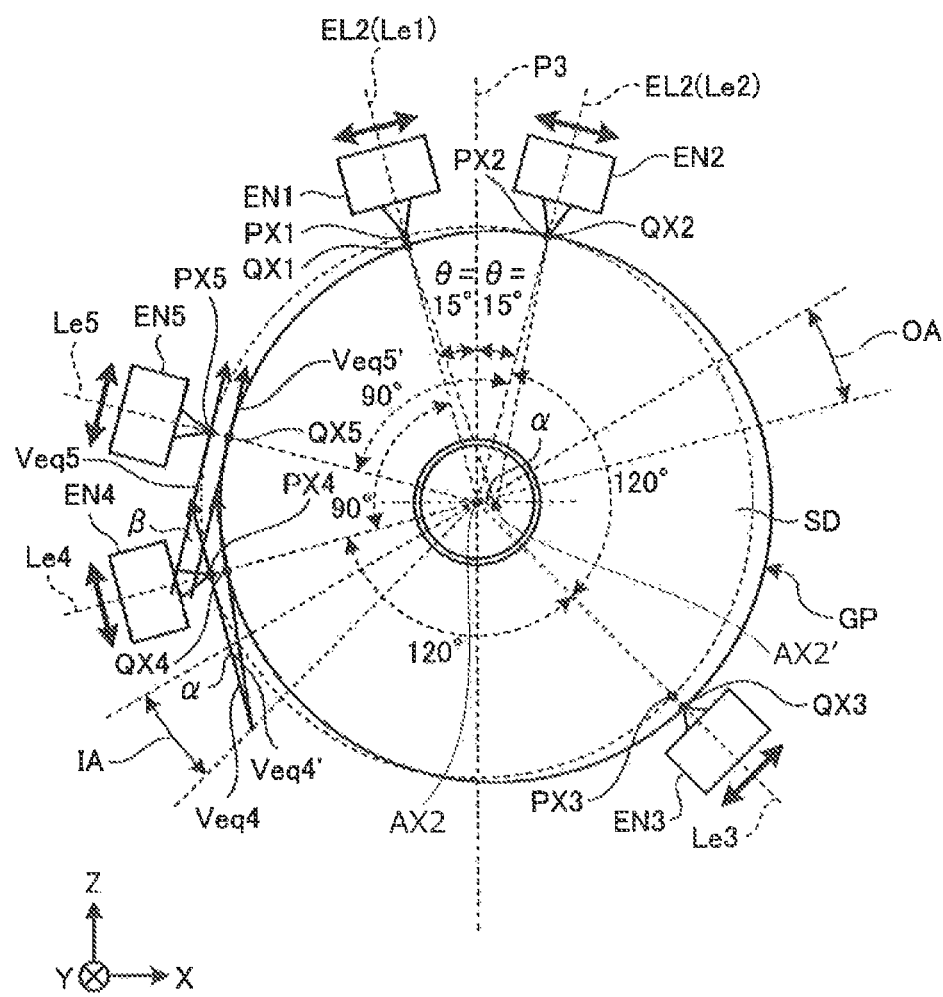
FIG. 23 is a diagram showing a displacement of the rotary drum when the scale disk is viewed in the direction of the rotation center line according to the seventh embodiment.
Figure 24:
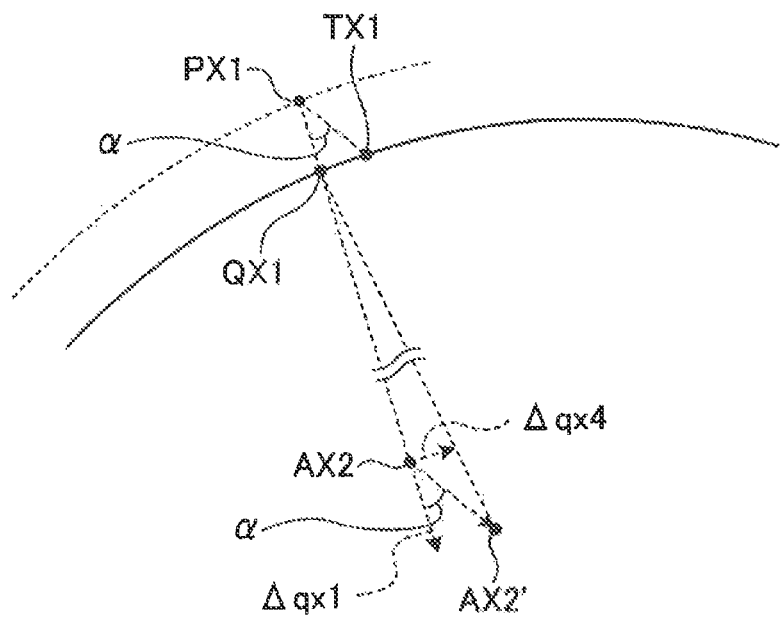
FIG. 24 is a diagram showing an example of calculating the displacement of the rotary drum when the scale disk is viewed in the direction of the rotation center line according to the seventh embodiment.
Figure 25:
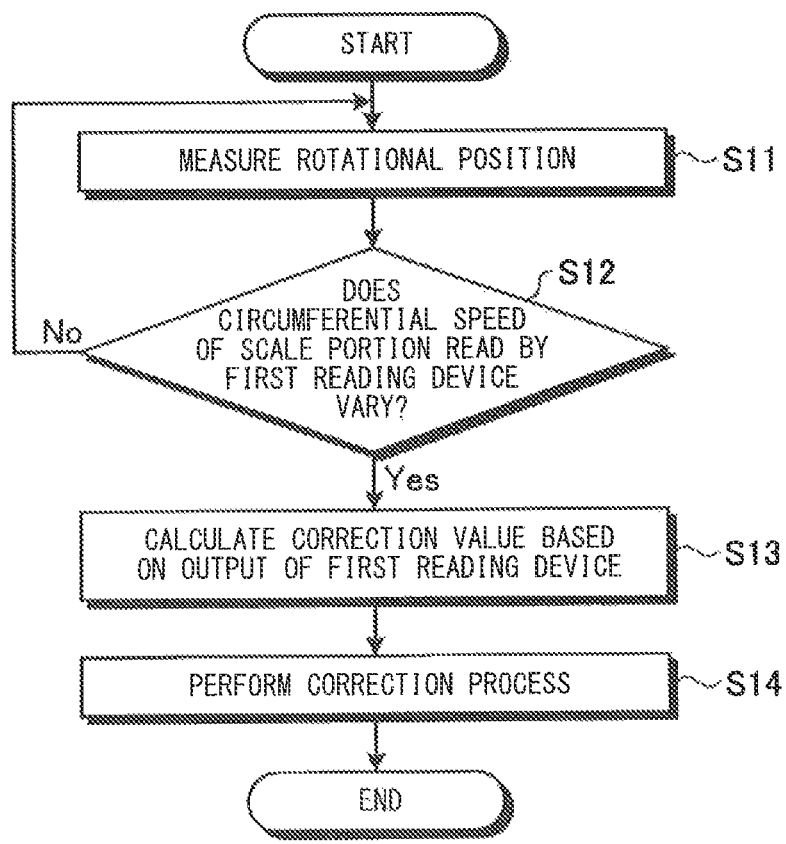
FIG. 25 is a flowchart showing an example of a process flow of correcting a process of the processing apparatus (exposure apparatus) according to the seventh embodiment.

FIG. 23 is a diagram showing a displacement of the rotary drum DR when the scale disk SD is viewed in the direction of the rotation center line AX2 according to the seventh embodiment. FIG. 24 is a diagram showing an example of calculating the displacement of the rotary drum DR when the scale disk SD is viewed in the direction of the rotation center line AX2 according to the seventh embodiment. FIG. 25 is a flowchart showing an example of a process flow of correcting a process of the processing apparatus (exposure apparatus) according to the seventh embodiment.

As shown in FIG. 23, for example, the rotary drum DR is shifted together with the scale disk SD due to a slight rattle of the bearing supporting the rotation shaft ST and the scale disk SD is shifted from the position indicated by a dotted line to the position indicated by a solid line in FIG. 23. The position AX2' of the rotation shaft ST of the rotary drum DR moves from the rotation center line AX2 (the second center line AX2). For example, the encoder head EN1 reads the position PX1 of the scale portion GP located in the direction connecting the second center line AX2 to a specific position before the scale disk SD is shifted. When the scale disk SD is shifted from the position indicated by the dotted line to the position indicated by the solid line in FIG. 23, the position PX1 of the scale portion GP moves to the position TX1 of the scale portion GP, as shown in FIG. 24.

After the scale disk SD is shifted, the encoder head EN1 reads the position QX1 of the scale portion GP located in the direction connecting the second center line AX2 to the specific position. Accordingly, in the XZ plane, a displacement component Δqx1 in the direction connecting the position QX1 of the scale portion GP and the rotation center line AX2 of the rotary drum DR is generated. When the angle formed by the displacement at the time of moving from the rotation center line AX2 (the second center line AX2) to the position AX2' of the rotation shaft ST of the rotary drum DR and the direction connecting the position QX1 of the scale portion GP to the rotation center line AX2 of the rotary drum DR is defined as a displacement angle α, the displacement component Δqx1 is equal to a displacement obtained by multiplying the displacement from the rotation center line AX2 (the second center line AX2) to the position AX2' of the rotation shaft ST of the rotary drum DR by cos α.

For example, when the first reading device is the encoder head EN4 and the second reading device is the encoder head EN1, the controller 14 of the exposure apparatus EXA causes the encoder head EN4 and the encoder head EN1 to measure the rotational position (step S11) and stores the outputs of the measured value (the reading output of the scale portion GP) from the encoder head EN4 and the encoder head EN1, as shown in FIG. 25.

The encoder head EN4 and the encoder head EN1 can measure a variation in displacement in the tangential direction (in the XZ plane) of the scale portion GP. Since the scale disk SD is shifted from the position indicated by the dotted line to the position indicated by the solid line in FIG. 23, the encoder head EN4 shown in FIG. 23 reads the position QX4 of the scale portion GP instead of the position PX4 of the scale portion GP. Accordingly, the angle formed by the tangential direction Veq4 at the position PX4 of the scale portion GP and the tangential direction Veq4' at the position QX4 of the scale portion GP, that is, the displacement angle α, is caused. As a result, the circumferential speed read by the encoder head EN4 as the first reading device is changed.

For example, when there is no difference between the circumferential speed read by the encoder head EN1 and the circumferential speed read by the encoder head EN4, the controller 14 determines that the circumferential speed does not vary (NO in step S12) and continues to perform step S11 of measuring the rotational position, as shown in FIG. 25. When there is a difference between the circumferential speed read by the encoder head EN1 and the circumferential speed read by the encoder head EN4, the controller 14 determines that the circumferential speed varies (YES in step S12) and moves the process flow to step S13.

The controller 14 of the exposure apparatus EXA calculates a correction value on the basis of the reading output of the encoder head EN4 which is the first reading device (step S13). When viewed in the XZ plane and from the direction of the rotation center line AX2, the direction of the installation azimuth line Le4 in which the encoder head EN4 is disposed is substantially perpendicular to the direction in which the principal ray of the image-forming light beam EL2 is made incident on a specific position of the substrate P. Accordingly, the variation in the reading output of the encoder head EN4 has a constant relationship with the variation in the direction along the principal ray of the image-forming light beam EL2 projected from the odd-numbered projection modules PL1, PL3, and PL5.

For example, the controller 14 stores a database in which the variation in the reading output of the encoder head EN4 is correlated with the displacement angle α in the storage part. Then, the controller 14 gives the input of the reading output of the encoder head EN4 which is the first reading device to the database stored in the storage part of the controller 14 and calculates the displacement angle α. The controller 14 calculates the displacement component Δqx1 from the calculated displacement angle α and calculates the correction value for correcting the focused state of the projection image on the basis of the displacement component Δqx1. Accordingly, the exposure apparatus EXA according to this embodiment can suppress a calculation load, detect the position of the rotary drum DR (the cylindrical member, the rotary cylindrical body) with high accuracy, and process an object located on the curved surface of the rotary drum DR, that is, the substrate P.

The controller 14 of the exposure apparatus EXA performs a correction process on the basis of the correction value calculated in step S13 (step S14). For example, the controller 14 of the exposure apparatus EXA operates the focus correcting optical member 44 shown in FIG. 19 as the focus adjusting device to finely adjust the focused state of the projection image formed on the substrate P by the odd-numbered projection modules PL1, PL3, and PL5. Accordingly, the exposure apparatus EXA can perform an exposure process on the substrate P with high accuracy.

Similarly, when the first reading device is the encoder head EN5 and the second reading device is the encoder head EN2, the controller 14 of the exposure apparatus EXA causes the encoder head EN5 and the encoder head EN2 to measure the rotational position (step S11) and stores the output of the measured value (the reading output of the scale portion GP) from the encoder head EN5 and the encoder head EN2, as shown in FIG. 25.

For example, the encoder head EN2 reads the position PX2 of the scale portion GP located in the direction connecting the specific position to the second center line AX2 before the scale disk SD is shifted. Then, after the scale disk SD is shifted, the encoder head EN2 reads the position QX2 of the scale portion GP located in the direction connecting the second center line AX2 to the specific position. The position QX2 of the scale portion GP and the position PX2 of the scale portion GP are substantially equal to the position in the direction parallel to the installation azimuth line Le2 and parallel to the image-forming light beam EL2 projected from the even-numbered projection modules PL2, PL4, and PL6 as shown in FIG. 23.

As shown in FIG. 23, since the scale disk SD is shifted from the position indicated by the dotted line to the position indicated by the solid line in FIG. 23, the encoder head EN5 reads the position QX5 of the scale portion GP instead of the position PX5 of the scale portion GP. However, the tangential direction Veq5 at the position PX5 of the scale portion GP and the tangential direction Veq5' at the position PX5 of the scale portion GP are substantially parallel to each other. As a result, the circumferential speed read by the encoder head EN4 as the first reading device is not changed. The controller 14 determines that the circumferential speed does not vary (NO in step S12) and continues to perform step S11 of measuring the rotational position.

As described above, when two encoder heads are arranged at an interval of substantially 90° around the scale portion GP, it is possible to measure a two-dimensional fine movement of the scale disk SD (scale portion GP) in the XZ plane. In FIG. 23, the two-dimensional fine movement occurs, for example, in two directions of the direction (substantially the Z-axis direction) in which the installation azimuth line Le2 of the encoder head EN2 extends and the direction (substantially the X-axis direction) in which the installation azimuth line Le5 of the encoder head EN5 extends. Accordingly, when the rotary drum DR is eccentric in the direction in which the installation azimuth line Le5 extends, the fine movement component of the scale disk SD (scale portion GP) due to the eccentricity can be measured by the encoder head EN2.

However, since the encoder head EN2 measures the displacement in the circumferential direction of the scale portion GP due to the rotation of the scale disk SD at the position of the installation azimuth line Le2, the fine movement component due to the eccentricity of the scale disk SD and the displacement component due to the rotation may not be distinguishably understood well from the solitary measured read values of the encoder head EN2. In this case, a technique of increasing the number of encoder heads and distinguishably measuring the line movement component due to the eccentricity of the scale disk SD and the displacement component due to the rotation may be used. This technique will be described later.

As described above, the exposure apparatus EXA includes the rotary drum DR as the cylindrical member, the scale portion GP, the projection modules PL1 to PL6 as the processing part of the exposure apparatus EXA, the encoder heads EN4 and EN5 as the first reading device reading the scale portion GP, and the encoder heads EN1 and EN2 as the second reading device reading the scale portion GP.

The rotary drum DR has a curved surface curved with a constant radius from the second center line AX2 as a predetermined axis and rotates about the second center line AX2.

The scale portion GP is arranged in a ring shape along the circumferential direction in which the rotary drum DR rotates and rotates about the second center line AX2 along with the rotary drum DR.

The projection modules PL1 to PL6 as the processing parts of the exposure apparatus EX1 are arranged around the rotary drum DR when viewed from the direction of the second center line AX2, and perform the irradiation process of irradiating the substrate P (object to be processed) located on the curved surface at the specific position in the circumferential direction of the rotary drum DR with the principal ray of the two image-forming light beams EL2.

The encoder heads EN4 and EN5 are arranged around the scale portion GP when viewed from the direction of the second center line AX2, and are disposed at the positions obtained by rotating the specific position substantially by 90 degrees about the second center line AX2 with respect to the second center line AX2, and read the scale portion GP.

The encoder heads EN1 and EN2 read the scale portion GP at the specific position.

The projection modules PL1 to PL6 as the processing part of the exposure apparatus EXA performs a process of correcting the displacement when the second center line AX2 of the rotary drum DR moves in the direction perpendicular to the second center line AX2 using the reading outputs of the encoder heads EN4 and EN5 as the first reading device.

Accordingly, the exposure apparatus EXA according to this embodiment can suppress the calculation load, detect the position of the rotary drum DR (the cylindrical member) with high accuracy, and process an object, that is, the substrate P, located on the curved surface of the rotary drum DR.

Second Calculation Process Example

Figure 26:
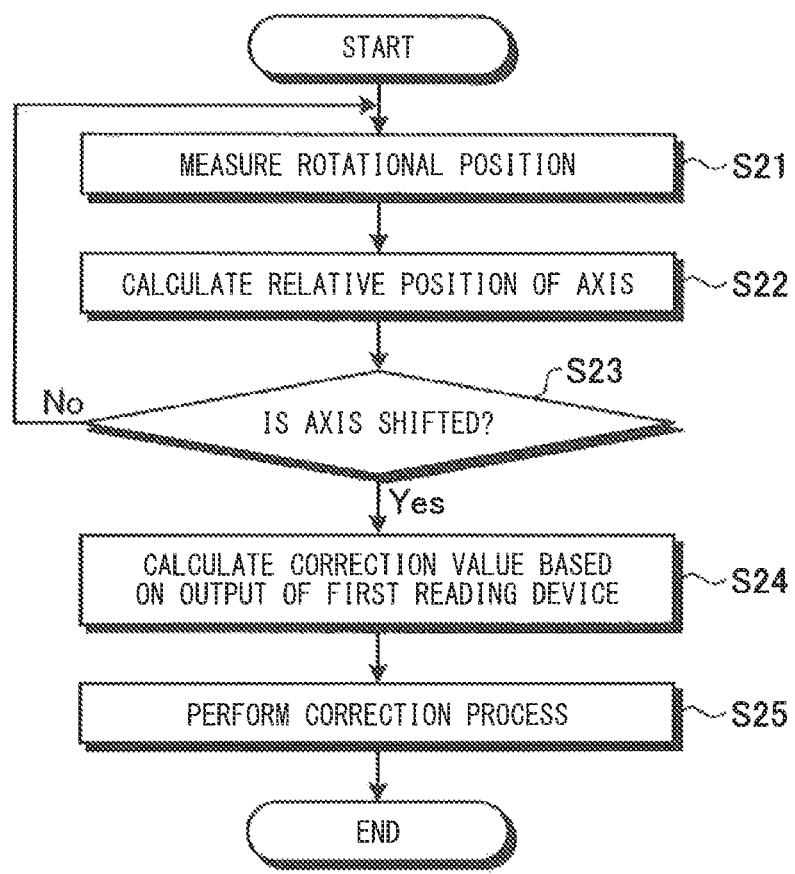
FIG. 26 is a flowchart showing another example of the process flow of correcting a process of the processing apparatus (exposure apparatus) according to the seventh embodiment.

FIG. 26 is a flowchart showing another example of the process flow of correcting a process of the processing apparatus (exposure apparatus) according to the seventh embodiment. For example, when the first reading device is the encoder head EN4, the second reading device is the encoder head EN1, and the third reading device is the encoder head EN3, the controller 14 of the exposure apparatus EXA causes the encoder head EN4, the encoder head EN1, the encoder head EN3 to measure the rotational position (step S21) and stores the outputs of the measured value (the reading output of the scale portion GP) from the encoder head EN4, the encoder head EN1, and the encoder head EN3 for every appropriate time interval (for example, several msec) as shown in FIG. 25.

The encoder head EN4, the encoder head EN1, and the encoder head EN3 can measure a variation in displacement in the tangential direction (in the XZ plane) of the scale portion GP. The controller 14 calculates the relative position at which the rotation shaft ST of the rotary drum DR moves from the rotation center line AX2 (the second center line AX2), for example, the position AX2' of the rotation shaft ST of the rotary drum DR shown in FIG. 23, on the basis of the reading outputs (stored values) of the encoder head EN4, the encoder head EN1, and the encoder head EN3 (step S22).

When a shaft difference greater than, for example, a predetermined threshold value is not present between the rotation center line AX2 and the position AX2' of the rotation shaft ST of the rotary drum DR22 (NO in step S23), the controller 14 continues to perform step S21 of measuring the rotational position. When a shaft difference greater than, for example, a predetermined threshold value is present between the rotation center line AX2 and the position AX2' of the rotation shaft ST of the rotary drum DR22 (YES in step S23), the controller 14 moves the process flow to step S24. The threshold value is determined in advance on the basis of accuracy or the like required for the exposure process of the exposure apparatus EXA and is stored in the storage part of the controller 14.

Then, the controller 14 of the exposure apparatus EXA calculates a correction value on the basis of the reading output of the encoder head EN4 (step S24). When viewed in the XZ plane and from the direction of the rotation center line AX2, the direction of the installation azimuth line Le4 in which the encoder head EN4 reading the scale portion GP is disposed is substantially perpendicular to the direction of the principal ray of the image-forming light beam EL2 projected to the substrate P from the odd-numbered projection modules PL1, PL3, and PL5. Accordingly, the variation in the reading output of the encoder head EN4 has a constant relationship with the variation in the direction along the principal ray of the image-forming light beam EL2 projected from the odd-numbered projection modules PL1, PL3, and PL5.

For example, the controller 14 stores a database in which the variation in the reading output of the encoder head EN4 is correlated with the displacement angle $\alpha$ in the storage part. Then, the controller 14 gives the input of the reading output of the encoder head EN4 as the first reading device to the database stored in the storage part of the controller 14 and calculates the displacement angle $\alpha$. The controller 14 can calculate the displacement component $\Delta qx1$ shown in FIG. 24 from the angle $\alpha$, the position AX2' calculated in step S22, and the rotation center line AX2 (the second center line AX2).

The controller 14 calculates the displacement component $\Delta qx1$ and calculates the correction value for correcting the focused state of the projection image on the basis of the displacement component $\Delta qx1$. Accordingly, the exposure apparatus EXA according to this embodiment can suppress a calculation load, detect the position of the rotary drum DR (the cylindrical member) with high accuracy, and process an object located on the curved surface of the rotary drum DR, that is, the substrate P.

The controller 14 can calculate the displacement component $\Delta qx4$ shown in FIG. 24 from the angle $\alpha$, the position AX2' calculated in step S22, and the rotation center line AX2. The displacement component $\Delta qx4$ is a displacement component in the direction perpendicular to the direction connecting the rotation center line AX2 of the rotary drum DR to the position QX1 of the scale portion GP. Accordingly, the displacement component $\Delta qx4$ is equal to a displacement obtained by multiplying the displacement from the rotation center line AX2 (the second center line AX2) to the position AX2' of the rotation shaft ST of the rotary drum DR by sin $\alpha$.

The controller 14 calculates the displacement component $\Delta qx1$ and calculates the correction value for shifting the projection image on the basis of the displacement component $\Delta qx4$. Accordingly, the exposure apparatus EXA according to this embodiment can suppress a calculation load, detect the position of the rotary drum DR (the cylindrical member) with high accuracy, and process an object located on the curved surface of the rotary drum DR, that is, the substrate P.

The controller 14 of the exposure apparatus EXA performs a correction process on the basis of the correction value calculated in step S24 (step S25). For example, the controller 14 of the exposure apparatus EXA operates the focus correcting optical member 44 shown in FIG. 19 as the focus adjusting device to finely adjust the focused state of the projection image formed on the substrate P so as to cancel the displacement component $\Delta qx1$. Accordingly, the exposure apparatus EXA can perform an exposure process on the substrate P with high accuracy.

For example, the controller 14 of the exposure apparatus EXA operates at least one of the image shift correcting optical member 45 configured to finely horizontally shift the projection image in the image plane as shown in FIG. 19, the magnification correcting optical member 47 configured to finely correct the magnification of the projection image, and the rotation correcting mechanism 46 configured to finely rotate the projection image in the image plane, which are the shift adjusting devices to shift the projection image formed on the substrate P so as to cancel the displacement component Δqx4.

Accordingly, the exposure apparatus EXA can perform an exposure process on the substrate P with high accuracy. Alternatively, the controller 14 may adjust the driving of the cylindrical mask DM or the driving of the rotary drum DR (the second drum member) or the tension applied to the substrate P by the use of the shift adjusting device and perform the accurate feedback control or feedforward control to shift the projection image formed on the substrate P so as to cancel the displacement component Δqx4.

In this way, in this embodiment, the installation azimuth lines Le1 and Le2 of the encoder heads EN1 and EN2 arranged around the scale portion GP of the scale disk SD are set to be same with (or is matched with) the inclination directions of the principal rays of the image-forming light beams EL2 projected to the projection area PA on the substrate P, when viewed from the direction of the rotation center line AX2.

Accordingly, even when the rotary drum DR is finely shifted in the scanning exposure direction (the conveyance direction) of the substrate P, it is possible to measure the degree of shift in real time by the use of the encoder heads EN and EN2 and to correct the variation in the exposure position due to the shift with high accuracy and at a high speed, for example, by the use of the image shift correcting optical member 45 or the like in the projection optical system PL. As a result, it is possible to perform an exposure process on the substrate P with high positional accuracy.

As described above, the exposure apparatus EXA includes the rotary drum DR as the cylindrical member, the scale portion GP, the projection modules PL1 to PL6 as the processing part of the exposure apparatus EXA, the encoder heads EN4 and EN5 as the first reading device reading the scale portion GP, the encoder heads EN1 and EN2 as the second reading device reading the scale portion GP, and the encoder head EN3 as the third reading device that is disposed at a position in the circumferential direction different from the first reading device and the second reading device and that reads the scale portion GP.

The encoder heads EN4 and EN5 are arranged around the scale portion GP when viewed from the direction of the second center line AX2, and are disposed at the positions obtained by rotating the specific position by about 90 degrees about the second center line AX2 around the second center line AX2, and read the scale portion GP. The encoder heads EN1 and EN2 read the scale portion GP at the specific position.

The exposure apparatus EXA calculates the second center line AX2 of the rotary drum DR from the reading outputs of the scale portion GP measured by the encoder heads EN4 and EN5 as the first reading device, the encoder heads EN1 and EN2 as the second reading device, and the encoder head EN3 as the third reading device.

The projection modules PL1 to PL6 as the processing part performs a process of correcting the displacement when the second center line AX2 of the rotary drum DR moves in the direction perpendicular to the second center line AX2 using the reading outputs of the encoder heads EN4 and EN5 as the first reading device.

Accordingly, the exposure apparatus EXA according to this embodiment can suppress the calculation load, detect the position of the rotary drum DR (the cylindrical member) with high accuracy, and process an object, that is, the substrate P, located on the curved surface of the rotary drum DR.

By comparing the output of the measured values by the encoder heads EN5, EN2, and EN3 with the output of the measured values by the encoder heads EN4, EN1, and EN3, it is possible to suppress the influence of the eccentric error of the scale disk SD with respect to the rotation shaft ST, or the like and to perform high-accuracy measurement.

The third reading device is not limited to the encoder head EN3, and when the encoder head EN4 is used as the first reading device and the encoder head EN1 is used as the second reading device, the third reading device may be the encoder head EN5 or the encoder head EN2.

As described above, in the exposure apparatus EXA, two image-forming light beams EL2 are made incident on the substrate P. The odd-numbered projection modules PL1, PL3, and PL5 serve as the first processing parts and the even-numbered projection modules PL2, PL4, and PL6 serve as the second processing parts.

Two positions at which the principal rays of the two image-forming light beams EL2 are made incident on the substrate P are set as a specific position (first specific position) at which the first processing parts perform the irradiation process of irradiating the substrate P with light and a second specific position at which the second processing parts perform the irradiation process of irradiating the substrate P with light, respectively.

The encoder head EN1 as the second reading device reads the scale portion GP at the specific position (the first specific position) and the encoder head EN2 reads the scale portion GP at the second specific position.

The encoder head EN5 as the third reading device is disposed at a position obtained by rotating the direction connecting the second specific position to the second center line AX2 substantially by 90 degrees about the second center line AX2, and reads the scale portion GP.

The exposure apparatus EXA calculates the second center line AX2 of the rotary drum DR from the reading outputs of the scale portion GP measured by the encoder head EN4 as the first reading device, the encoder head EN1 as the second reading device, and the encoder head EN5 as the third reading device.

The projection modules PL2, PL4, and PL6 as the second processing part performs a process of correcting the displacement when the second center line AX2 of the rotary drum DR moves in the direction perpendicular to the second center line AX2 using the reading outputs of the encoder heads EN4 and EN5 as the first reading device.

In this way, even when a plurality of processing parts such as the first processing part and the second processing are provided, the first processing part and the second processing part can perform the processes with high accuracy.

For example, by taking the average value (simple average or weighted average) of the outputs of the measurement signals from the encoder heads EN1, EN2, EN3, En4, and EN5 at the time of measuring the position in the rotating direction or the rotation speed of the rotary drum DR, it is possible to reduce the error and to stably perform the detection. Accordingly, when the second driving part 36 is driven in the servo mode by the controller 14, it is possible to control the rotational position of the rotary drum DR with higher accuracy.

When the rotational position and the rotation speed of the first drum member 21 are controlled in a servo mode using the first driving part 26 on the basis of the measurement signal corresponding to the rotational position or the rotation speed of the first drum member 21 (the cylindrical mask DM) detected by the first detector 25, it is possible to synchronously move (synchronously rotate) the first drum member 21 and the rotary drum DR (the second drum member) with high accuracy.

Modification Example of Seventh Embodiment

Figure 27:
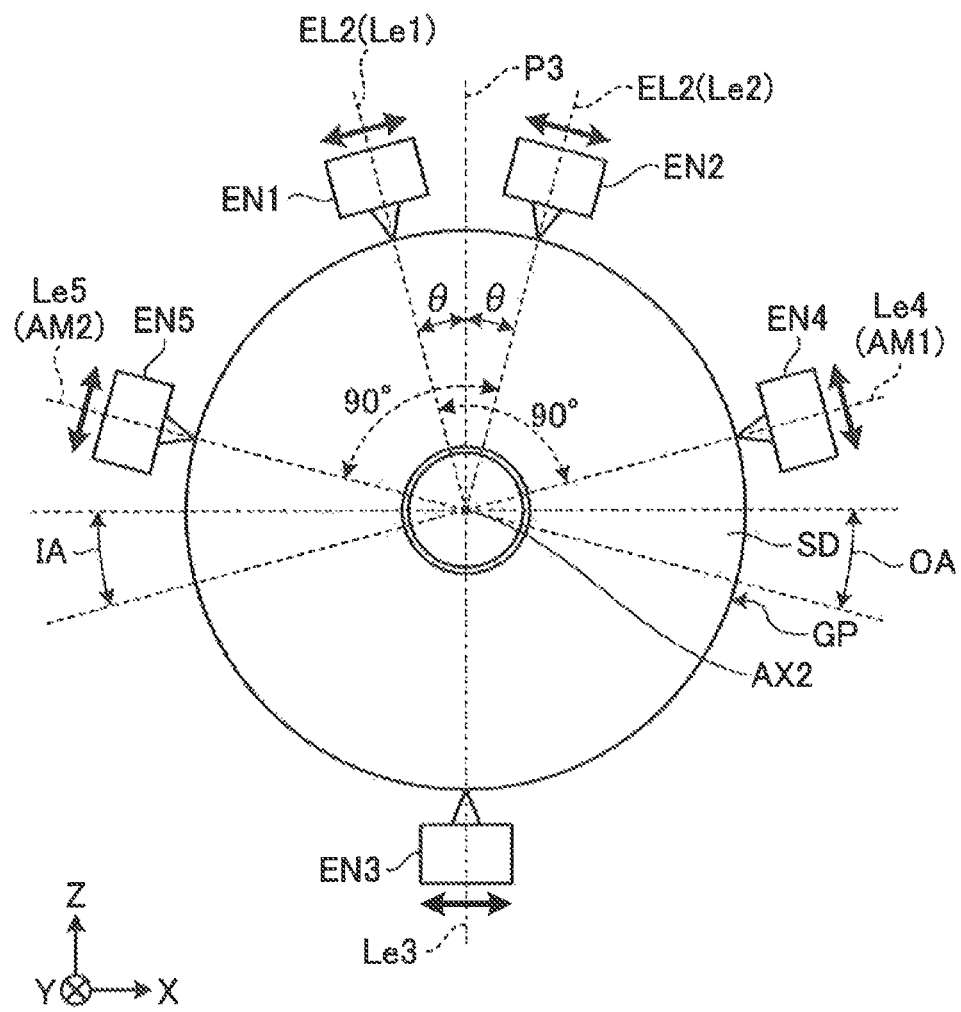
FIG. 27 is a diagram showing a position of the reading device when a scale disk is viewed in the rotation center line direction according to a modification example of the seventh embodiment.

FIG. 27 is a diagram showing the position of the reading device when the scale disk SD is viewed from the direction of the rotation center line AX2 according to a modification example of the seventh embodiment. The observation direction AM2 of the alignment microscope AM2 is arranged on the rear side in the conveyance direction of the substrate P, that is, on the preceding side (the upstream side) of the exposure position (projection area), detects an image of alignment marks (which are formed in an area of several tens of µm square to several hundreds of µm square) formed in the vicinity of ends in the Y-axis direction of the substrate P at a high speed by the use of an imaging device or the like in a state where the substrate P is conveyed at a predetermined speed, and samples the images of the marks in a microscope field (imaging range) at a high speed. By storing the rotation angle position of the scale disk SD which is sequentially measured by the encoder head EN5 at the instant of sampling, the correspondence between the mark position on the substrate P and the rotation angle position of the rotary drum DR is calculated.

On the other hand, the observation direction AM1 of the alignment microscope AMG1 is arranged on the front side in the conveyance direction of the substrate P, that is, on the subsequent side (the downstream side) of the exposure position (projection area), and samples an image of alignment marks (which are formed in an area of several tens of µm square to several hundreds of µm square) formed in the vicinity of ends in the Y-axis direction of the substrate P at a high speed by the use of an imaging device or the like similarly to the alignment microscope AMG2. By storing the rotation angle position of the scale disk SD which is sequentially measured by the encoder head EN4 at the instant of sampling, the correspondence between the mark position on the substrate P and the rotation angle of the rotary drum DR is calculated.

The encoder head EN4 is set in the installation azimuth line Le4, which is obtained by rotating the installation azimuth line Le1 of the encoder head EN1 substantially by 90° about the rotation center line AX2 toward the front side in the conveyance direction of the substrate P. The encoder head EN5 is set in the installation azimuth line Le5, which is obtained by rotating the installation azimuth line Le2 of the encoder head EN2 substantially by 90° about the rotation center line AX2 to the rear side in the conveyance direction of the substrate P.

The encoder head EN3 is arranged on the opposite side of the rotation center line AX2 to the encoder heads EN1 and EN2, and the installation azimuth line Le3 thereof is set on the center plane P3.

As shown in FIG. 27, the encoder head EN4 is arranged in the installation azimuth line Le4 set in the radial direction of the scale portion OP so as to be parallel to the observation direction AM1 (directed to the rotation center line AX2) passing through the detection center on the substrate P by the alignment microscope AMG1 when viewed in the XZ plane and from the direction of the rotation center line AX2.

The encoder head EN5 is arranged in the installation azimuth line Le5 set in the radial direction of the scale portion GP so as to be parallel to the observation direction AM2 (directed to the rotation center line AX2) passing through the detection center on the substrate P by the alignment microscope AMG2 when viewed in the XZ plane and from the direction of the rotation center line AX2.

In this way, the detection probes of the alignment microscopes AMG1 and AMG2 are arranged around the rotary drum DR when viewed from the direction of the second center line AX2, and are arranged so that the directions (the installation azimuth lines Le4 and Le5) connecting the positions at which the encoder heads EN4 and EN5 are arranged with the second center line AX2 match the directions connecting the detection areas of the alignment microscopes AMG1 and AMG2 with the second center line AX2.

The positions in the circumferential direction about the rotation center line AX2 at which the alignment microscopes AMG1 and AMG2 and the encoder heads EN4 and EN5 are set to be located between a sheet approaching area IA in which the substrate P starts contacting the rotary drum DR and a sheet separation area OA in which the substrate P is separated from the rotary drum DR.

Eighth Embodiment

A processing apparatus according to an eighth embodiment of the invention will be described below with reference to FIGS. 28 and 29. In the drawing, the same elements as in the seventh embodiment will be given the same reference signs and a description thereof will not be repeated.

The rotary drum DR includes a reference mark-forming portion Rfp formed on the curved surface of the cylindrical surface. It is preferable to have the reference mark-forming portion Rfp formed continuously or discretely at the same pitch as the alignment marks (which are formed in an area of several tens of µm square to several hundreds of µm square) are formed in the vicinity of the ends in the Y-axis direction of the substrate P. It is preferable that curve detecting probes GS1 and GS2 configured to detect the reference mark-forming portion Rfp to have the same configuration as the alignment microscopes AMG1 and AMG2. The curve detecting probes GS1 and GS2 detect an image at a high speed by the use of an imaging device or the like and sample an image of marks of the reference mark-forming portion Rfp in the microscope field (imaging range) at a high speed. At the instant of sampling, the correspondence between the rotation angle position of the rotary drum DR and the reference mark-forming portion Rfp is obtained and the rotation angle position sequentially measured is stored.

The detection center AS1 of the curve detecting probe GS1 is in the same direction as the detection center of the observation direction AM1 (directed to the rotation center line AX2) by the alignment microscope AMG1 when viewed in the XZ plane and from the direction of the rotation center line AX2. The detection center AS1 of the curve detecting probe GS1 is in the same direction as the installation azimuth line Le4 set to the radial direction of the scale portion GP when viewed in the XZ plane and from the direction of the rotation center line AX2.

The detection center AS2 of the curve detecting probe GS2 is in the same direction as the detection center of the observation direction AM2 (directed to the rotation center line AX2) by the alignment microscope AMG2 when viewed in the XZ plane and from the direction of the rotation center line AX2. The detection center AS2 of the curve detecting probe GS2 is in the same direction as the installation azimuth line Le5 set to the radial direction of the scale portion GP when viewed in the XZ plane and from the direction of the rotation center line AX2.

In this way, the curve detecting probe GS1 is set in the installation azimuth line Le4, which is obtained by rotating the installation azimuth line Le1 of the encoder head EN1 substantially by 90° about the rotation center line AX2 to the rear side in the conveyance direction of the substrate P. The curve detecting probe GS2 is set in the installation azimuth line Le5, which is obtained by rotating the installation azimuth line Le2 of the encoder head EN2 substantially by 90° about the rotation center line AX2 to the rear side in the conveyance direction of the substrate P.

Since plurality of marks formed in the reference mark-forming portion Rfp are arranged as reference marks at constant intervals in the circumferential direction on the cylindrical outer circumferential surface of the rotary drum DR, it is possible to verify an arrangement error of the detection probes GS1 and GS2 on the basis of measured read values by the encoder heads EN4 and EN5 at the time of sampling an image of the reference marks by the use of the curve detecting probes GS1 and GS2 and the degree of displacement of the reference mark image in the sampled image from the detection center.

When a reference line pattern increasing in the Y-axis direction is carved on the outer circumferential surface of the rotary drum DR, the arrangement error of the respective alignment microscopes AMG1 and AMG2 may be calculated with respect to the coordinate system of the outer circumferential surface of the rotary drum DR specified on the basis of the measured read values of the encoder heads EN4 and EN5, by detecting the reference line pattern by the use of the detection probes GS1 and GS2 and the alignment microscopes AMG1 and AMG2.

Figure 28:
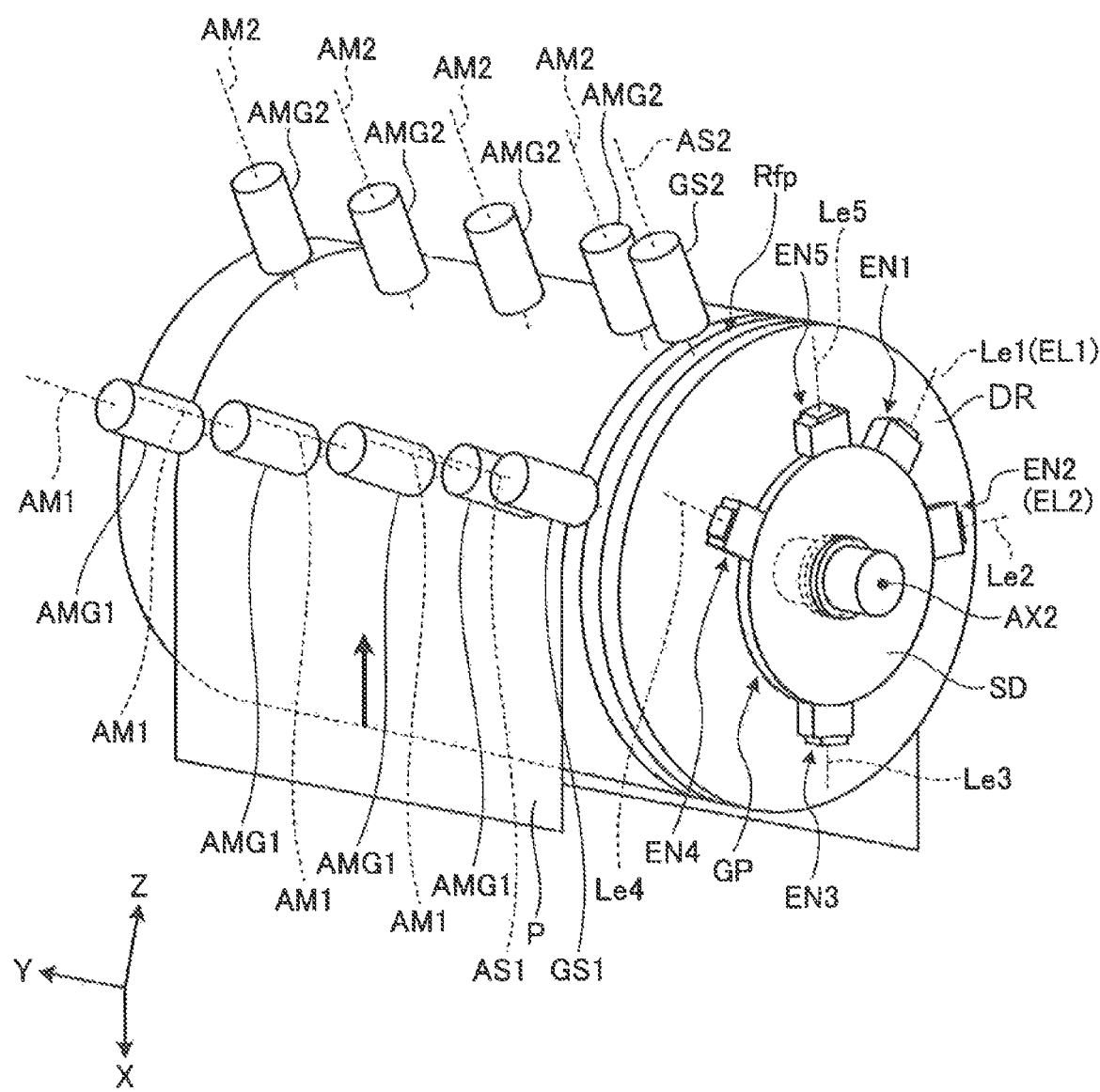
FIG. 28 is a diagram showing a position of a reading device when a scale disk is viewed in the rotation center line direction according to an eight embodiment.

In FIG. 28, the diameter of the scale disk SD is shown to be smaller than the diameter of the rotary drum DR. However, a so-called measurement Abbe error can be further reduced by causing the diameter of the scale portion GP of the scale disk SD to match (to be almost equal to) the diameter of the outer circumferential surface around which the substrate P is wound in the outer circumferential surface of the rotary drum DR. In this case, the exposure apparatus EXA preferably includes a roundness adjusting device configured to adjust the roundness of the scale disk SD.

Figure 29:
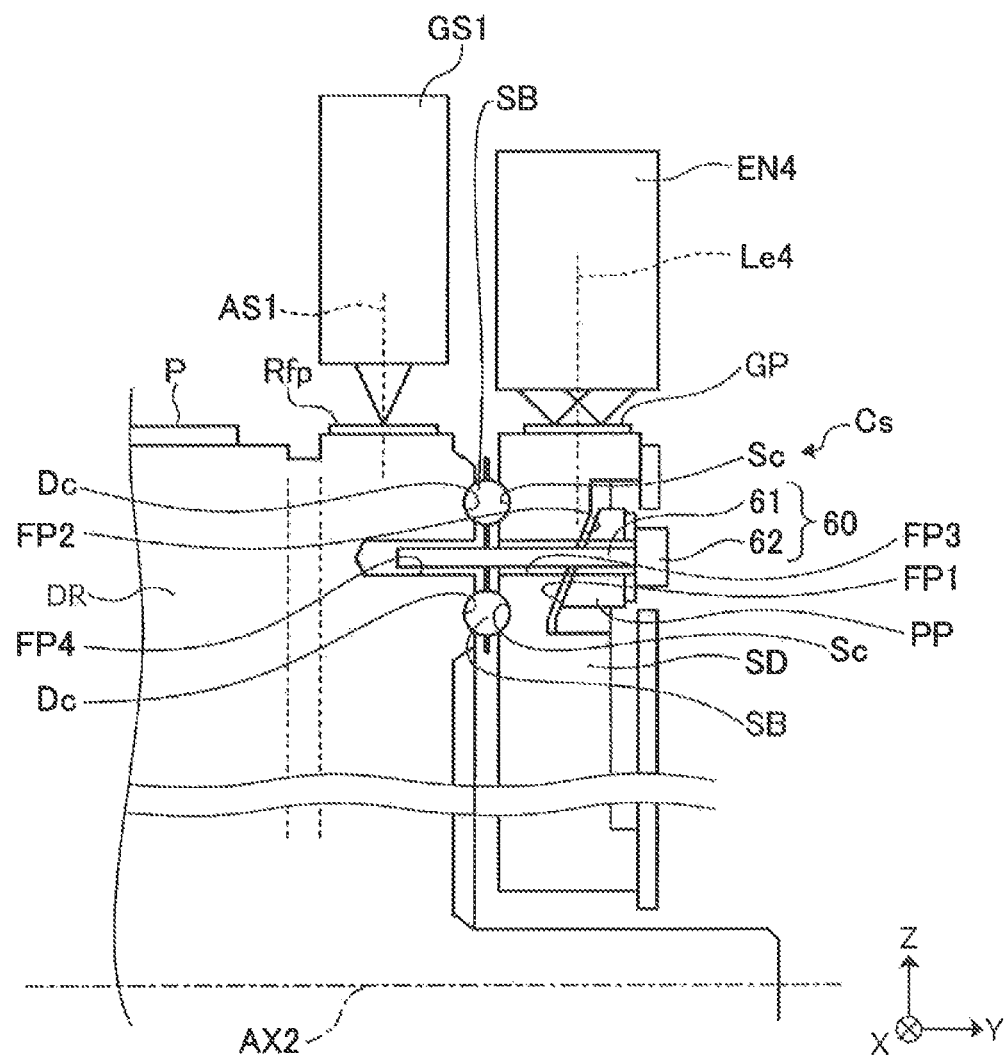
FIG. 29 is a diagram showing a roundness adjusting device that adjusts roundness of a scale member.

FIG. 29 is a diagram showing the roundness adjusting device configured to adjust the roundness of the scale member.

The scale disk SD as the scale member is a ring-like member. The scale portion GP is fixed to the ends of the rotary drum DR perpendicular to the second center line AX2 of the rotary drum DR. In the scale disk SD, a groove Sc formed in the scale disk SD along the circumferential direction of the second center line AX2 is opposed to a groove Dc formed in the rotary drum DR with the same radius as the groove Sc along the circumferential direction of the second center line AX2. In the scale disk SD, a bearing member SB such as a ball bearing is interposed between the groove Sc and the groove Dc.

The roundness adjusting device CS is disposed on the inner circumference side of the scale disk SD and includes an adjustment portion 60 and a pressing member PP. The roundness adjusting device CS includes plurality of pressing mechanisms (60, PP, and the like), which can change a pressing force, for example, in the radial direction directed from the second center line AX2 to the scale portion GP and parallel to the installation azimuth line Le4, at a plurality (for example, 8 to 16) of positions with a predetermined pitch in the circumferential direction about the rotation center line AX2.

The adjustment portion 60 includes a male-threaded portion 61 screwed to a female-screwed portion FP4 of the rotary drum DR through a hole portion of the pressing member PP and a through-hole FP3 of the scale disk SD and a screw head 62 coming in contact with the pressing member PP. The pressing member PP is a ring-like fixed plate having a radius smaller than the scale disk SD along the circumferential direction at the ends of the scale disk SD.

An inclined surface FP2 in a cross-section located on the inner circumference side of the scale disk SD, parallel to the second center line AX2, and including the second center line AX2 is formed at the extending tip of the installation azimuth line Le4 to the inner circumference side of the scale disk SD. The inclined surface FP2 is a surface having a truncated cone shape in a portion in which the thickness in the direction parallel to the second center line AX2 decreases as it gets closer to the second center line AX2.

In a cross-section located on the inner circumference side of the scale disk SD, parallel to the second center line AX2, and including the second center line AX2, the pressing member PP has a portion of a truncated cone shape in which the thickness in the direction parallel to the second center line AX2 increases as it gets closer to the second center line AX2. The inclined surface FP1 is a lateral surface of the truncated cone shape. The pressing member PP is fixed to the scale disk SD by the adjustment portion 60 so as to cause the inclined surface FP2 and the inclined surface FP1 to face each other.

In the roundness adjusting device CS, by screwing the male-threaded portion 61 of the adjustment portion 60 into the female-screwed portion FP3 of the scale disk SD to fasten the screw head 62, a pressing force of the inclined surface FP1 of the pressing member PP is transmitted to the inclined surface FP2 and the outer circumferential surface of the scale disk SD is elastically finely deformed to the outside. On the contrary, by reversely rotating the screw head 62 to loosen the male-threaded portion 61, the pressing force applied from the inclined surface FP1 of the pressing member PP to the inclined surface FP2 is reduced and the outer circumferential surface of the scale disk SD is elastically finely deformed to the inside.

In the adjustment portions 60 arranged with a predetermined pitch in the circumferential direction around the rotation center line AX2 in the roundness adjusting device CS, it is possible to finely adjust the diameter of the outer circumferential surface of the scale portion GP by operating the screw head 62 (the male-threaded portion 61). Since the inclined surfaces FP1 and FP2 of the roundness adjusting device CS are disposed inside the scale portion GP so as to allow the installation azimuth lines Le1 to Le5 to pass therethrough, the outer circumferential surface of the scale portion GP can be elastically finely deformed in the radial direction uniformly with respect to the rotation center line AX2.

Therefore, by operating the adjustment portion 60 at an appropriate position depending on the roundness of the scale disk SD, it is possible to raise the roundness of the scale portion OP of the scale disk SD or to reduce a fine eccentric error from the rotation center line AX2, thereby improving the position detection accuracy in the rotating direction with respect to the rotary drum DR.

The degree of adjustment of the radius adjusted by the roundness adjusting device CS varies depending on the diameter or the material of the scale disk SD or the radial position of the adjustment portion 60 and is several tens of µm at most.

The effect of suppressing the fine eccentric error which is achieved by adjustment using the roundness adjusting device CS can be verified by comparison of differences between the measured read values of the plurality of encoder heads or the like.

Ninth Embodiment

Figure 30:
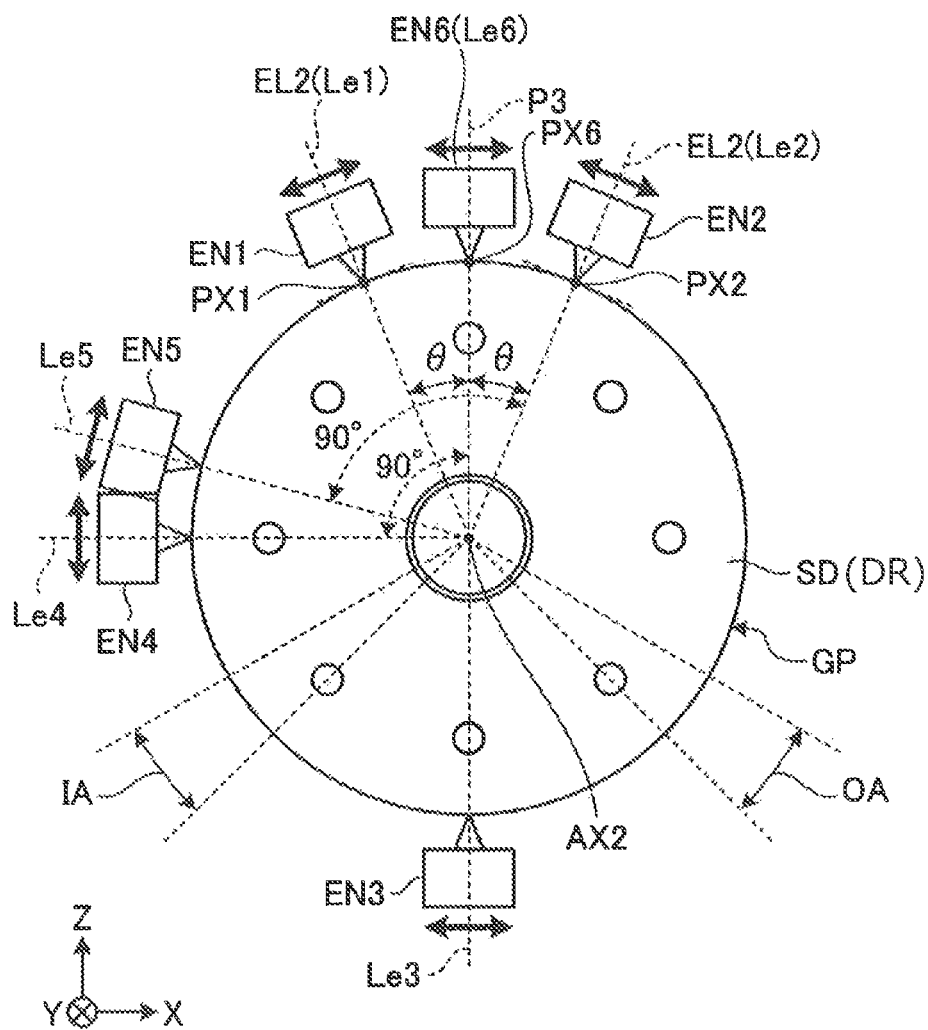
FIG. 30 is a diagram showing a position of a reading device when a scale disk is viewed in the rotation center line direction according to a ninth embodiment.

A processing apparatus according to a ninth embodiment of the invention will be described below with reference to FIG. 30. FIG. 30 is a diagram showing a position of a reading device when the scale disk SD is viewed in the direction of the rotation center line AX2 according to the ninth embodiment. In FIG. 30, the diameter of the outer circumferential surface of the rotary drum DR and the diameter of the scale portion GP of the scale disk SD are matched with each other (to be substantially equal to each other). In the drawing, the same elements as in the seventh and eighth embodiments will be given the same reference signs and a description thereof will not be repeated.

As described above, in the exposure apparatus EXA, the principal rays of two image-forming light beams EL2 are made incident on the substrate P. Two positions at which the principal rays of the two image-forming light beams EL2 are made incident on the substrate P are set as a first specific position PX1 and a second specific position PX2.

The encoder head EN6 is disposed between the first specific position PX1 and the second specific position PX2. For example, the encoder head EN6 detects a position PX6 of the scale portion GP at the specific position corresponding to the center plane P3. Then encoder head EN6 is disposed in the installation azimuth line Le6 matching the center plane P3 when viewed from the second center line AX2.

In this embodiment, since the diameter of the outer circumferential surface around which the substrate P is wound in the outer circumferential surface (the curved surface of the cylindrical surface) of the rotary drum DR is matched with the diameter of the scale portion GP of the scale disk SD, the position PX6 matches the specific position (hereinafter, reference to as specific position PX) when viewed from the direction of the second center line AX2. The specific position PX6 is located at the center in the X-axis direction of the areas (projection areas PA to PA6) exposed by the plurality of projection modules PL1 to PL6.

The encoder head EN4 is set in the installation azimuth line Le4, which is obtained by rotating the installation azimuth line Le6 of the encoder head EN6 substantially by 90° about the rotation center line AX2 toward the rear side in the conveyance direction of the substrate P.

In this embodiment, the angle interval between the installation azimuth line Le4 of the encoder head EN4 corresponding to the alignment microscope AMG1 and the installation azimuth line Le5 of the encoder head EN5 corresponding to the alignment microscope AMG2 is set to an angle θ (for example, 15°).

For example, when the first reading device is the encoder head EN4 and the second reading device is the encoder head EN6, the controller 14 can perform a correction process as in the process flow shown in FIG. 25. For example, the controller 14 gives the input of the reading output of the encoder head EN4 as the first reading device to the database stored in the storage part of the controller 14 and calculates the displacement angle α. The controller 14 calculates the displacement component Δqx1 from the calculated displacement angle α, and calculates the correction value for correcting the focused state of the projection image on the basis of the displacement component Δqx1.

In the exposure apparatus EXA according to this embodiment, the specific position PX6 is the center in the X-axis direction of the averagely-exposed area of the substrate P located on the curved surface of the rotary drum DR. The exposure apparatus EXA can reduce the correction process by, for example, finely adjusting the focused state by performing the irradiation process of irradiating the specific position PX6 with optimal exposing light.

The exposure apparatus EXA can suppress the calculation load, determine the position of the rotary drum DR (the cylindrical member) with high accuracy, and process an object, that is, the substrate P, located on the curved surface of the rotary drum DR. Accordingly, the exposure apparatus EXA can perform an exposure process on the substrate P at a high speed and with high accuracy.

As described above, the exposure apparatus EXA includes the rotary drum DR as the cylindrical member, the scale portion GP, the projection modules PL1 to PL6 as the processing part of the exposure apparatus EXA, the encoder head EN4 as the first reading device reading the scale portion GP, the encoder head EN6 as the second reading device reading the scale portion GP, and the encoder head EN3 as the third reading device that is disposed at a position in the circumferential direction different from the first reading device and the second reading device and that reads the scale portion GP.

The exposure apparatus EXA calculates the second center line AX2 of the rotary drum DR from the reading outputs of the scale portion GP measured by the encoder head EN4 as the first reading device, the encoder head EN6 as the second reading device, and the encoder head EN3 as the third reading device.

The projection modules PL1 to PL6 as the processing part performs a process of correcting the displacement when the second center line AX2 of the rotary drum DR moves in the direction perpendicular to the second center line AX2 using the reading outputs of the encoder head EN4 as the first reading device.

Accordingly, the exposure apparatus EXA according to this embodiment can suppress the calculation load, detect the position of the rotary drum DR (the cylindrical member) with high accuracy, and process an object, that is, the substrate P, located on the curved surface of the rotary drum DR.

In the arrangement of the encoder heads shown in FIG. 23, the fine movement component due to the eccentricity of the scale portion GP and the displacement component due to the rotation may not be distinguishably understood well, but the distinguishable understanding can be easily achieved by employing the arrangement of the encoder heads shown in FIG. 30. Therefore, attention is paid to three encoder heads of the encoder head EN6 in FIG. 30, the encoder head EN4 separated substantially by 90° therefrom and the encoder head EN3 (separated by 180° from the encoder head EN6) further separated by 90° therefrom.

In this case, when the measured read value of the encoder head EN6 is Me6 and the measured read value of the encoder head EN3 is Me3, the fine movement component ΔXd in the X-axis direction due to the eccentricity of the scale disk SD (the scale portion GP) is calculated by Expression (i) and the displacement component ΔRp due to the rotation of the scale portion GP is calculated as an average value by Expression (2).

$$\Delta Xd = (Me6 - Me3)/2 \tag{1}$$

$$\Delta Rp = (Me6 + Me3)/2 \tag{2}$$

Therefore, when the measured read value of the encoder head EN4 is Me4 and the read value Me4 is sequentially compared with the displacement component ΔRp (a difference therebetween is sequentially calculated), it is possible to calculate the fine movement component ΔZd in the Z-axis direction of the scale disk SD (the rotary drum DR) due to the eccentricity in real time in FIG. 30.

Modification Example of Ninth Embodiment

Figure 31:
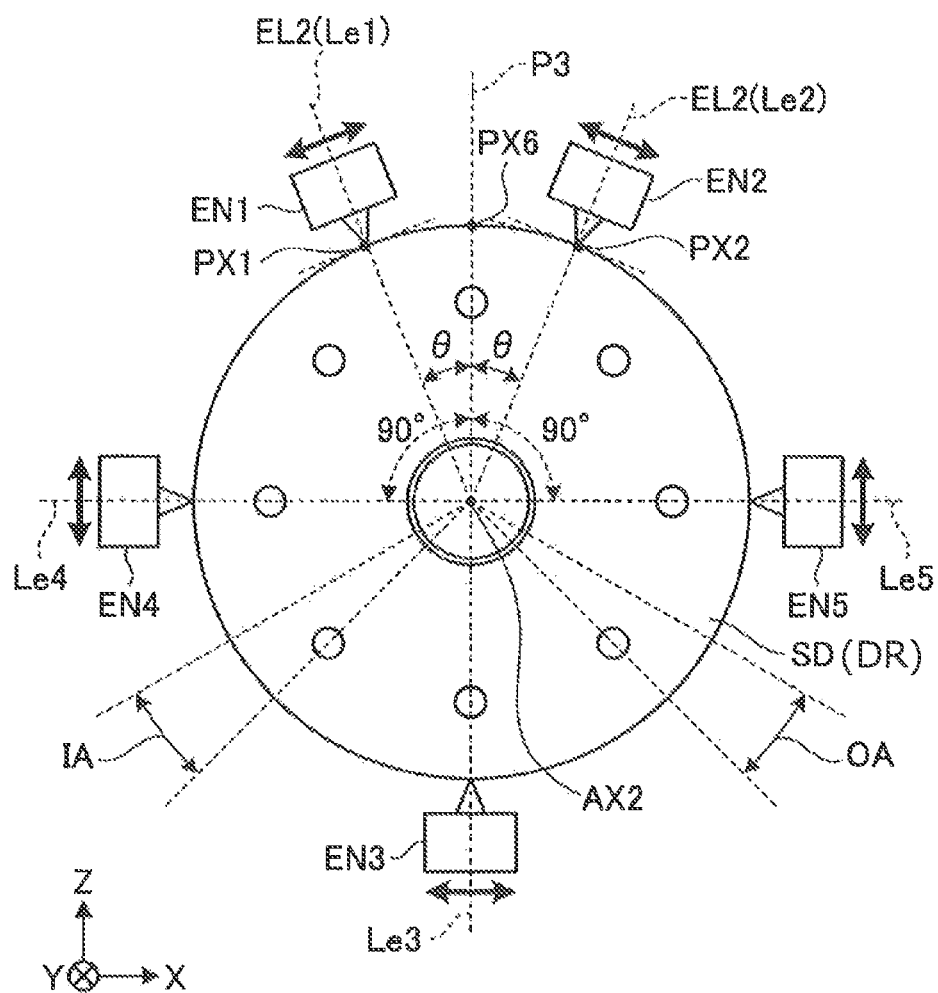
FIG. 31 is a diagram showing a position of a reading unit when a scale disk is viewed in the rotation center line direction according to the ninth embodiment.

FIG. 31 is a diagram showing a position of a reading device when the scale disk SD is viewed in the direction of the rotation center line AX2 according to a modification example of the ninth embodiment. As shown in FIG. 31, the encoder head EN6 may be omitted. The encoder head EN4 is set in the installation azimuth line Le4 which is obtained by rotating a line in the XZ plane connecting the specific position and the rotation center line AX2 substantially by 90° about the rotation center line AX2 toward the rear side in the conveyance direction of the substrate P.

Here, only the alignment microscope AMG1 is arranged in the same azimuth as the installation azimuth line Le4 of the encoder head EN4.

The encoder head EN5 is set in the installation azimuth line Le5 which is obtained by rotating the line in the XZ plane connecting the specific position and the rotation center line AX2 substantially by 90° about the rotation center line AX2 toward the front side (downstream side) in the conveyance direction of the substrate P. In this case, the controller 14 of the exposure apparatus EXA sets the first reading device to the encoder head EN4 or the encoder head EN5, sets the second reading device and the third reading device to two of the group consisting of the encoder head EN1, the encoder head EN2, and the encoder head EN3.

The exposure apparatus EXA can reduce the correction process such as finely adjusting the focused state by performing the irradiation process of irradiating the center in the X-axis direction in the averagely-exposed area of the substrate P located on the curved surface of the rotary drum DR with the optimal exposing light. Accordingly, the exposure apparatus EXA can performs an exposure process on the substrate P at a high speed and with high accuracy.

In the arrangement of the encoder heads shown in FIG. 31, the fine movement component due to the eccentricity of the scale portion GP and the displacement component due to the rotation can be distinguishably understood well. In the arrangement shown in FIG. 31, the fine movement component ΔZd in the Z-axis direction of the scale disk SI) (the rotary drum DR) due to the eccentricity is calculated by Expression (3) using the measured read values Me4 and Me5 of two encoder heads EN4 and EN5 reading the scales of the scale portion GP in the Z-axis direction.

$$\Delta Zd = (Me4 - Me5)/2 \quad (3)$$

When the difference between the displacement component ΔRp due to the rotation of the scale portion GP which is calculated as an average value of the measured read values Me4 and Me5 of the encoder heads EN4 and EN5 and the measured read value Me3 of the encoder head EN3 obtained by reading the scales of the scale portion GP in the X-axis direction is sequentially calculated, the fine movement component ΔXd in the X-axis direction of the scale disk SD (the rotary drum DR) due to the eccentricity is calculated in real time. The displacement component ΔRp is calculated by Expression (4).

$$\Delta Rp = (Me4 + Me5)/2 \quad (4)$$

As described above, the exposure apparatus EXA includes the rotary drum DR as the cylindrical member, the scale portion GP, the projection modules PL1 to PL6 as the processing part of the exposure apparatus EXA, the encoder heads EN4 and EN5 as the first reading device reading the scale portion GP, the encoder heads EN1 and EN2 as the second reading device reading the scale portion GP, and the encoder head EN3 as the third reading device that is disposed at a position in the circumferential direction different from the first reading device and the second reading device and that reads the scale portion OP.

In the configuration shown in FIG. 31, since the fine movement component ΔZd in the Z-axis direction of the rotary drum DR can be sequentially calculated on the basis of the measured read values of two encoder heads EN4 and EN5 arranged with an angle difference of 180° therebetween, the focus variation ΔZf of the substrate P can be easily calculated by Expression (5).

$$\Delta Zf = \Delta Zd \times \cos \theta \quad (5)$$

The exposure apparatus EXA can suppress the calculation load, detect the position of the rotary drum DR (the cylindrical member) with high accuracy, and process an object, that is, the substrate P, located on the curved surface of the rotary drum DR. Accordingly, the exposure apparatus EXA can perform an exposure process on the substrate P at a high speed and with high accuracy.

Tenth Embodiment

Figure 32:
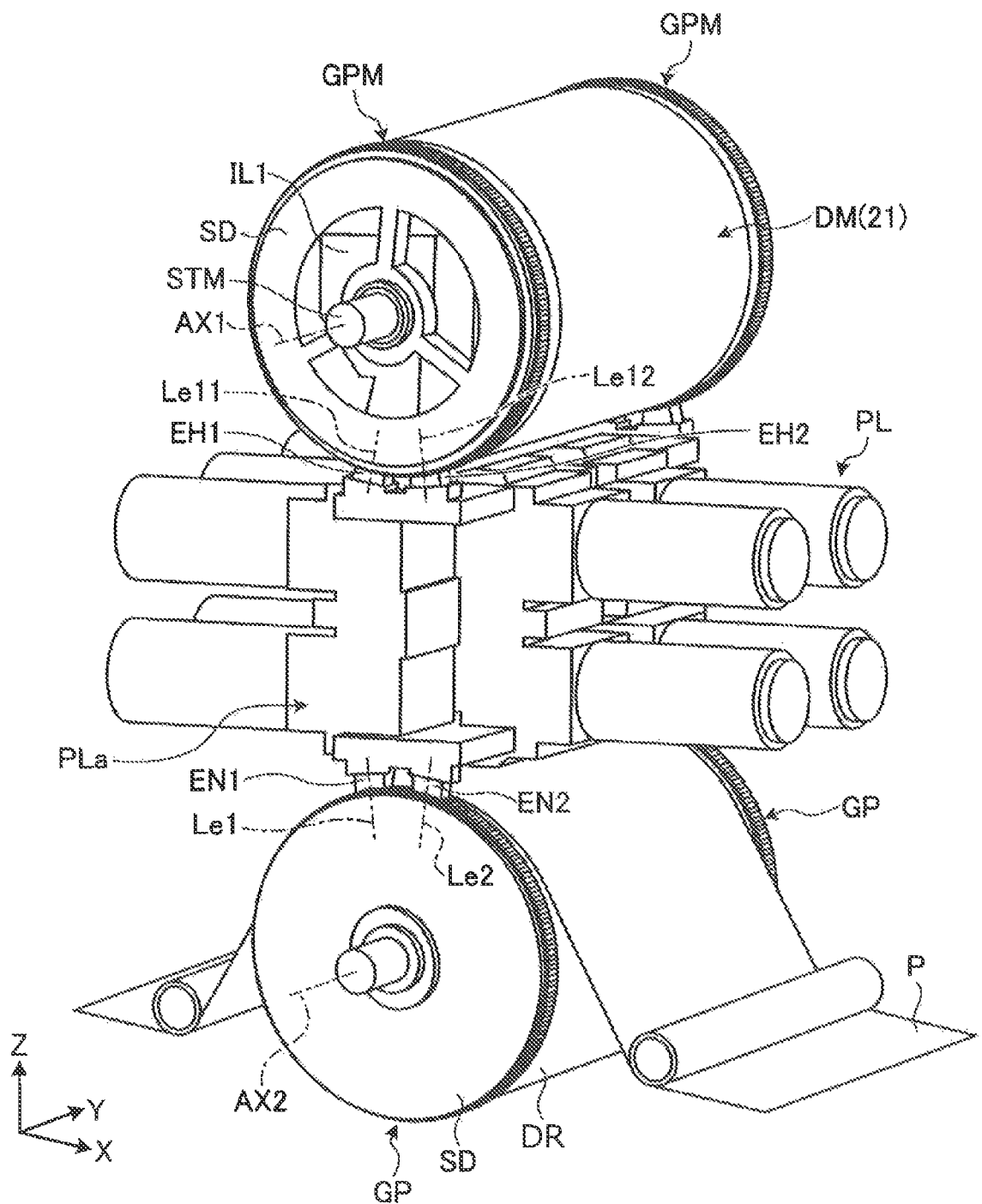
FIG. 32 is a diagram schematically showing the entire configuration of a processing apparatus (exposure apparatus) according to a tenth embodiment.
Figure 33:
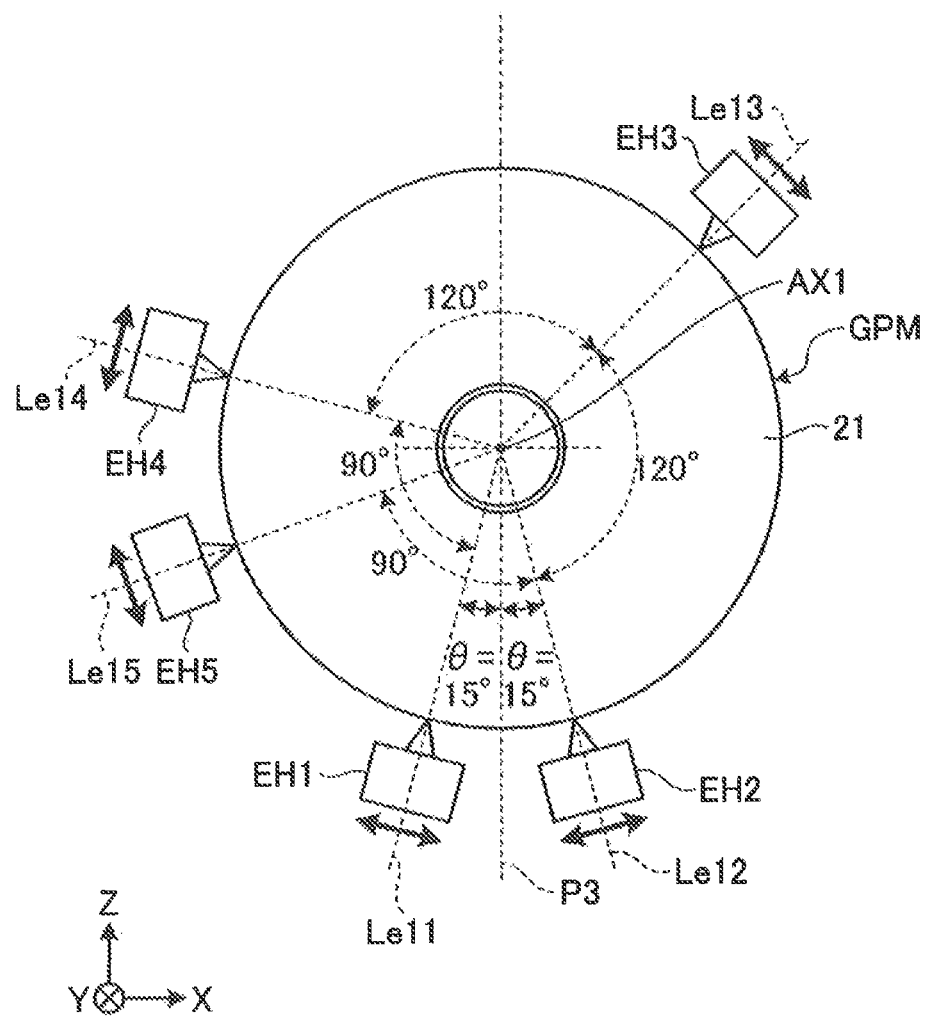
FIG. 33 is a diagram showing a position of a reading device when a scale disk is viewed in the rotation center line direction according to the tenth embodiment.

A processing apparatus according to a tenth embodiment of the invention will be described below with reference to FIGS. 32 and 33. FIG. 32 is a diagram schematically showing an entire configuration of a processing apparatus (exposure apparatus) according to a tenth embodiment. FIG. 33 is a diagram showing a position of a reading device when a scale disk SD is viewed in the direction of the rotation center line AX1 according to the tenth embodiment. In the drawing, the same elements as in the seventh, eighth, and ninth embodiments will be given the same reference signs and a description thereof will not be repeated.

The scale disk SD is fixed to be perpendicular to the rotation center axes AX1 and AX2 at both ends of the first drum member 21 and the rotary drum DR. The scale portion GP is located at both ends of the rotary drum DR and the encoder heads EN1 to EN5 configured to measure the scale portions GP are arranged at both ends of the rotary drum DR.

The first detector 25 shown in FIG. 17 optically detects the rotational position of the first drum member 21 and includes a scale disk (the scale member) SD with high roundness and encoder heads EH1, EH2, EH3, EH4, and EH5 as reading devices, as shown in FIG. 33.

The scale disk SD is fixed to at least one end (both ends in FIG. 32) of the first drum member 21 to be perpendicular to the rotation shaft of the first drum member 21. Accordingly, the scale disk SD rotates about the rotation center line AX1 along with the rotation shaft ST. A scale portion GPM is carved on the outer circumferential surface of the scale disk SD. The encoder heads EH1, EH2, EH3, EH4, and EH5 are arranged around the scale portion GP when viewed from the direction of the rotation shaft STM. The encoder heads EH1, EH2, EH3, EH4, and EH5 are arranged to face the scale portion GPM and can read the scale portion GPM in a non-contacting manner. The encoder heads EH1, EH2. EH3, EH4, and EH5 are arranged at different positions in the circumferential direction of the first drum member 21.

The encoder heads EH1, EH2, EH3, EH4, and EH5 are reading devices having measurement sensitivity (detection sensitivity) to a variation in displacement in the tangential direction (in the XZ plane) of the scale portion GPM. As shown in FIG. 33, when the installation azimuths (angle directions in the XZ plane about the rotation center line AX1) of the encoder heads EH1 and EH2 are denoted by installation azimuth lines Le11 and Le12, the encoder heads EH1 and EH2 are arranged so that the installation azimuth lines Le11 and Le12 are ±θ° with respect to the center plane P3. The installation azimuth lines Le11 and Le12 are equal to the angle directions in the XZ plane about the rotation center line AX1 of the illumination light beam EL1 shown in FIG. 17.

The illumination mechanism IU as a processing part irradiates a predetermined pattern (mask pattern) on the cylindrical mask DM with the illumination light beam EL1. Accordingly, the projection optical system PL can project an image of the pattern in the illumination area IR on the cylindrical mask DM to a part (projection area PA) of the substrate P conveyed by the conveying device 9.

The encoder head EH4 is set in the installation azimuth line Le14 which is obtained by rotating the installation azimuth line Le11 of the encoder head EH1 substantially by 90° about the rotation center line AX1 toward the rear side (upstream side) in the rotating direction with respect to the center plane P3 of the first drum member 21.

The encoder head EH5 is set in the installation azimuth line Le15 which is obtained by rotating the installation azimuth line Le12 of the encoder head EH2 substantially by 90° about the rotation center line AX1 toward the rear side (upstream side) in the rotating direction with respect to the center plane P3 of the first drum member 21.

Here, substantially 90° means that the angle γ in 90°±γ is in a range of 0°≤γ≤5.8°, as described in the seventh embodiment.

The encoder head EH3 is set in the installation azimuth line Le13 which is obtained by rotating the installation azimuth line Le12 of the encoder head EH2 substantially by 120° about the rotation center line AX1 and rotating the encoder head EH4 substantially by 120° about the rotation center line AX1.

The arrangement of the encoder heads EH1, EH2, EH3, EH14, and EH5 around the first drum member 21 in this embodiment has an inverted mirror image relationship with the encoder heads EN1, EN2, EN3, EN4, and EN5 arranged around the rotary drum DR in the seventh embodiment.

As described above, the exposure apparatus EXA includes the first drum member 21 as the cylindrical member, the scale portion GPM, the illumination mechanism IU as the processing part of the exposure apparatus EXA, the encoder heads EH4 and EH5 as the first reading device reading the scale portion GPM, and the encoder heads EH1 and EH2 as the second reading device reading the scale portion GPM.

The first drum member 21 has a curved surface curved with a constant radius from the first center line AX1 as a predetermined axis and rotates about the first center line AX1.

The scale portion GPM is arranged in a ring shape along the circumferential direction in which the first drum member 21 rotates and rotates about the first center line AX1 along with the first drum member 21.

The illumination mechanism IU as the processing parts of the exposure apparatus EXA is arranged in the first drum member 21 when viewed from the direction of the second center line AX2, and irradiates the mask pattern located on the curved surface at the specific position in the circumferential direction of the first drum member 21 with two illumination light beams EL1.

The encoder heads EH4 and EH5 are arranged around the scale portion GPM when viewed from the direction of the first center line AX1, and are disposed at the positions obtained by rotating the specific position substantially by 90° about the first center line AX1 with respect to the first center line AX1, and read the scale portion GPM.

The encoder heads EH1 and EH2 read the scale portion GPM at the specific position.

The exposure apparatus EXA performs a process of correcting the displacement when the illumination mechanism IU as the processing part moves in the direction, in which the rotation shaft STM of the first drum member 21 moves, perpendicular to the first center line AX1 using the reading outputs of the encoder heads EH14 and EH5 as the first reading device.

Accordingly, the exposure apparatus EXA according to this embodiment can suppress the calculation load, detect the position of the first drum member 21 (the cylindrical member) with high accuracy, and perform a process (irradiation with the illumination light) on an object, that is, the cylindrical mask DM, located on the curved surface of the first drum member 21.

The exposure apparatus EXA may calculate the fine movement component in the XZ plane of the rotation shaft STM of the first drum member 21 from the reading outputs of the scale portion GPM measured by the encoder heads EH4 and EH5 as the first reading device, the encoder heads EH1 and EH2 as the second reading device, and the encoder head EH3 as the third reading device.

Eleventh Embodiment

Figure 34:
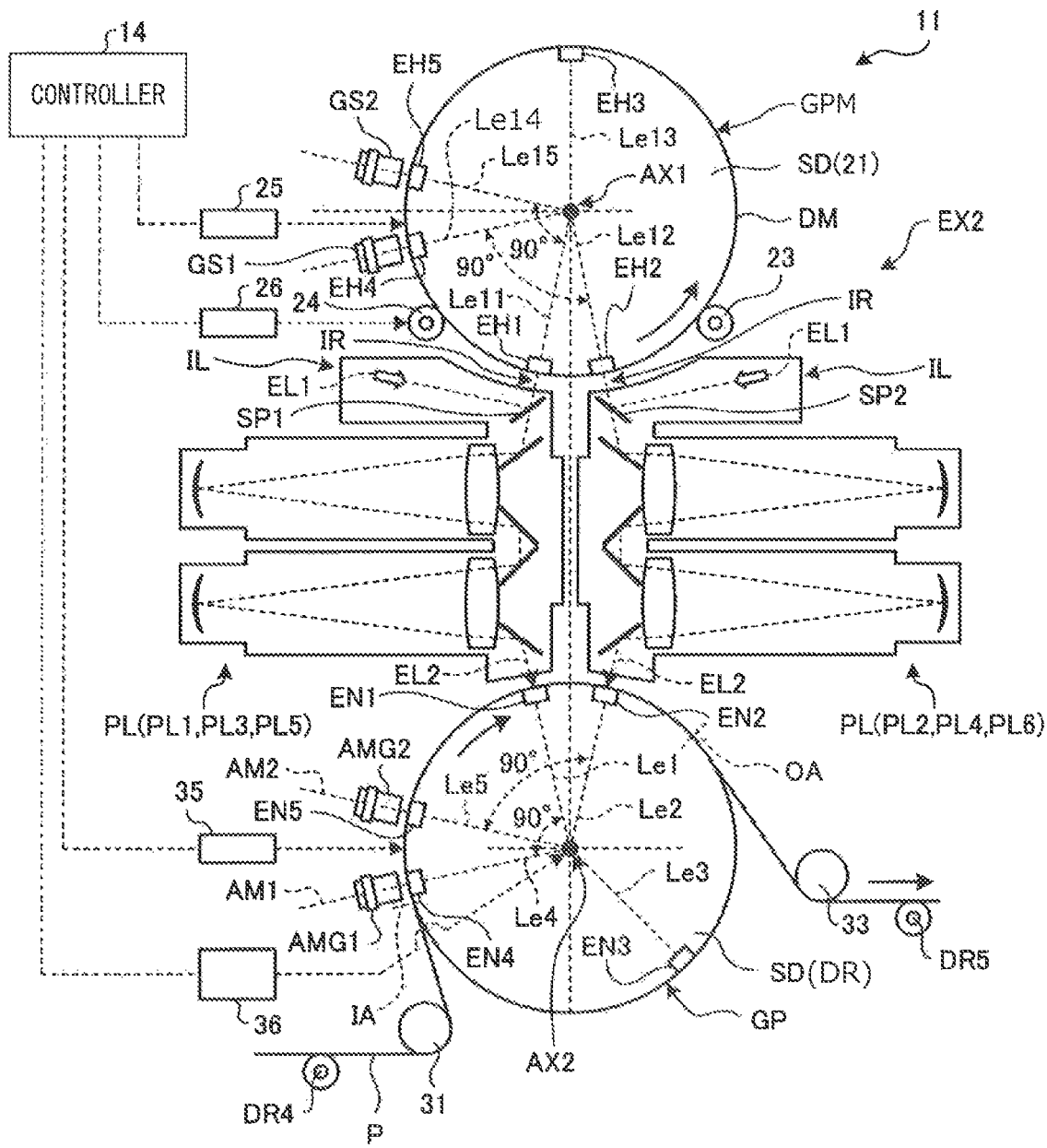
FIG. 34 is a diagram schematically showing the entire configuration of a processing apparatus (exposure apparatus) according to an eleventh embodiment.

A processing apparatus according to an eleventh embodiment of the invention will be described below with reference to FIG. 34. FIG. 34 is a diagram schematically showing an entire configuration of a processing apparatus (exposure apparatus) according to an eleventh embodiment. In the exposure apparatus EX2, a light source device (not shown) emits an illumination light beam EL1 illuminating the cylindrical mask DM.

The illumination light beam EL1 emitted from the light source of the light source device is guided to an illumination module IL. When plurality of illumination optical systems are provided, the illumination light beam EL1 from the light source is divided into plurality of pieces and the plurality of pieces of illumination light beam EL1 are guided into the plurality of illumination modules IL.

Here, the illumination light beam EL1 emitted from the light source device is made incident on a polarizing beam splitter SP1 and SP2. It is preferable that the polarizing beam splitters SP1 and SP2 convert the incident illumination light beam EL1 into a totally-reflected light beam for the purpose of suppressing an energy loss due to the splitting of the illumination light beam EL1.

Here, the polarizing beam splitters SP1 and SP2 reflects a light beam which becomes a linearly-polarized light beam of S-polarized light and transmits a light beam which becomes a linearly-polarized light beam of P-polarized light. Accordingly, the light source device emits an illumination light beam EL1, which is the illumination light beam EL1 made incident on the polarizing beam splitters SP1 and SP2 and converted into a linearly-polarized (S-polarized) light beam, to the first drum member 21. Accordingly, the light source device emits the illumination light beam EL1 having a wavelength and a phase.

The polarizing beam splitters SP1 and SP2 reflect the illumination light beam EL1 from the light source and transmit a projection light beam EL2 reflected at the cylindrical mask DM. In other words, the illumination light beam EL1 from the illumination module IL is made incident as a reflected light beam on the polarizing beam splitters SP1 and SP2, and the projection light beam EL2 from the cylindrical mask DM is made incident as a transmitting light beam on the polarizing beam splitters SP1 and SP2.

In this way, the illumination module IL as the processing part performs a process of reflecting the illumination light beam EL1 to a predetermined pattern (mask pattern) on the cylindrical mask DM which is an object to be processed. Accordingly, the projection optical system PL, can project an image of the pattern in the illumination area IR on the cylindrical mask DM to a part (projection area PA) of the substrate P which is conveyed by the conveying device 9.

When a predetermined pattern (mask pattern) reflecting the illumination light beam EL1 is provided to the surface of the curved surface of the cylindrical mask DM, the above-mentioned reference mark-forming member Rfp may be formed on the curved surface along with the mask pattern. When the reference mark-forming portion Rfp is formed along with the mask pattern, the reference mark-forming portion Rfp is formed with the same accuracy as the mask pattern.

Accordingly, an image of the mark of the reference mark-forming portion Rfp can be sampled at a high speed and with high accuracy by the use of the curve detection probes GS1 and GS2 for detecting the reference mark-forming portion Rfp. By measuring the rotation angle position of the first drum member 21 by the use of the encoder head at the instant of sampling, the correspondence between the reference mark-forming portion Rfp and the rotation angle position of the first drum member 21 which is sequentially measured is calculated.

Twelfth Embodiment

Figure 35:
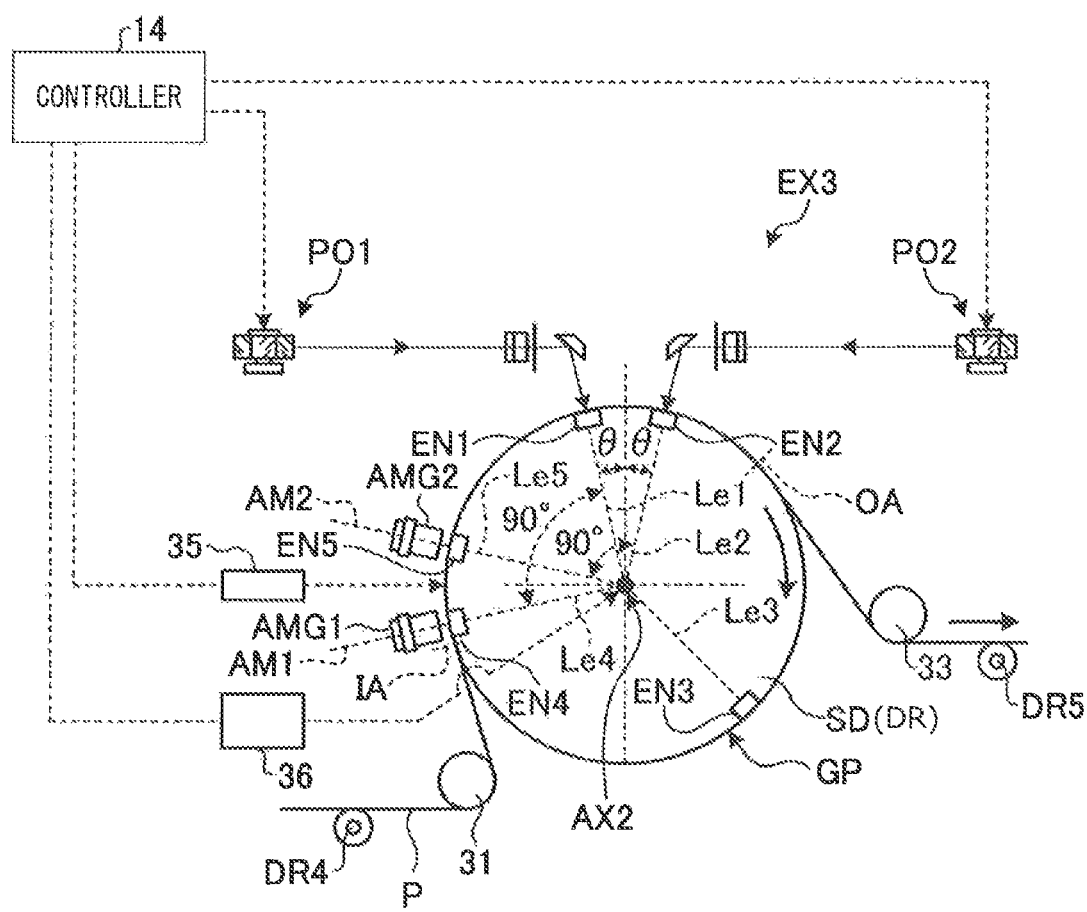
FIG. 35 is a diagram schematically showing the entire configuration of a processing apparatus (exposure apparatus) according to a twelfth embodiment.

A processing apparatus according to a twelfth embodiment of the invention will be described below with reference to FIG. 35. FIG. 35 is a diagram schematically showing an entire configuration of a processing apparatus (exposure apparatus EX3) according to a twelfth embodiment. The exposure apparatus EX3 includes polygon scanning units PO1 and PO2 which are supplied with a laser beam from a light source device (not shown). The polygon scanning unit PO one-dimensionally scans the substrate P with a spot light beam of a drawing laser beam. By ON/OFF-modulating the laser beam at a high speed on the basis of pattern data (CAD data) while one-dimensionally scanning the substrate with the spot light beam, an electronic circuit pattern or the like is drawn (exposed) on the substrate P.

An example of a partial configuration of an exposure head part (for example, including six polygon scanning units PO1 to PO6) and a rotary drum DR of the exposure apparatus EX3 shown in FIG. 35 will be described below with reference to the perspective view of FIG. 36. The scale plate SD in which the scale portion GP having a diameter substantially equal to that of the outer circumferential surface of the rotary drum DR is formed is fixed to both ends in the Y-axis direction of the rotary drum DR to be coaxial with the rotation center line AX2. The six polygon scanning units PO1 to PO6 are arranged so that the scanning lines T1 to T6 of the spot beams (with a diameter of about 2 μm to 10 μm) formed on the substrate P by the scanning units PO1 to PO6 extend in the Y-axis direction to be parallel to each other.

Similarly to the above-mentioned embodiments, a pattern area drawn on the substrate P by the odd-numbered scanning lines T1, T3, and T5 and a pattern area drawn on the substrate P by the even-numbered scanning lines T2, T4, and T6 join without being separated from each other in the Y-axis direction and form a large pattern area with a balance in the width direction of the substrate P.

When a surface including the installation azimuth line Le1 of the encoder head EN1 disposed around both scale plates SD and the rotation center line AX2 of the rotary drum DR is assumed, the odd-numbered scanning lines T1, T3, and T5 are set to be included in the surface. Similarly, when a surface including the installation azimuth line Le2 of the encoder head EN2 disposed around both scale plates SD and the rotation center line AX2 is assumed, the even-numbered scanning lines T2, T4, and T6 are set to be included in the surface.

The six scanning units PO1 to PO6 have the same configuration and thus the internal configuration of the scanning unit PO3 will be described representatively. As shown in FIG. 36, a laser beam LB of an ultraviolet band supplied from a light source device not shown is made incident on an acousto-optic modulator (AOM) MP1 that ON/OFF-modulates (modulates the intensity of) a beam at a high speed on the basis of pattern data (CAD data) while a spot light beam scans the scanning line T3. The beam from the acousto-optic modulator MP1 is deflected and scanned in the XY plane in one dimensional by a polygon mirror MP2 rotating about a rotation center parallel to the Z-axis at a high speed. The deflected beam is collected as a spot light beam on the substrate P via an f–θ lens MP3 and a turn-back mirror MP4 and the spot light beam scans along the scanning line T3 in one direction at a constant speed.

Each of the other scanning units PO1, PO2, PO4, PO5, and PO6 includes an acousto-optic modulator MP1, a polygon mirror MP2, an f-O lens MP3, and a turn-back mirror MP4. At the time of drawing a pattern on the substrate P, the synchronization of the scanning speed of the spot light beams on the scanning lines T1 to T6 with the conveyance speed (the rotation speed of the rotary drum DR) of the substrate P, the timing of transmitting CAL) data of patterns to be drawn at the scanning lines T1 to T6 to the acousto-optic modulators MP1, and the like are controlled by the controller 14 shown in FIG. 35 on the basis of the position in the circumferential direction of the rotary drum DR (the substrate P) measured by the encoder heads EN1 and EN2 (or the other encoder heads EN3 to EN5).

Figure 36:
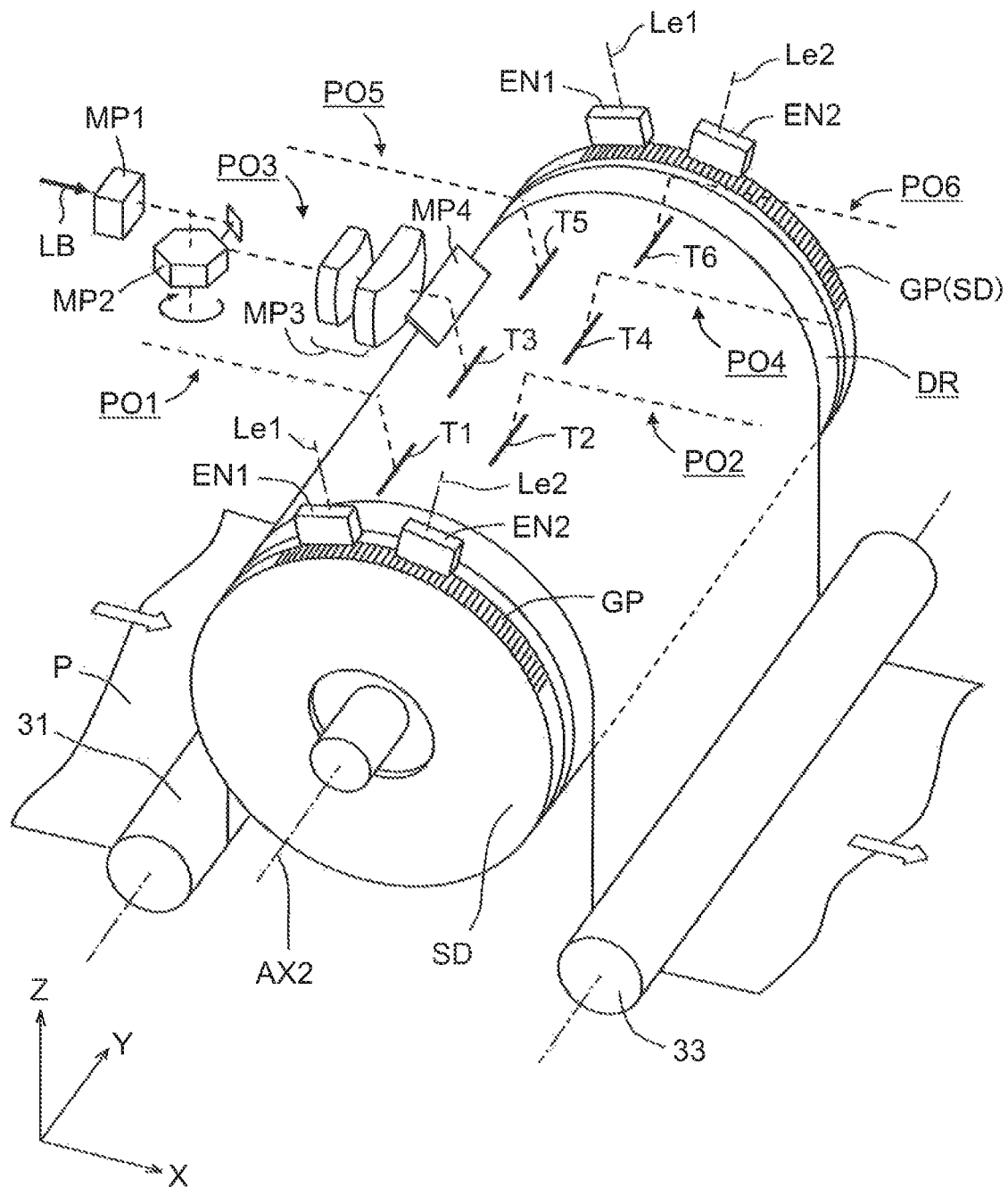
FIG. 36 is a perspective view showing a partial configuration of the processing apparatus (exposure apparatus) shown in FIG. 35.

In this way, the exposure apparatus EX3 shown in FIGS. 35 and 36 can perform a patterning process by irradiating the substrate P at a specific position with an exposure light beam (spot light beam) without using the cylindrical mask DM. The above-mentioned embodiments can be similarly applied to the case where the substrate P wound around the rotary drum DR is exposed to a pattern using an apparatus configured to perform a projection exposure process using a variable mask pattern, for example, a maskless exposure apparatus disclosed in Japanese Patent No. 4223036.

As shown in FIG. 36, the scale plate SD is attached to both ends of the rotary drum DR and is similarly applied to the apparatuses of the other embodiments. In case of an optical encoder system in which diffraction grids are formed as the scale portion GP (or GPM) with a constant pitch (for example, 20 μm) in the circumferential direction, the encoder heads EN1 to EN5 (or EH1 to EH5) obliquely irradiate the scale portion GP (or GPM) with a measurement beam and photo-electrically detect the reflected and diffracted beam (interference light beam) thereof and the installation azimuth lines Le1 to Le5 (or Le11 to Le15) of the encoder heads EN1 to EN5 (or EH1 to EH5) are set to pass through the irradiation area (in a range of 1 mm to several mm) of the measurement beam on the scale portion GP (or GPM).

Figure 37:
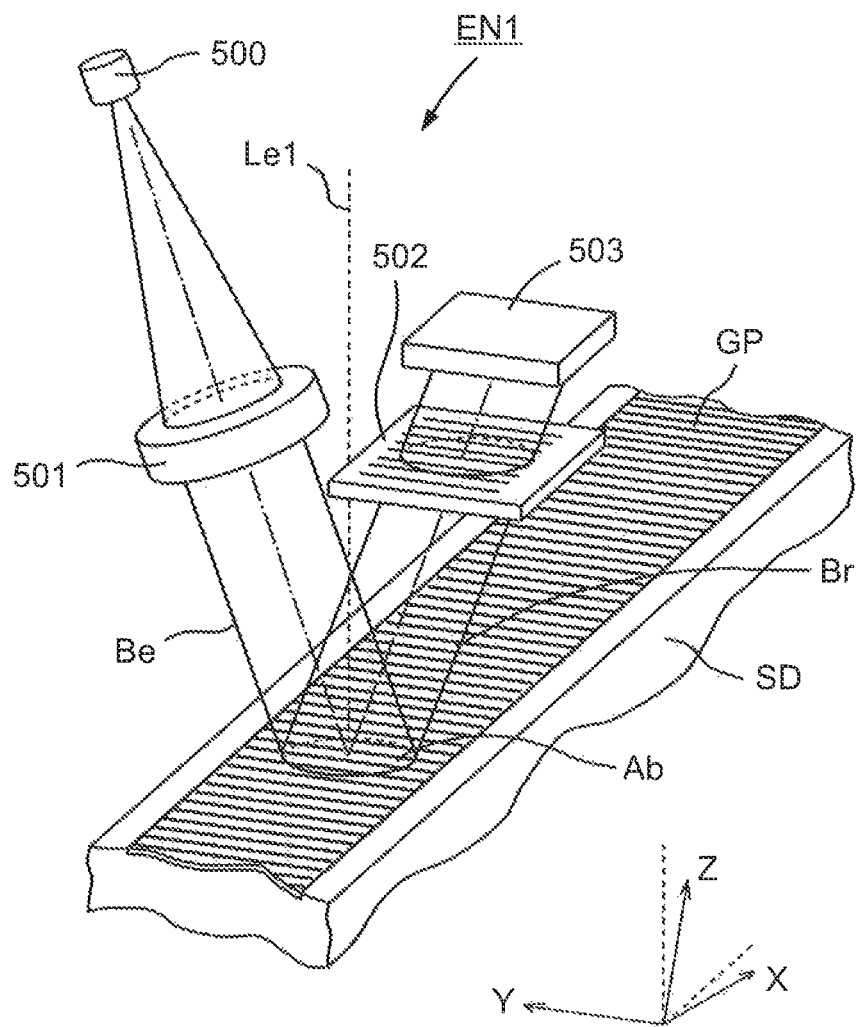
FIG. 37 is a perspective view showing an example of a configuration and an arrangement of an encoder head.

FIG. 37 is a perspective view schematically showing the internal configuration of the encoder head EN1 and an arrangement relationship with the scale portion GP. FIG. 37, the encoder head EN1 is provided with a light source 500 such as a semiconductor laser or a light-emitting diode projecting a measurement beam Be, a collection lens 501 configured to collimate the measurement beam Be as a substantially parallel beam, an index grid 502 configured to receive the reflected diffracted beam Br reflected from the irradiation area Ab on the scale portion GP which is irradiated with the measurement beam Be, and a photoelectric sensor 503 configured to receive a re-diffracted beam (interference beam) generated from the index grid 502.

The above-described installation azimuth line Le1 of the encoder head EN1 is set to pass the irradiation area Ab and to travel to the rotation center line AX2 of the scale plate SD. The encoder head EN1 is provided so that the center line of the measurement beam Be and the center line of the reflected diffracted beam Br are located in a plane including the installation azimuth line Le1 and the rotation center line AX2 (for example, see FIG. 36) perpendicular to each other. The configurations and the arrangements of the encoder heads described in the above-mentioned embodiments are the same as shown in FIG. 37.

Thirteenth Embodiment

Figure 38:
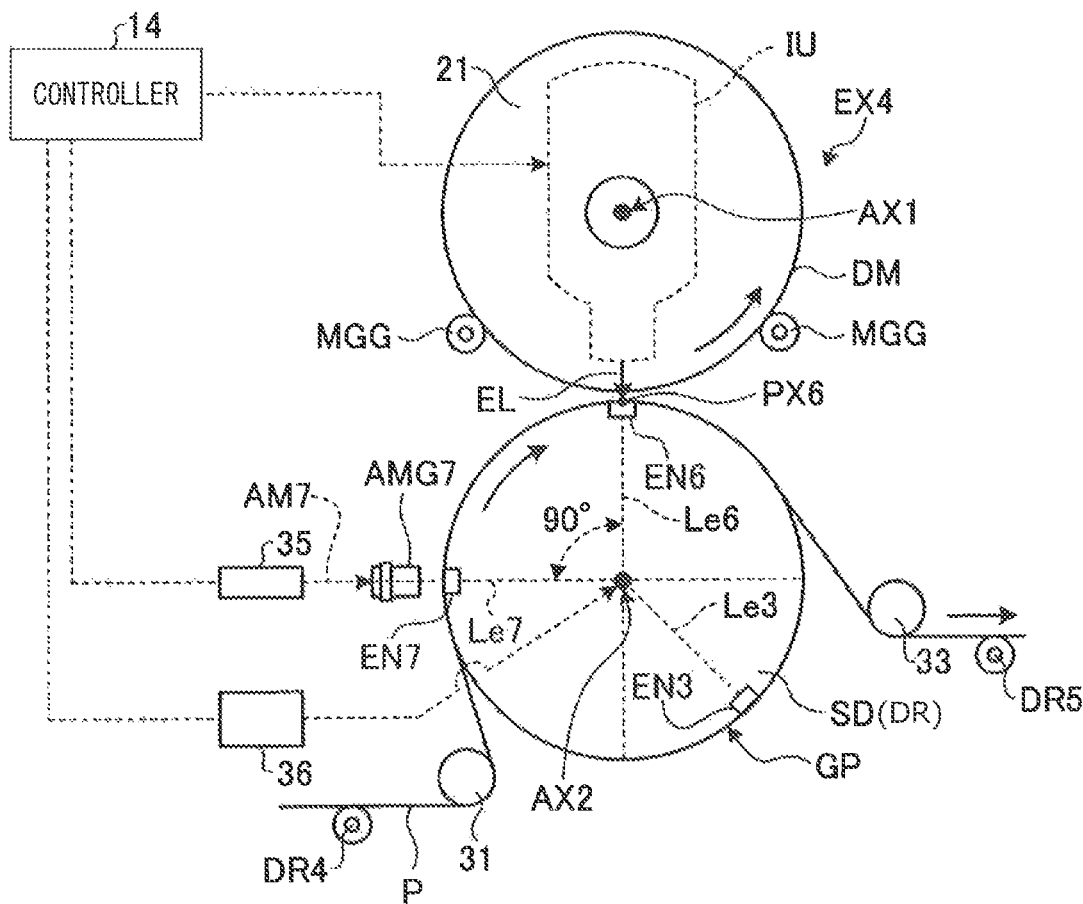
FIG. 38 is a diagram schematically showing the entire configuration of a processing apparatus (exposure apparatus) according to a thirteenth embodiment.

A processing apparatus according to a thirteenth embodiment of the invention will be described below with reference to FIG. 38. FIG. 38 is a diagram schematically showing an entire configuration of a processing apparatus (exposure apparatus) according to a thirteenth embodiment.

An exposure apparatus EX4 is a processing apparatus that performs so-called proximity exposure on a substrate P. The exposure apparatus EX4 sets a gap between the cylindrical mask DM and the rotary drum DR to be small, causes the illumination mechanism IU to directly irradiate the substrate P with an illumination light beam EL to expose the substrate in a non-contacting manner.

In this embodiment, the rotary drum DR rotates with a torque supplied from the second driving part 36 including an actuator such as an electric motor. For example, a driving roller MGG connected to a magnetic gear drives the first drum member 21 so as to be opposite to the rotating direction of the second driving part 36.

The second driving part 36 rotates the rotary drum DR, and thus, the driving roller MGG and the first drum member 21 rotates in conjunction with each other. As a result, the first drum member 21 (the cylindrical mask DM) and the rotary drum DR synchronously move (synchronously rotate).

The exposure apparatus EX4 includes an encoder head EN6 configured to detect the position PX6 of the scale portion GP at a specific position at which the principal ray of the image-forming light beam EL with respect to the substrate P is made incident on the substrate P. Here, since the diameter of the outer circumferential surface around which the substrate P is wound in the outer circumferential surface of the rotary drum DR is matched with the diameter of the scale portion GP of the scale disk SD, the position PX6 matches the specific position when viewed from the direction of the second center line AX2.

The encoder head EN7 is set in the installation azimuth line Le7, which is obtained by rotating the installation azimuth line Le6 of the encoder head EN6 substantially by 90° (90°±γ) about the rotation center line AX2 to the rear side (upstream side) in the conveyance direction of the substrate P.

The exposure apparatus EX4 according to this embodiment uses the encoder head EN7 as the first reading device and the encoder head EN6 as the second reading device and can perform a process of correcting a displacement component, which is calculated from the reading output of the scale portion GP, in the direction connecting the position of the shaft of the rotary drum DR with a specific position and perpendicular to the shaft, by using the reading output from the first reading device.

The seventh to ninth embodiments exemplify an exposure apparatus as the processing apparatus. The processing apparatus is not limited to the exposure apparatus and may be an apparatus in which a processing part prints a pattern on a substrate P as an object to be process by the use of an ink-jet ink dropping device. Alternatively, the processing part may be an inspection apparatus. The transfer processing part may be an optical patterning unit configured to irradiate a sheet substrate with light in a shape corresponding to a pattern or an ink coating unit configured to eject ink droplets in a shape corresponding to a pattern.

<Device Manufacturing Method>

Figure 39:
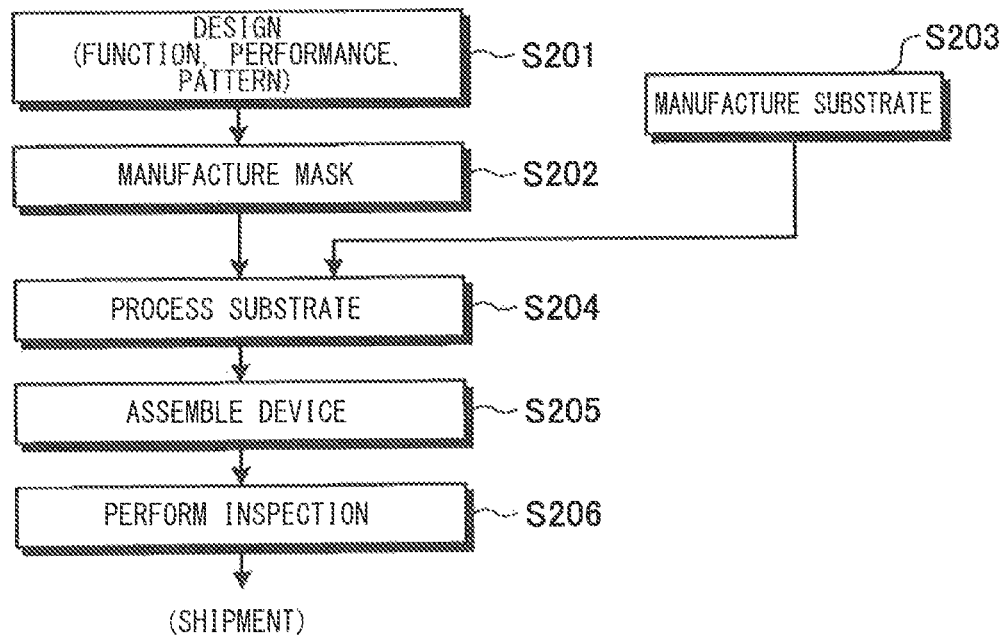
FIG. 39 is a flowchart showing a device manufacturing method using the processing apparatus (exposure apparatus) according to the seventh embodiment.

A device manufacturing method will be described below with reference to FIG. 39. FIG. 39 is a flowchart showing a device manufacturing method according to the sixth embodiment and showing the device manufacturing method, for example, using the processing apparatus (exposure apparatus) according to the sixth embodiment.

In the device manufacturing method shown in FIG. 39, first, functions and performance of a display panel using a light-emitting device such as organic EL device are designed, and necessary circuit pattern or interconnection patterns are designed with a CAD or the like (step S201). Subsequently, cylindrical masks DM corresponding to the number of necessary layers are manufactured on the basis of patterns of various layers designed by the CAD or the like (step S202). A feed roll FR1 around which a flexible substrate P (such as a resin film, a metal foil, or a plastic) serving as a base member of the display panel is prepared (step S203).

The roll-like substrate P prepared in step S203 may have a front surface reformed and activated in advance, may have a base layer (for example, fine unevenness using an imprinting method) formed in advance thereon, or may have a photosensitive functional film or a transparent film (insulating material) laminated in advance.

Subsequently, a backplane layer including electrodes, interconnections, insulating films, TFTs (thin-film semiconductor) and the like constituting the display panel is formed on the substrate P and a light-emitting layer (display pixel portions) based on a light-emitting device such as an organic EL device is formed to be stacked on the backplane layer (step S204). Step S204 includes a conventional photolithography step of exposing a photo-resist layer using the exposure apparatus EXA, EX2, EX3, or EX4 described in the above-mentioned embodiments. The step also includes processes of an exposure step of exposing the substrate P coated with a photosensitive silane coupling material instead of the photo resist to patterns to form the patterns based on hydrophilic and hydrophobic properties on the surface thereof, a wet step of exposing a photosensitive catalyst layer to patterns to form patterns of a metal film (interconnections, electrodes, and the like) using an electroless plating method, or a printing step of drawing patterns using conductive ink or the like containing silver nano-particles.

Subsequently, the substrate P is diced into display panel devices which are continuously manufactured on the long substrate P in a roll manner or a protective film (an environment barrier layer), a color filter sheet, or the like is attached to the surface of the respective display panel devices, whereby devices are assembled (step S205). Subsequently, an inspection step of inspecting whether the display panel devices normally work or whether a desired performance or characteristic is satisfied is performed (step S206). In this way, it is possible to manufacture display panels (flexible displays).

The requirements of the above-mentioned embodiments and the above-mentioned modification examples can be appropriately combined. Some elements may not be used. As long as permitted by law, all application publications, patent publications, and US patents relevant to the exposure apparatuses cited in the above-mentioned embodiments and the above-mentioned modification examples are incorporated herein by reference.

REFERENCE SIGNS LIST

9: conveying device
11: processing apparatus
12: mask supporting device
13: light source device
14: controller
21: first drum member
23: guide roller
24: driving roller
25: first detector
26: first driving part
31: guide member
31: solid light source
33: second guiding member
35: detector
44: focus correcting optical member (focus adjusting device)
45: image shift correcting optical member
46: rotation correcting mechanism (shift adjusting device)
47: magnification correcting optical member
62: head part
AX2: rotation center line (center line)
AM1, AM2: observation direction
AMG1, AMG2: alignment microscope (alignment system)
GS1, GS2: curve detecting probe
GP: scale portion
CS: roundness adjusting device
DM: cylindrical mask
DR: rotary drum (rotary cylindrical member, rotary cylindrical body, second drum member)
EN1, EN2: encoder head, encoder head part (reading mechanism)
EN3: encoder head, encoder head part (third reading mechanism)
EN4, EN5, EN6, EN7, EH1, EH2, EH3, EH4, EH5: encoder head, encoder head part (reading mechanism)
EX, EXA, EX2, EX3, EX4: exposure apparatus (processing mechanism, processing apparatus)
P: substrate
P2: second surface (supporting surface)
PO: polygon scanning unit
PP: pressing member
SA: speed measuring device
SD: scale disk (scale member, disk-like member)
U3: processing apparatus (substrate processing apparatus)

The invention claimed is:

1. A pattern exposure apparatus that exposes a mask pattern to a substrate, the pattern exposure apparatus comprising:
a rotary drum that supports a flexible substrate, which is exposed with a mask pattern formed on an outer circumferential surface of a cylindrical mask that rotates about a first center axis, with a cylindrical outer circumferential surface which has a predetermined radius from a second center axis arranged parallel with the first center axis, and that rotates about the second center axis,
a rotary drum-side scale portion that is arranged for measuring a movement of the substrate which is fed in a circumferential direction by a rotation of the rotary drum, that includes a scale circularly arranged at a position having a predetermined radius from the second center axis, and that rotates together with the rotary drum,
a first projection optical system that projects an exposure light, which is a part of a light that comes through the mask pattern of the cylindrical mask, to the substrate at a first projection area which is inclined at an angle of $-\theta$ in the circumferential direction of the rotary drum from a center plane which includes each of the first center axis and the second center axis,
a second projection optical system that projects an exposure light, which is a part of a light that comes through the mask pattern of the cylindrical mask, to the substrate at a second projection area which is inclined at an angle of $+\theta$ in the circumferential direction of the rotary drum from the center plane,
a first reading device that is arranged to oppose with the rotary drum-side scale portion while being inclined at the angle of $-\theta$ from the center plane about the second center axis and that reads the scale, and
a second reading device that is arranged to oppose with the rotary drum-side scale portion while being inclined at the angle of $+\theta$ from the center plane about the second center axis and that reads the scale.

2. The pattern exposure apparatus according to claim 1, further comprising:
a mask-side scale portion that is arranged for measuring a movement of the mask pattern which is fed in a circumferential direction by a rotation of the rotary drum, that includes a scale circularly arranged at a position having a predetermined radius from the first center axis, and that rotates together with the cylindrical mask.

3. The pattern exposure apparatus according to claim 2, wherein the first projection optical system projects the exposure light to the first projection area, the exposure light being generated from the mask pattern at a first illumination area which is set at a position inclined at an angle of $+\theta$ in the circumferential direction of the cylindrical mask from the center plane, and
the second projection optical system projects the exposure light to the second projection area, the exposure light being generated from the mask pattern at a second illumination area which is set at a position inclined at an angle of $-\theta$ in the circumferential direction of the cylindrical mask from the center plane.

4. The pattern exposure apparatus according to claim 3, further comprising:

a third reading device that is arranged to oppose with the mask-side scale portion while being inclined at the angle of $+\theta$ from the center plane about the first center axis and that reads the scale, and a fourth reading device that is arranged to oppose with the mask-side scale portion while being inclined at the angle of $-\theta$ from the center plane about the first center axis and that reads the scale.

5. The pattern exposure apparatus according to claim 4, further comprising:

a support column that supports the first projection optical system and the second projection optical system and that is formed of a metal having a small thermal expansion coefficient, and wherein each of the first reading device, the second reading device, the third reading device and the fourth reading device are installed on a part of the support column.

6. The pattern exposure apparatus according to claim 5, wherein the first reading device and the second reading device, which measure the scale of the rotary drum-side scale portion, and the third reading device and the fourth reading device, which measure the scale of the mask-side scale portion, are optical encoder heads.

\* \* \* \* \*